US008110457B2

(12) United States Patent
Futase

(10) Patent No.: US 8,110,457 B2
(45) Date of Patent: Feb. 7, 2012

(54) METHOD OF MANUFACTURING SEMICONDUCTOR DEVICE

(75) Inventor: Takuya Futase, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 206 days.

(21) Appl. No.: 12/563,144

(22) Filed: Sep. 20, 2009

(65) Prior Publication Data

US 2010/0093139 A1    Apr. 15, 2010

(30) Foreign Application Priority Data

Oct. 15, 2008   (JP) ................................ 2008-266254

(51) Int. Cl.
*H01L 21/336* (2006.01)
(52) U.S. Cl. .................... 438/197; 438/664; 438/689
(58) Field of Classification Search .................. 438/197, 438/664, 689
See application file for complete search history.

(56) References Cited

U.S. PATENT DOCUMENTS

| 6,218,249 B1 | 4/2001 | Maa et al. |
| 2007/0238321 A1 | 10/2007 | Futase et al. |
| 2008/0090369 A1 * | 4/2008 | Akiyama et al. ............. 438/308 |
| 2008/0093666 A1 | 4/2008 | Okayama |
| 2008/0242035 A1 | 10/2008 | Futase et al. |

FOREIGN PATENT DOCUMENTS

| JP | 11-251591 A | 9/1999 |
| JP | 2007-281298 A | 10/2007 |
| JP | 2008-78559 A | 4/2008 |
| JP | 2008-103644 A | 5/2008 |
| JP | 2008-244059 A | 10/2008 |

* cited by examiner

*Primary Examiner* — Bradley K Smith
*Assistant Examiner* — Marvin Payen
(74) *Attorney, Agent, or Firm* — Miles & Stockbridge P.C.

(57) ABSTRACT

To provide a semiconductor device with improved reliability which includes a metal silicide layer formed by a salicide process. After forming gate electrodes, an n+-type semiconductor region, and a p+-type semiconductor region for a source or drain, a $Ni_{1-x}Pt_x$ alloy film is formed over a semiconductor substrate. The alloy film reacts with the gate electrodes, the n+-type semiconductor region, and the p+-type semiconductor region by a first heat treatment to form a metal silicide layer in a $(Ni_{1-y}Pt_y)_2Si$ phase. At this time, the first heat treatment is performed at a heat treatment temperature where a diffusion coefficient of Ni is larger than that of Pt. Further, the first heat treatment is performed such that a reacted part of the alloy film remains at the metal silicide layer. This results in y>x. Then, after removing the unreacted part of the alloy film, the metal silicide layer is further subjected to a second heat treatment to form a metal silicide layer in a $Ni_{1-y}Pt_y Si$ phase.

17 Claims, 45 Drawing Sheets

FIG. 24

| SAMPLE No. | SILICON REGION 61 CONDUCTIVITY TYPE | ALLOY FILM 11 Ni$_{0.963}$Pt$_{0.037}$ th1 [nm] | FIRST HEAT TREATMENT TEMPERATURE [°C] | TIME [sec.] | tn6 [nm] | R2 [%] | tn2 [nm] | tn3 [nm] | R1 [%] | R3 | SECOND HEAT TREATMENT TEMPERATURE [°C] | METAL SILICIDE 41b Ni$_{1-y}$Pt$_y$Si Pt CONCENTRATION [%] | PARTICLE SIZE [nm] |
|---|---|---|---|---|---|---|---|---|---|---|---|---|---|
| No.1 | N+ | 10 | 270 | 59 | 10 | 100 | 0 | 10 | 100 | 0 | 500 | 4.1 | 42 |
| No.2 | N+ | 20 | 270 | 59 | 10 | 50 | 10 | 10 | 50 | 1 | 500 | 4.6 | 40 |
| No.3 | N+ | 10 | 270 | 600 | 18.5 | 185 | 0 | 10 | 100 | 0 | 500 | 3.7 | 49 |
| No.4 | N+ | 100 | 270 | 59 | 10 | 10 | 90 | 10 | 10 | 9 | 500 | 16.0 | 40 |
| No.5 | P+ | 10 | 270 | 59 | 12.3 | 123 | 0 | 10 | 100 | 0 | 500 | 3.8 | 115 |
| No.6 | P+ | 20 | 270 | 59 | 12.3 | 62 | 7.7 | 12.3 | 62 | 0.63 | 500 | 4.4 | 72 |
| No.7 | P+ | 10 | 270 | 600 | 22.3 | 223 | 0 | 10 | 100 | 0 | 500 | 3.7 | 172 |
| No.8 | P+ | 100 | 270 | 59 | 12.3 | 12 | 87.7 | 12.3 | 12 | 7.1 | 500 | 13.3 | 76 |

SAMPLE No. : No.4, R2 : 10%, PARTICLE SIZE : 40nm

SAMPLE No. : No.2, R2 : 50%, PARTICLE SIZE : 40nm

SAMPLE No. : No.1, R2 : 100%, PARTICLE SIZE : 42nm

SAMPLE No. : No.3, R2 : 185%, PARTICLE SIZE : 49nm

SAMPLE No. : No.8, R2 : 12%, PARTICLE SIZE : 76nm

SAMPLE No. : No.6, R2 : 62%, PARTICLE SIZE : 72nm

SAMPLE No. : No.5, R2 : 123%, PARTICLE SIZE : 115nm

SAMPLE No. : No.7, R2 : 223%, PARTICLE SIZE : 172nm

METHOD OF MANUFACTURING SEMICONDUCTOR DEVICE

CROSS-REFERENCE TO RELATED APPLICATIONS

The disclosure of Japanese Patent Application No. 2008-266254 filed on Oct. 15, 2008 including the specification, drawings and abstract is incorporated herein by reference in its entirety.

BACKGROUND OF THE INVENTION

The present invention relates to a method of manufacturing a semiconductor device, and more particularly, to a technique effectively applied to the manufacture of a semiconductor element with a metal silicide layer.

With increasing integration of semiconductor devices, metal insulator semiconductor field effect transistors (MISFETs) have been microfabricated according to a scaling rule. However, since a gate resistance or a source/drain resistance is increased, even if the MISFET is microfabricated, a high-speed operation cannot be disadvantageously obtained. Thus, a salicide (self-aligned silicide) technique has been studied which is designed to decrease the resistance of a gate or source/drain by forming a low-resistance metal silicide layer, for example, a nickel silicide layer or a cobalt silicide layer, by a self-alignment process on the surface of a conductive film forming the gate and on the surface of a semiconductor region forming the source/drain.

Japanese Unexamined Patent Publication No. 2008-78559 (Patent Document 1) discloses a technique for forming a nickel platinum monosilicide layer.

Japanese Unexamined Patent Publication No. Hei 11 (1999)-251591 (Patent Document 2) discloses a technique that can make the thickness of a silicide layer formed at an edge of a silicon electrode substantially equal to that at the center of the electrode.

Japanese Unexamined Patent Publication No. 2008-103644 (Patent Document 3) discloses a technique regarding formation of a nickel silicide layer.
[Patent Document 1]
Japanese Unexamined Patent Publication No. 2008-78559
[Patent Document 2]
Japanese Unexamined Patent Publication No. Hei 11 (1999)-251591
[Patent Document 3]
Japanese Unexamined Patent Publication No. 2008-103644

SUMMARY OF THE INVENTION

Studies by the inventors have shown the following.

A metal silicide layer is formed on the surfaces of a conductive film forming a gate, and of a semiconductor region forming a source/drain by a salicide process. The metal silicide layer is preferably comprised of nickel silicide rather than cobalt silicide from the requirements for decreasing a resistance by microfabrication. The formation of the metal silicide layer using not cobalt silicide, but nickel silicide can further decrease the resistance of the metal silicide layer, and can also decrease the diffusion resistance, the contact resistance, or the like of the source/drain. Further, the formation of the metal silicide layer using not cobalt silicide, but nickel silicide can make the metal silicide layer thinner, and can also make a junction depth of the source/drain shallow, which has an advantage in microfabrication of the metal insulator semiconductor field effect transistor.

In use of a nickel silicide layer as the metal silicide layer, the addition of Pt or the like to the nickel silicide layer has advantages in less agglomeration of the formed metal silicide layer, and in suppression of abnormal growing of a high-resistance $NiSi_2$ phase in the formed metal silicide layer, thus enabling improvement of the reliability of the semiconductor device. Preferably, a metal silicide layer comprised of silicide containing Ni and Pt is formed by forming a Ni—Pt alloy film with Pt added to Ni on a semiconductor substrate after forming a MISFET on the semiconductor substrate, and reacting the alloy film with a semiconductor region forming the source/drain and a conductive film forming a gate electrode.

However, in depositing the Ni—Pt alloy film over the semiconductor substrate, Ni and Pt differ from each other in sputtering angle. Thus, an increase in concentration of Pt in the Ni—Pt alloy film can result in formation of the nonuniform Ni—Pt alloy film over the semiconductor substrate. When the Pt concentration in the Ni—Pt alloy film is intended to be increased so as to uniformly deposit the Ni—Pt alloy film on the semiconductor substrate, the Ni—Pt alloy film may be much deposited on a honeycomb collimator even by adjusting a sputtering angle of Pt by use of the honeycomb collimator or the like. Thus, there is a limit on increasing the concentration of Pt. Since the effect given by addition of Pt to the nickel silicide layer as described above is enhanced as the Pt concentration of the nickel silicide layer is increased, however, it is desired that the concentration of Pt in the nickel silicide layer is enhanced to further improve the reliability of the semiconductor device.

Accordingly, it is an object of the present invention to provide a technique that can improve the reliability of a semiconductor device.

The above, other objects and novel features of the invention will become apparent from the description of the present specification and the accompanying drawings.

The outline of representative aspects of the invention disclosed in the present application will be briefly described below.

In a method of manufacturing a semiconductor device according to a representative embodiment of the invention, after forming a semiconductor region in a semiconductor substrate, an alloy film comprised of nickel and a first metal element is formed over the semiconductor substrate, and the alloy film is reacted with the semiconductor region by a first heat treatment to form a metal silicide layer comprised of silicide containing nickel and the first metal element. The rate of the first metal element included in metal elements forming the metal silicide layer is larger than that of the first metal element included in the alloy film. Thereafter, a part of the alloy film not reacted with the semiconductor region is removed from the metal silicide layer, and then a second heat treatment is performed at a heat treatment temperature higher than that of the first heat treatment.

The effects obtained by the representative aspects of the invention disclosed in the present application will be briefly described below.

Accordingly, the reliability of the semiconductor device can be improved.

BRIEF DESCRIPTION OF THE DRAWINGS

FIG. 24 is a table of a summary of various formation conditions and properties of $Ni_{1-y}Pt_ySi$ layers formed when the $Ni_{1-y}Pt_ySi$ layers are formed.

DETAILED DESCRIPTION OF THE PREFERRED EMBODIMENTS

Figure 1:
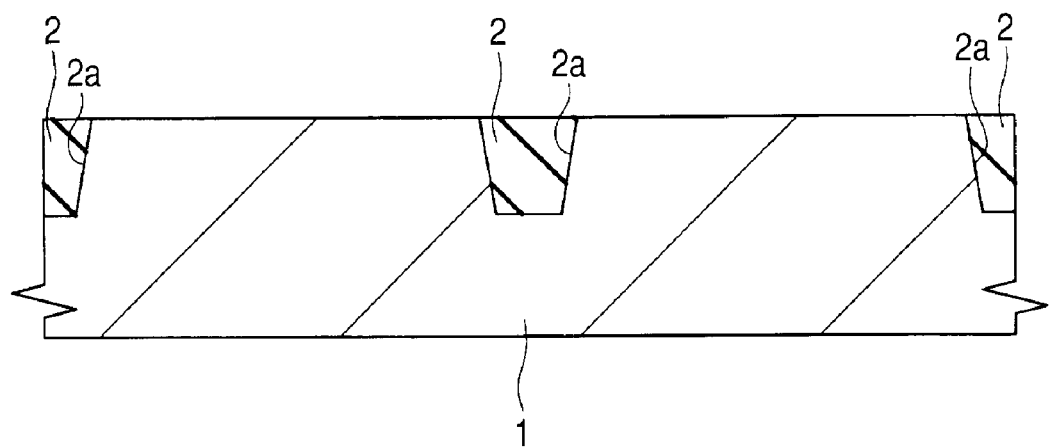
FIG. 1 is a cross-sectional view of a main part of a semiconductor device in a manufacturing procedure thereof according to one embodiment of the invention.

Preferred embodiments may be described by being divided into sections or embodiments for convenience, if necessary, but these embodiments are related to each other except when specified otherwise. One of the embodiments has a relationship with respect to the other so as to be a modified example of a part or all of the other, or a detailed part or a supplemental description of the other embodiment. Further, when referring to the number of components or the like (including the number of pieces, the numeral value, the amount, the range, and the like) in the following embodiments, the embodiments are not limited to a specific value except when specified otherwise and except when clearly limited otherwise in principle, and thus may be equal to or more than, or less than the specific value. It is obvious that in the following embodiments, components (including an element, a step, or the like) are not necessarily essential except when specified otherwise and except when clearly considered essential in principle. Similarly, when referring to the shapes, positional relations and the like of the components or the like in the following description of the embodiments, they will include ones substantially analogous or similar to their shapes or the like, unless otherwise specified and considered not to be definitely so in principle. The same goes for the numeral value and range described above.

Now, the preferred embodiments of the invention will be described in detail below based on the accompanying drawings. In all drawings for explaining the embodiments, a member having the same function is designated by the same reference numeral, and thus repeated description thereof will be omitted below. In the following embodiments, the description of the same or similar parts will not be repeated in principle except when considered necessary.

In the accompanying drawings used in the embodiments, hatching is omitted even in some cross-sectional views for easy understanding. Even in some plan views, hatching is added for easy understanding.

A dry cleaning technique is disclosed in Japanese Patent Application No. 2006-107780 filed by Futase, et al. (on Apr. 10, 2006), and Japanese Patent Application No. 2007-81147 filed by Futase, et al. (on Mar. 27, 2007).

First Embodiment

A manufacturing procedure of a semiconductor device according to this embodiment will be described below with reference to the accompanying drawings. FIGS. 1 to 5 are cross-sectional views showing main parts of the semiconductor device during the manufacturing procedure thereof device according to one embodiment of the invention, for example, the semiconductor device including a complementary metal insulator semiconductor field effect transistor (CMISFET).

First, as shown in FIG. 1, a semiconductor substrate (semiconductor wafer) 1 including a p-type single crystal silicon or the like having a specific resistance of, for example, about 1 to 10 Ωcm is prepared. Element isolation regions 2 are formed at a main surface of the semiconductor substrate 1. The element isolation region 2 is formed of an insulator, such as silicon oxide, for example, by a shallow trench isolation (STI) method, or by a local oxidization of silicon method (LOCOS) method. For example, an insulating film embedded in a slot (element isolation slot) 2a formed in the semiconductor substrate 1 can form the element isolation region 2.

Figure 2:
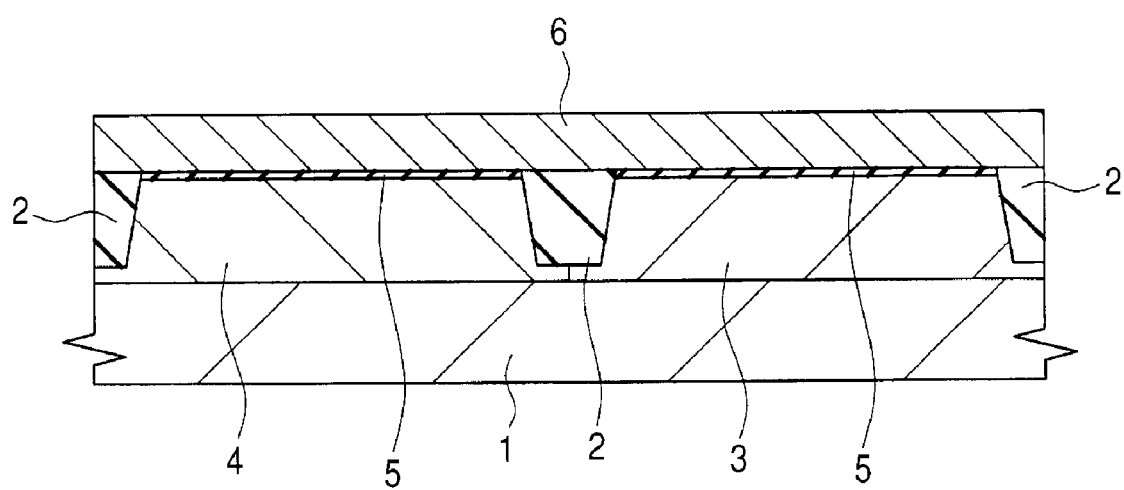
FIG. 2 is a cross-sectional view of a main part of the semiconductor device in the manufacturing procedure thereof, following the step shown in FIG. 1.

Then, as shown in FIG. 2, a p-type well 3 and an n-type well 4 are formed in a predetermined depth from the main surface of the semiconductor substrate 1. The p-type well 3 can be formed by ion implantation of p-type impurities, such as boron (B), into an n-channel MISFET formation area of the semiconductor substrate 1 using a photoresist film (not shown) covering a p-channel MISFET formation area as an ion implantation inhibition mask. The n-type well 4 can be formed by ion implantation of n-type impurities, such as phosphorus (P) or arsenic (As), into a p-channel MISFET formation area of the semiconductor substrate 1 using another photoresist film (not shown) covering an n-channel MISFET formation area as an ion implantation inhibition mask.

Then, the surface of the semiconductor substrate 1 is cleansed (cleaned), for example, by wet etching or the like using a hydrofluoric acid (Hf) solution, and a gate insulating film 5 is formed over the surface of the semiconductor substrate 1 (that is, on the p-type well 3 and the n-type well 4). The gate insulating film 5 is comprised of, for example, a thin silicon oxide film, and can be formed, for example, by thermal oxidation or the like.

Subsequently, a silicon film 6, such as a polysilicon film, is formed over the semiconductor substrate 1 (that is, on the gate insulating film 5 on the p-type well 3 and the n-type well 4) as a conductive film for formation of a gate electrode. An n-channel MISFET formation area of the silicon film 6 (an area for a gate electrode GE1 to be described later) becomes a low-resistance n-type semiconductor film (doped polysilicon film) formed by ion implantation of n-type impurities, such as phosphorus (P) or arsenic (As), using a photoresist film (not shown) as a mask. A p-channel MISFET formation area of the silicon film 6 (an area for a gate electrode GE2 to be described later) becomes a low-resistance p-type semiconductor film (doped polysilicon film) formed by ion implantation of p-type impurities, such as boron (B), using another photoresist film (not shown) as a mask. The silicon film 6 which is an amorphous silicon film at the time of deposition can be converted into a polysilicon film by heat treatment after the deposition (ion implantation).

Figure 3:
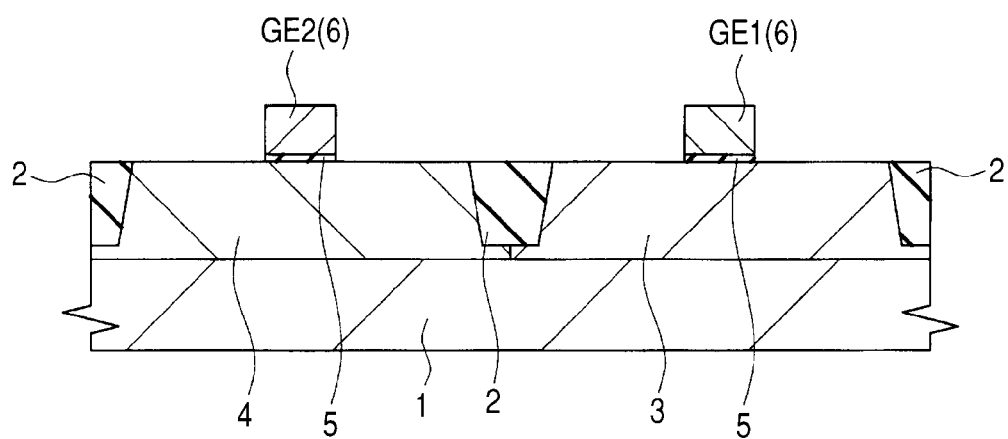
FIG. 3 is a cross-sectional view of a main part of the semiconductor device in the manufacturing procedure thereof, following the step shown in FIG. 2.

Then, as shown in FIG. 3, the silicon film 6 is patterned by photolithography and dry etching to form gate electrodes GE1 and GE2.

The gate electrode GE1 serving as a gate electrode of the n-channel MISFET is comprised of a polycrystal silicon (an n-type semiconductor film, or a doped polysilicon film) into which n-type impurities are introduced, and is formed over the p-type well 3 via the gate insulating film 5. That is, the gate electrode GE1 is formed on the gate insulating film 5 of the p-type well 3. The gate electrode GE2 serving as a gate electrode of the p-channel MISFET is comprised of a polycrystal silicon (a p-type semiconductor film or a doped polysilicon film) into which p-type impurities are introduced, and is formed over the n-type well 4 via the gate insulating film 5. That is, the gate electrode GE2 is formed on the gate insulating film 5 of the n-type well 4. The gate length of each of the gate electrodes GE1 and GE2 can be changed as necessary, for example, to about 50 nm.

Figure 4:
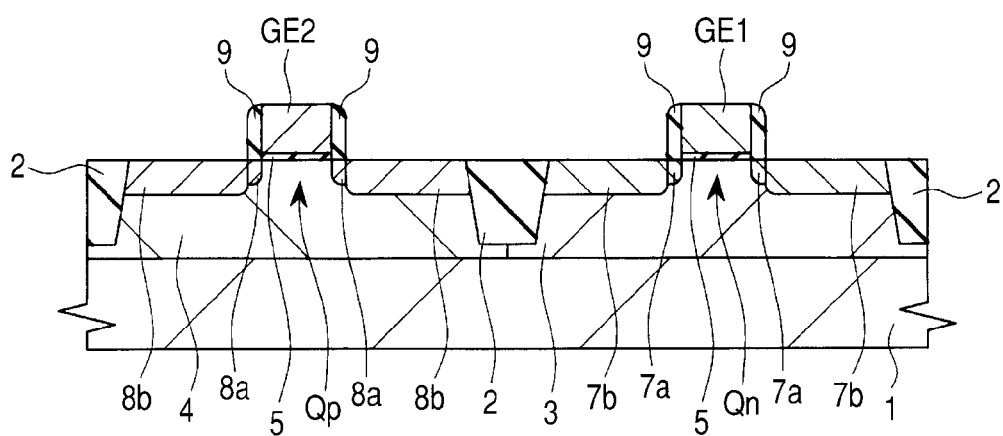
FIG. 4 is a cross-sectional view of a main part of the semiconductor device in the manufacturing procedure thereof, following the step shown in FIG. 3.

Then, as shown in FIG. 4, n-type impurities, such as phosphorus (P) or arsenic (As), are ion implanted into areas on both sides of the gate electrode GE1 of the p-type well 3 to form (a pair of) $n^-$-type semiconductor regions $7a$. And, p-type impurities, such as boron (b), are ion implanted into areas on both sides of the gate electrode GE2 of the n-type well 4 to form (a pair of) $p^-$-type semiconductor regions $8a$. The depth (junction depth) of each of the $n^-$-type semiconductor region $7a$ and the $p^-$-type semiconductor regions $8a$ can be set, for example, to about 30 nm.

Then, a sidewall spacer or sidewall (sidewall insulating film) 9 comprised of, for example, a silicon oxide film, a silicon nitride film, or a lamination of these insulating films, is formed as a sidewall insulating film (insulating film) on each sidewall of the gate electrodes GE1 and GE2. The sidewall 9 can be formed, for example, by depositing a silicon oxide film or a silicon nitride film or a lamination of these films over the semiconductor substrate 1, and by anisotropic etching of the silicon oxide film or the silicon nitride film or the lamination of these films by a reactive ion etching (RIE) method.

After forming the sidewalls 9, n-type impurities, such as arsenic (As) or phosphorus (P), are ion implanted into areas on both sides of the gate electrode GE1 of the p-type well 3 and the sidewalls 9 thereby to form (a pair of) $n^+$-type semiconductor regions $7b$ (source and drain). Specifically, arsenic (As) ions are implanted at an acceleration voltage of 10 to 30 keV to a dose between about $1\times10^{15}/cm^2$ and about $1\times10^{16}/cm^2$. For example, arsenic (As) ions are implanted at an energy of 20 keV to a dose of $4\times10^{15}/cm^2$. And, phosphorus (P) ions are implanted at an acceleration voltage of 5 to 20 keV to a dose between about $1\times10^{14}/cm^2$ and about $1\times10^{15}/cm^2$. For example, phosphorus (P) ions are implanted at an acceleration voltage of 10 keV to a dose of $5\times10^{14}/cm^2$. In this way, the $n^+$-type semiconductor region $7b$ is formed. For example, p-type impurities, such as boron (B), are ion implanted into areas on both sides of the gate electrode GE2 of the n-type well 4 and the sidewall 9. For example, boron (B) ions are implanted at an acceleration voltage of 1 to 3 keV to a dose between about $1\times10^{15}/cm^2$ and about $1\times10^{16}/cm^2$. For example, boron (B) ions are implanted at an acceleration voltage of 2 keV to a dose of $4\times10^{15}/cm^2$ thereby to form the $p^+$-type semiconductor region $8b$. Either one of the $n^+$-type semiconductor region $7b$ and the $p^+$-type semiconductor region $8b$ may be formed in advance. After the ion implantation, an anneal process for activating the impurities introduced is a spike anneal process at a temperature of, for example, about 1050° C. The depth (junction depth) of each of the $n^+$-type semiconductor region $7b$ and the $p^+$-type semiconductor region $8b$ can be, for example, about 80 nm.

The $n^+$-type semiconductor region $7b$ has a higher concentration of impurities than that of the $n^-$-type semiconductor region $7a$. The $p^+$-type semiconductor region $8b$ has a higher concentration of impurities than that of the $p^-$-type semiconductor region $8a$. Thus, the n-type semiconductor region (impurity diffusion layer) serving as a source or drain of the n-channel type MISFET is formed of the $n^+$-type semiconductor region (impurity diffusion layer) $7b$ and the $n^-$-type semiconductor region $7a$. And, the p-type semiconductor region (impurity diffusion layer) serving as a source or drain of the p-channel MISFET is formed of the $p^+$-type semiconductor region (impurity diffusion layer) $8b$ and the $p^-$-type semiconductor region $8a$. Thus, the source/drain regions of the n-channel MISFET and the p-channel MISFET have a lightly doped drain (LDD) structure. The $n^-$-type semiconductor region $7a$ is formed in the gate electrode GE1 in a self-alignment manner. The $n^+$-type semiconductor region $7b$ is formed against the sidewall 9 on each sidewall of the gate electrode GE1 in a self-alignment manner. The $p^-$-type semiconductor region $8a$ is formed in the gate electrode GE2 in a self-alignment manner. The $p^+$-type semiconductor region $8b$ is formed against the sidewall 9 formed on each sidewall of the gate electrode GE2 in a self-alignment manner.

In this way, an n-channel MISFET (metal insulator semiconductor field effect transistor) Qn is formed as a field-effect transistor in the p-type well 3. Further, a p-channel type MISFET (metal insulator semiconductor field effect transistor) Qp is formed as another field-effect transistor in the n-type well 4. Thus, the structure shown in FIG. 4 is obtained. The n-channel MISFETQn can be defined as an n-channel field-effect transistor, and the p-channel MISFETQp can be defined as a p-channel field-effect transistor. The $n^+$-type semiconductor region $7b$ can be defined as a semiconductor region for the source or drain of the n-channel type MISFETQn. The $p^+$-type semiconductor region $8b$ can be defined as a semiconductor region for the source or drain of the p-channel type MISFETQp.

Then, a low-resistance metal silicide layer (corresponding to a metal silicide layer $41b$ to be described later) is formed on the surfaces of the gate electrode GE1 and of the source and drain regions (n+-type semiconductor regions 7b) of the n-channel MISFETQn, and on the surfaces of the gate electrode GE2 and the source and drain regions (p+-type semiconductor region 8b) of the p-channel MISFETQp by a salicide (self aligned silicide) technique. A forming process of the metal silicide layer will be described below.

Figure 5:
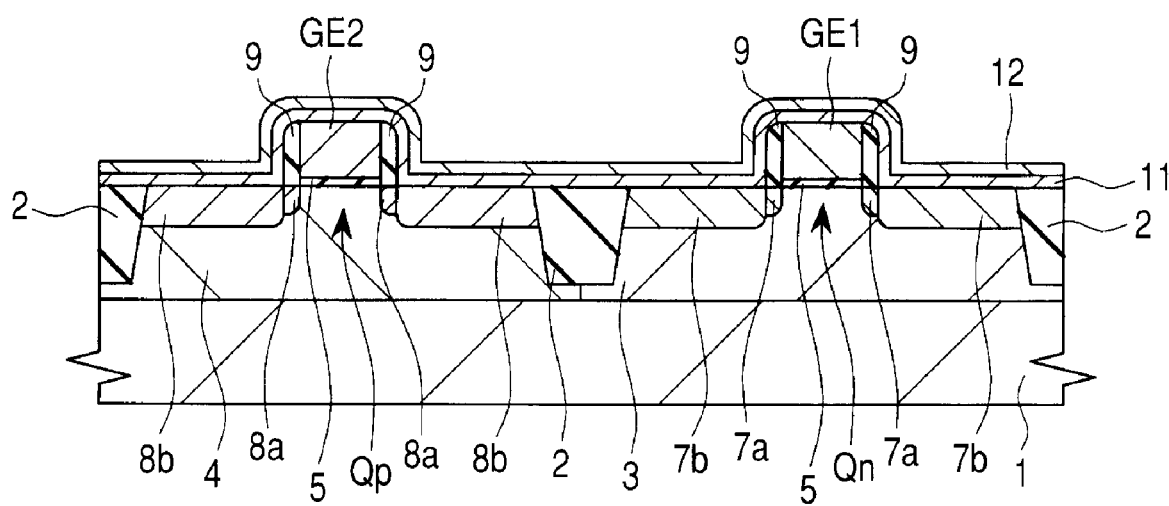
FIG. 5 is a cross-sectional view of a main part of the semiconductor device in the manufacturing procedure thereof, following the step shown in FIG. 4.
Figure 6:
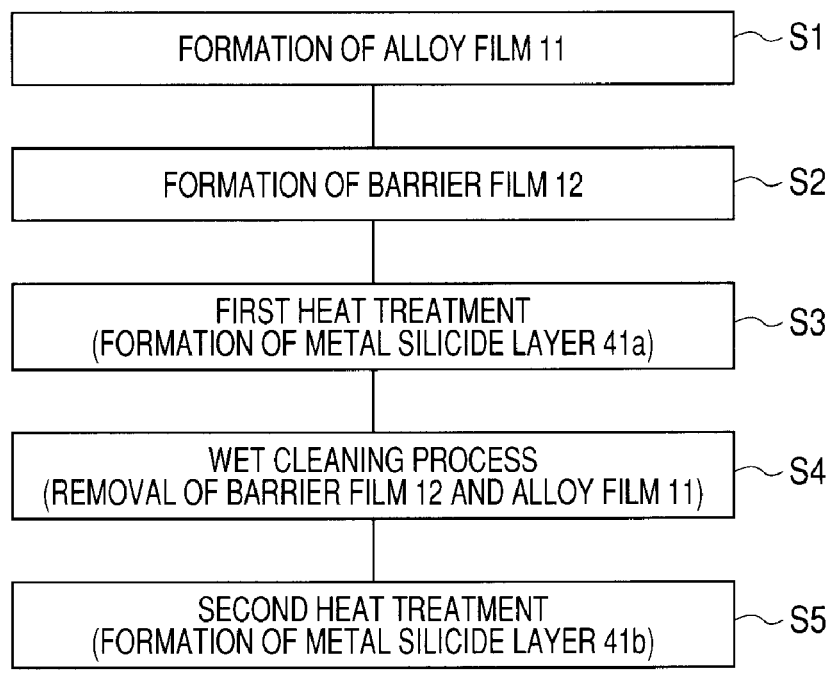
FIG. 6 is a flowchart of a manufacturing process showing parts of the manufacturing procedure of the semiconductor device in the embodiment of the invention.
Figure 7:
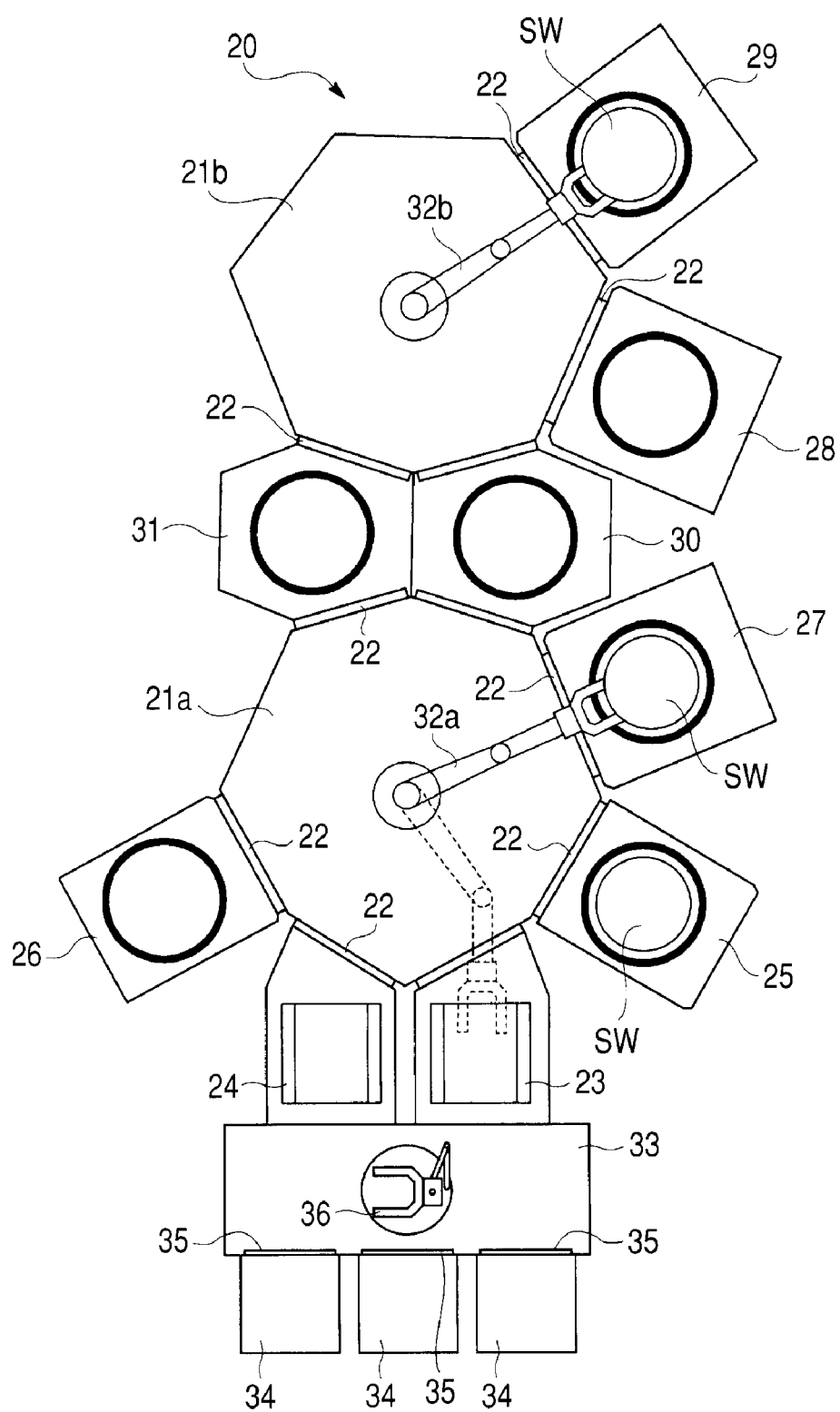
FIG. 7 is a schematic plan view showing a deposition device of silicide material in the embodiment of the invention.
Figure 8:
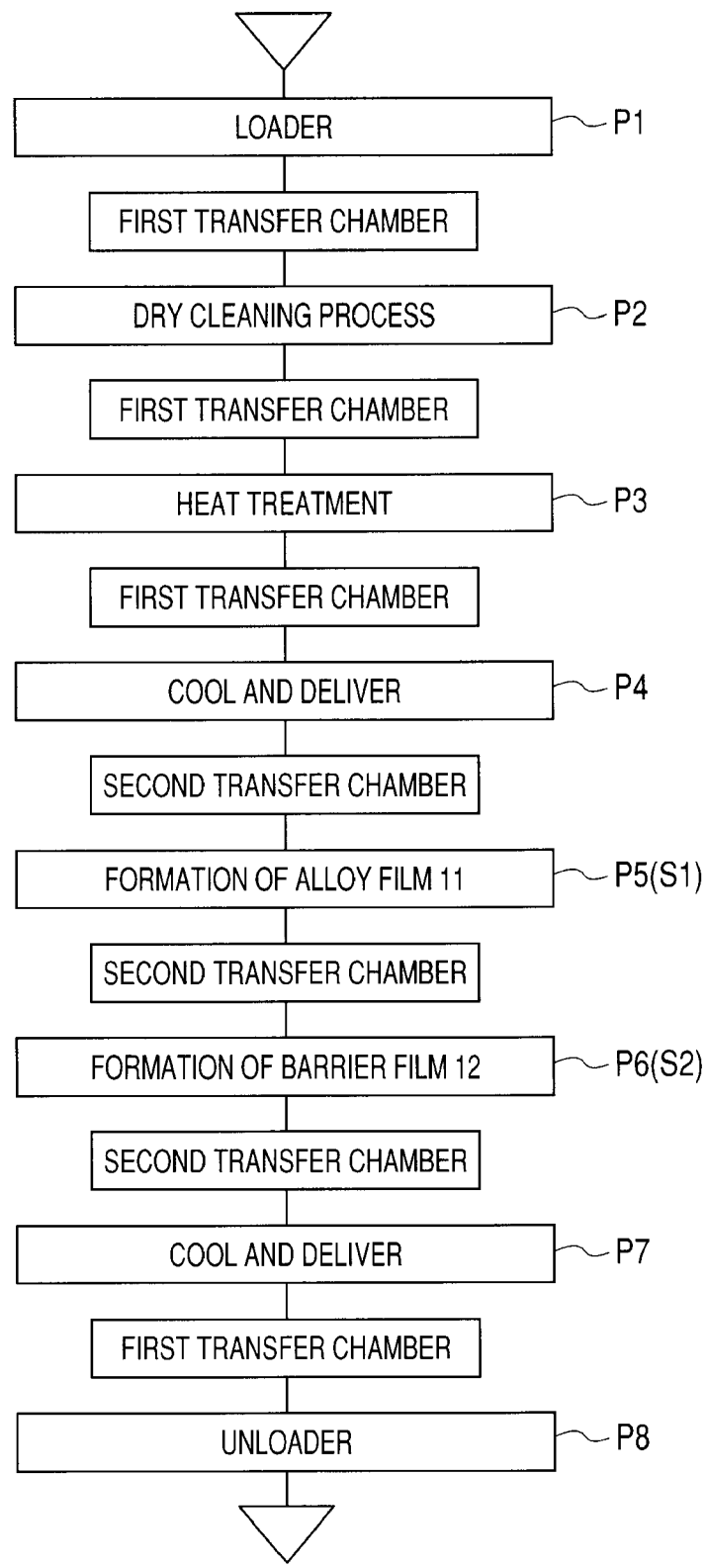
FIG. 8 is a diagram showing a deposition process of silicide material in the embodiment of the invention.
Figure 9:
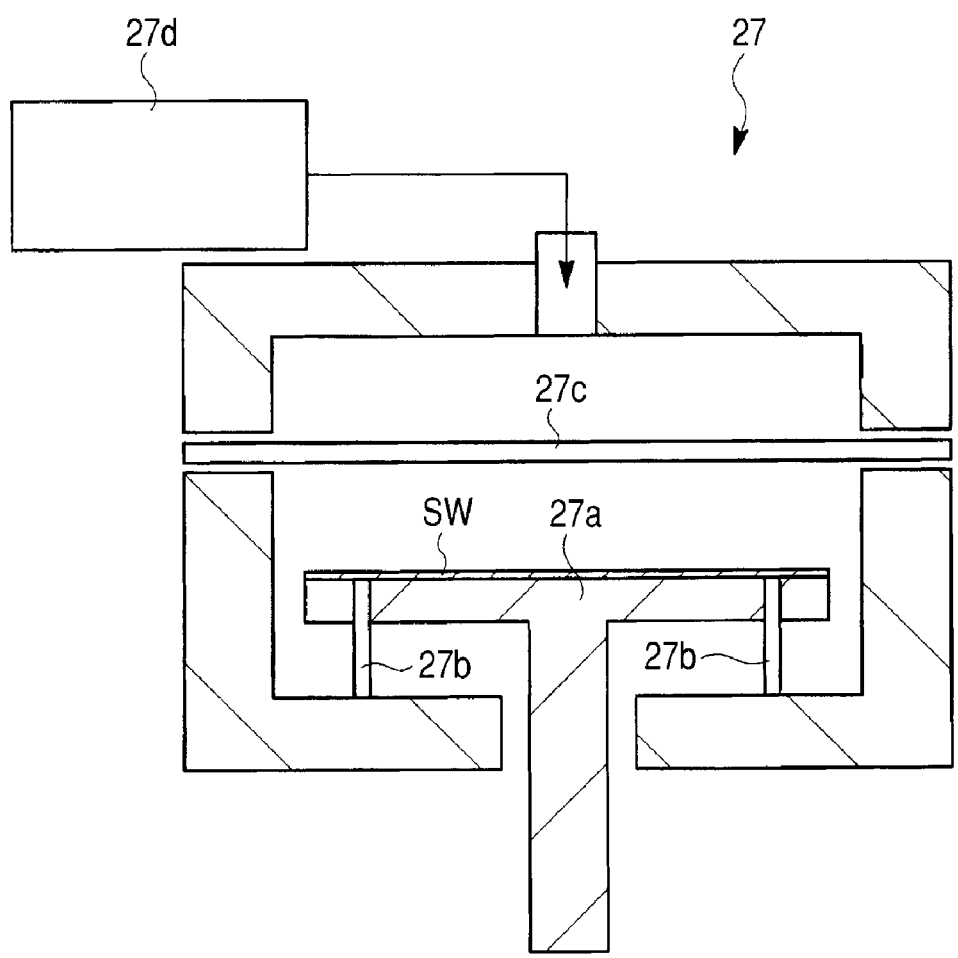
FIG. 9 is a schematic cross-sectional view of a chamber for a dry cleaning process included in the deposition device of the silicide material in the embodiment of the invention.

FIG. 5 is a cross-sectional view of a main part in a manufacturing procedure of the semiconductor device, following the step shown in FIG. 4. FIG. 6 is a manufacturing process flowchart showing a part of the manufacturing process of the semiconductor device in this embodiment. FIG. 6 shows a manufacturing process flow of a process for forming the metal silicide layer (metal and semiconductor reaction layer) on the surfaces of the gate electrodes GE1 and GE2, the n+-type semiconductor region 7b, and the p+-type semiconductor region 8b by the silicide process after obtaining the structure shown in FIG. 4. FIG. 7 is an exemplary plan view of a film forming device for silicide material (a material film for formation of the metal silicide layer, corresponding to the alloy film 11 and the barrier film 12). FIG. 8 is a diagram showing a deposition process (process flowchart) of silicide material. FIG. 9 is a schematic cross-sectional view showing a chamber for a dry cleaning process included in the deposition device of silicide material. FIG. 10 is a schematic cross-sectional view of a chamber for explaining process steps of a semiconductor wafer in the chamber for the dry cleaning process included in the deposition device of silicide material. FIGS. 11 to 15 are cross-sectional views of main parts of the semiconductor device in the manufacturing process thereof, following the step shown in FIG. 5. FIG. 6 corresponds to a manufacturing process flow of the steps shown in FIGS. 5, 11, and 12, and FIG. 8 corresponds to a manufacturing process flow of the step shown in FIG. 5.

As shown in FIG. 5, the surfaces of the gate electrodes GE1 and GE2, the n+-type semiconductor region 7b, and the p+-type semiconductor region 8b are exposed after obtaining the structure shown in FIG. 4 as described above, and then an alloy film 11 is formed (deposited) using, for example, a sputtering method, over the main (entire) surface of the semiconductor substrate 1 containing the gate electrodes GE1 and GE2, the n+-type semiconductor region 7b, and the p+-type semiconductor region 8b (in step S1 shown in FIG. 6). That is, in step S1, the alloy film 11 is formed over the semiconductor substrate 1 containing the surfaces of the n+-type semiconductor region 7b and the p+-type semiconductor region 8b to cover the gate electrodes GE1 and GE2.

Subsequently, a barrier film (a stress control film, an oxidation prevention film, and/or a cap film) 12 is formed (deposited) on the alloy film 11 (in step S2 shown in FIG. 6).

Before the step S1 (deposition step of the alloy film 11), the dry cleaning process (corresponding to the step P2 to be described later) is performed using at least one of HF gas, $NF_3$ gas, $NH_3$ gas, and $H_2$ gas thereby to remove a natural oxidation film on the surfaces of the gate electrodes GE1 and GE2, the n+-type semiconductor region 7b, and the p+-type semiconductor region 8b. Then, the steps S1 and S2 are more preferably performed without exposing the semiconductor substrate 1 to the atmosphere (under the atmosphere containing oxygen).

The alloy film 11 is an alloy film (that is, a nickel alloy film) containing at least nickel (Ni), specifically, an alloy film containing nickel (Ni) and first metal element M, that is, a Ni-M alloy film. The first metal element M is at least one kind of element selected from the group consisting of Pt (platinum), Pd(palladium), V (vanadium), Er (erbium), and Yb (ytterbium), and more preferably Pt (platinum). When the first metal element M is Pt (platinum), the alloy film 11 is an alloy film containing nickel (Ni) and platinum (Pt), that is, a Ni—Pt alloy film. The alloy film 11 is more preferably a Ni—Pt alloy film (an alloy film containing Ni and Pt).

When the ratio (atomic ratio) of Ni to the first metal element M (atomic ratio) in the alloy film 11 is 1−x:x, the alloy film 11 can be represented as a $Ni_{1-x}M_x$ alloy film, where M of $Ni_{1-x}M_x$ is the first metal element M. The rate (ratio) of Ni in the $Ni_{1-x}M_x$ alloy film is (1−x)×100%, and the rate (ratio) of the first metal element M in the $Ni_{1-x}M_x$ alloy film is x×100%. The rate (ratio, concentration) of the element in the present application is represented by atomic % in terms of %. For example, a $Ni_{0.963}Pt_{0.037}$ alloy film or the like can be used as the alloy film 11. When the alloy film 11 is the $Ni_{0.963}Pt_{0.037}$ alloy film, the rate (ratio) of Ni in the alloy film 11 is 96.3 atomic %, and the rate (ratio) of Pt in the alloy film 11 is 3.7 atomic %.

The barrier film 12 is comprised of, for example, a titanium nitride (TiN) film or a titanium (Ti) film, and can have a thickness (thickness of deposition) of, for example, about 15 nm. The barrier film 12 acts as a stress control film (film for controlling stress in an active region of the semiconductor substrate), and a film for preventing penetration of oxygen. The barrier film 12 is provided on the alloy film 11 so as to control the stress applied to the semiconductor substrate 1 and to prevent oxidation of the alloy film 11 or the like. Now, one example of a preferred formation method of the alloy film 11 and the barrier 12 will be described below.

The deposition of the alloy film 11 and the barrier film 12 is performed by a deposition device 20 of the silicide material shown in FIG. 7.

As shown in FIG. 7, the deposition device 20 is of a multi-chamber type including two transfer chambers of a first transfer chamber 21a and a second transfer chamber 21b arranged therein with load lock chambers 23 and 24 and three chambers 25, 26, and 27 disposed around the first transfer chamber 21a via gate valves 22 as opening and closing means, and with two chambers 28 and 29 disposed around the second transfer chamber 21b via the gate valves 22 as the opening and closing means. Further, two chambers 30 and 31 for transfer are provided between the first transfer chamber 21a and the second transfer chamber 21b. The first transfer chamber 21a is controlled such that a predetermined degree of vacuum is maintained by an exhaust mechanism or the like. The first transfer chamber 21a is provided at its center with a robot 32a for transfer with a multi-joined arm structure for transferring a semiconductor wafer SW. Likewise, the second transfer chamber 21b is controlled such that a predetermined degree of vacuum is maintained by an exhaust mechanism or the like. Further, the second transfer chamber 21b is provided at its center with a robot 32b for transfer with a multi-joined arm structure for transferring a semiconductor wafer SW.

The chambers 25 and 26 included in the first transfer chamber 21a is a chamber for heat treatment for performing the heat treatment at a relatively high temperature, and the chamber 27 is a chamber for the dry cleaning process (treatment). The chamber 28 included in the second transfer chamber 21b is a chamber for deposition that is designed to form the alloy film 11 (preferably, a Ni—Pt alloy film) by the sputtering method, and the chamber 29 is a chamber for deposition that is designed to form the barrier film 12 (for example, a titanium nitride film) by the sputtering film. When the barrier film 12 is deposited by a plasma CVD method, the chamber 29 is a chamber for deposition that is designed to form the barrier film 12 (for example, a titanium film) by the plasma CVD method.

Each of the chambers 30 and 31 provided between the first transfer chamber 21a and the second transfer chamber 21b is a chamber for delivery that is designed to deliver the semiconductor wafer SW between the first transfer chamber 21a and the second transfer chamber 21b, and also a chamber for cooling that is used to cool the semiconductor wafer SW. The deposition device 20 has three chambers included only in the first transfer chamber 21a, and two chambers included only in the second transfer chamber 21b. The invention is not limited thereto, and any other chambers for the same application or for other applications can be added to the invention.

First, one sheet of semiconductor wafer SW is taken out from any one of hoops 34 by a robot 36 for transfer disposed in a wafer transfer chamber 33 (in a process P1 shown in FIG. 8) to be carried into either of the load lock chambers 23 and 24. The semiconductor wafer SW corresponds to the above-mentioned semiconductor substrate 1. The hoop 34 is a closed container for batch transfer of the semiconductor wafer SW. The hoop 34 normally accommodates therein 25, 12, and 6 pieces of semiconductor wafers SW in units of batch. An outer wall of the container of the hoop 34 is a sealed structure except for a fine vent filter, so that dust is mostly completely eliminated. Thus, the degree of purity of class 1 in the hoop can be maintained even when the substrate wafer is transferred under an atmosphere of class 1000. Docking with the deposition device 20 is performed by attaching a door of each of hoops 34 to a port 35 and pulling the door into the wafer delivery chamber 33 while maintaining the degree of purity. Subsequently, after vacuuming the inside of the load lock chamber 23, the semiconductor wafer SW is transferred under vacuum from the first transfer chamber 21 to the chamber 27 for the dry cleaning process (in a process P2 shown in FIG. 8). FIG. 9 shows a schematic cross-sectional view of the chamber 27. As shown in FIG. 9, the chamber 27 mainly includes a wafer stage 27a, wafer lift pins 27b, a shower head 27c, and a remote plasma generation device 27d. The wafer stage 27a and the wafer lift pin 27b have independent elevating mechanisms that can arbitrarily control the distance between the shower head 27c and the semiconductor wafer SW, and the distance between the semiconductor wafer SW and the wafer stage 27a. The shower head 27c disposed above the wafer stage 27a is constantly maintained at a certain temperature, which is, for example, 180° C.

Figure 10C:
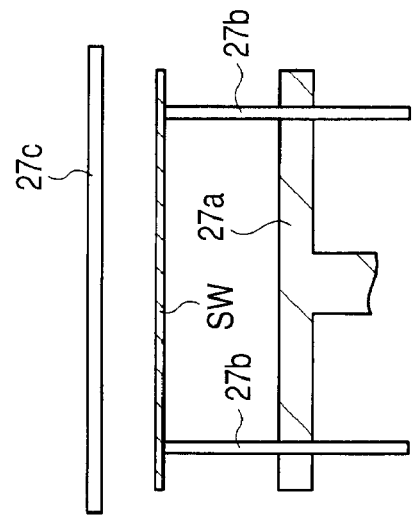
FIG. 10C is a schematic cross-sectional view of the chamber for explaining process steps of a semiconductor wafer in the chamber for the dry cleaning process included in the deposition device of the silicide material in the first embodiment of the invention.
Figure 10B:
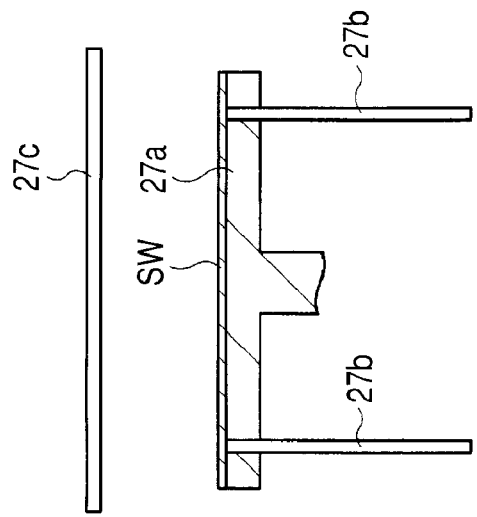
FIG. 10B is a schematic cross-sectional view of the chamber for explaining process steps of a semiconductor wafer in the chamber for the dry cleaning process included in the deposition device of the silicide material in the first embodiment of the invention.
Figure 10A:
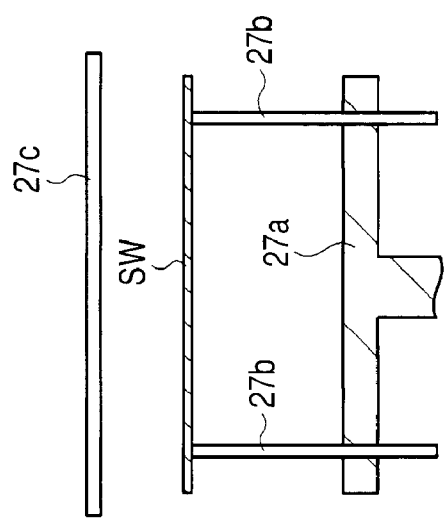
FIG. 10A is a schematic cross-sectional view of the chamber for explaining process steps of a semiconductor wafer in the chamber for the dry cleaning process included in the deposition device of the silicide material in a first embodiment of the invention.

As shown in FIG. 10A, when carrying the semiconductor wafer SW into the chamber 27, the wafer stage 27a is descended, and the wafer lift pins 27b are ascended thereby to mount the semiconductor wafer SW on the wafer lift pins 27b. The distance between the shower head 27c and the semiconductor wafer SW is set to, for example, 16.5±12.7 mm, and the distance between the semiconductor wafer SW and the wafer stage 27a is set to, for example, 25.4±17.8 mm.

Subsequently, in performing a dry cleaning process of the main surface of the semiconductor wafer SW, as shown in FIG. 10B, the wafer stage 27a is ascended and the wafer lift pins 27b are descended thereby to mount the semiconductor wafer SW on the wafer stage 27a. The distance between the shower head 27c and the semiconductor wafer SW is set to, for example, 17.8±5.1 mm.

In the dry cleaning process, a remote plasma generator 27d activates Ar gas with reducing gas, for example, $NF_3$ gas and $NH_3$ gas added thereto to generate plasma, which is introduced into the chamber 27. A natural oxidation film is formed on the surface of silicon (a polycrystal silicon forming the gate electrodes GE1 and GE2 and a single crystal silicon forming the semiconductor substrate 1 with the $n^+$-type semiconductor region 7b and the $p^+$-type semiconductor region 8b formed therein). By supplying the plasma introduced into the chamber 27 to the main surface of the semiconductor wafer SW via the shower head 27c, the natural oxidation film is removed by, for example, a reducing reaction caused between the natural oxidation film and the plasma and represented by the following formula (1). The process conditions of the dry cleaning process are, for example, a shower head temperature of 180° C., an $NF_3$ gas flow rate of 14 sccm, an $NH_3$ gas flow rate of 70 sccm, a pressure of 400 Pa, and a plasma power of 30 W.

$$SiO_2 + 2NF_3 + 2NH_3 \rightarrow (NH_4)_2SiF_6(s) + 2N_2(g) + 2H_2O(g) \quad \text{Formula (1)}$$

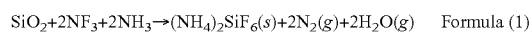

At this time, a product $((NH_4)_2SiF_6)$ produced by the reducing reaction remains on the main surface of the semiconductor wafer SW. Further, the semiconductor wafer SW is mounted only on the wafer stage 27a, and the product remains at parts of the side and back surface of the semiconductor wafer SW. The product remaining at the parts of the side and back surface of the semiconductor wafer SW is peeled off in the case of transferring the semiconductor wafer SW to another chamber, which causes pollution or dust. Following the dry cleaning process (treatment), the semiconductor wafer SW is subjected to the heat treatment in the chamber 27, so that the product remaining on the main surface of the semiconductor wafer SW is removed, while the product remaining on the parts of the side and back surface of the semiconductor wafer SW is also removed.

Subsequently, in applying the heat treatment to the semiconductor wafer SW, as shown in FIG. 10C, the wafer stage 27a is descended and the wafer lift pins 27b are ascended, so that the semiconductor wafer SW is got close to the shower head 27c whose temperature is set to 180° C. The distance between the shower head 27c and the semiconductor wafer SW is set to, for example, 3.8±2.6 mm, and the distance between the semiconductor wafer SW and the wafer stage 27a is set to, for example, 5.9 mm or more.

In the heat treatment, the semiconductor wafer SW is heated by use of a heating temperature (180° C.) of the shower head 27c. The temperature of the semiconductor wafer SW ranges from 100 to 150° C. In the above dry cleaning process (treatment), the product $((NH_4)_2SiF_6)$ formed on the main surface of the semiconductor wafer SW sublimes, for example, based on the following formula (2) to be removed. Further, the heat treatment heats the side and back surface of the semiconductor wafer SW to remove the product remaining on the parts of the side and back surface.

$$(NH_4)_2SiF_6(s) \rightarrow (NH_4)_2SiF_6(g) \quad \text{Formula (2)}$$

However, when a composition of the product formed over the semiconductor wafer SW in the above dry cleaning process slightly deviates from the composition of $(NH_4)_2SiF_6$, the heat treatment at a temperature of 100 to 150° C. makes it difficult for the reaction of the formula (2) to be caused, thus failing to completely remove the product, so that a small amount of product can remain on the main surface of the semiconductor wafer SW. As mentioned above, the small amount of product remains on the main surface of the semiconductor wafer SW, which then leads to variations in electric resistance of a metal silicide layer (for example, a nickel silicide layer) formed on the main surface of the semiconductor wafer SW. In a next step, heat treatment is further applied to the semiconductor wafer SW at a temperature higher than 150° C. thereby to remove the small amount of product remaining on the main surface of the semiconductor wafer SW.

Then, the semiconductor wafer SW is transferred under vacuum from the chamber 27 for the dry cleaning process to the chamber 25 (or chamber 26) for the heat treatment via the first transfer chamber 21a by the robot 32a for transfer, and then put on a stage included in the chamber 25 (or the chamber 26) (in the process P3 shown in FIG. 8). The semiconductor wafer SW is mounted on the stage of the chamber 25 (or chamber 26), and heated at a predetermined temperature thereby to sublime and remove the product remaining on the main surface of the semiconductor wafer SW without subliming the product at a temperature of 100 to 150° C. The temperature of the main surface of the semiconductor wafer SW is considered to be in an appropriate range of, for example, 150 to 400° C. (it is apparent that the invention is not limited to this range, depending on other conditions). The range of the temperature appropriate for mass production is preferably in a range of 165 to 350° C., and further most preferably in a range of 180 to 220° C., that is, in a range with 200° C. set as a center value.

Then, the semiconductor wafer SW is transferred under vacuum from the chamber 25 (or chamber 26) for the heating process to the chamber 30 (or chamber 31) for cooling and delivery via the first transfer chamber 21a by the robot 32a for transfer, and mounted on the stage included in the chamber 30 (or chamber 31) (in the process P4 shown in FIG. 8). The semiconductor wafer SW is mounted on the stage of the chamber 30 (or chamber 31) and cooled.

Then, the semiconductor wafer SW is transferred under vacuum from the chamber 30 (or chamber 31) for cooling and delivery by the robot 32b for transfer to the chamber 28 for deposition of the alloy film 11 via the second transfer chamber 21b (in the process P5 shown in FIG. 8). After setting the inside of the chamber 28 to a predetermined degree of vacuum, for example, about $1.33 \times 10^{-6}$ Pa by the exhaust mechanism, the semiconductor wafer SW is heated to a predetermined temperature, and the alloy film 11 (preferably, a Ni—Pt alloy film) is deposited on the main surface of the semiconductor wafer SW by the sputtering method, while introducing Ar gas into the chamber 28 at a predetermined flow rate. The deposition step of the alloy film 11 corresponds to the above step S1 (step S1 shown in FIG. 6). The thickness (deposition thickness) of the alloy film 11 is, for example, 25 nm. The sputtering conditions in deposition are, for example, a deposition temperature of 25° C., and an Ar gas flow rate of 35 sccm.

Then, the semiconductor wafer SW is transferred under vacuum from the chamber 28 for deposition of the alloy film 11 to the chamber 29 for deposition of the barrier film 12 via the second transfer chamber 21b by the robot 32b for transfer (in the process P6 shown in FIG. 8). After setting the inside of the chamber 29 to a predetermined degree of vacuum by the exhaust mechanism, the semiconductor wafer SW is heated to a predetermined temperature, and the barrier film 12 of a titanium nitride film or the like is deposited on the main surface of the semiconductor wafer SW by the sputtering method, while introducing Ar gas and $N_2$ gas into the chamber 29 at a predetermined flow rate. The deposition step of the barrier film 12 corresponds to the above step S2 (step S2 shown in FIG. 6). The thickness (deposition thickness) of the barrier film 12 is, for example, 15 nm. The sputtering conditions in deposition are, for example, a deposition temperature of 40° C., an Ar gas flow rate of 28 sccm, and a nitride gas flow rate of 80 sccm.

Then, the semiconductor wafer SW is transferred under vacuum from the chamber 29 for deposition of the barrier 12 to the chamber 30 (or chamber 31) for cooling and delivery via the second transfer chamber 21b by the robot 32b for transfer (in the process P7 shown in FIG. 8).

Then, the semiconductor wafer SW is transferred out from the chamber 30 (or chamber 31) for cooling and delivery to either of the load lock chambers 23 and 24 by the robot 32a for transfer. Subsequently, the semiconductor wafer SW is returned to any one of the hoops 34 from the load lock chamber 23 or 24 via the wafer delivery device 33 by the robot 36 for transfer (in the process P8 shown in FIG. 8).

In the dry cleaning process, a remote plasma generator 27d activates Ar gas (note that Ar gas is often used as gas for activation of plasma, but any other inert gas or a combined gas thereof may be used) with reducing gas, for example, $NF_3$ gas and $NH_3$ gas added thereto to generate plasma. The plasma is introduced into the chamber 27 to remove the natural oxidation film by the reducing reaction. In other embodiments, the reducing gas, such as HF gas and $NH_3$ gas, or $NF_3$ gas and $NH_3$ gas, may be introduced into the chamber 27 without plasma, thus removing the natural oxidation film by the reducing reaction.

The deposition device is not limited to the remote plasma device, and the use of a normal plasma device is not problematic as long as other properties of the plasma device have no problems. The remote plasma has an advantage in no damage to the substrate.

In processing using plasma, the invention is not limited to the above combination of gases, and even combinations of other gases that generate respective radicals or reaction species of nitrogen, hydrogen, and fluorine (including compound radicals thereof) may be used as long as they are not particularly harmful to this process. In other words, a mixture gas atmosphere of nitrogen, hydrogen, and fluorine radical generation gas (containing the mixture), plasma excitation gas, and the other additional gas and the like may be used appropriately.

Moreover, the reaction gas, such as the reducing gas, is not limited to the above-mentioned gases, and any other gas for generating reaction species which reacts with an oxide film on a silicon surface at a relatively low temperature to vaporize may be used.

In this way, after forming the alloy film 11 and the barrier film 12, a first heat treatment (annealing process) is applied to the semiconductor substrate 1 (in step S3 shown in FIG. 6). The first heat treatment in step S3 can be performed under ordinary pressure in an atmosphere of inert gas (for example, argon (Ar) gas, neon (Ne) gas, or helium (He) gas), or nitrogen ($N_2$) gas, or a mixture gas thereof. For example, the first heat treatment can be carried out by, for example, a rapid thermal anneal (RTA) method.

Figure 11:
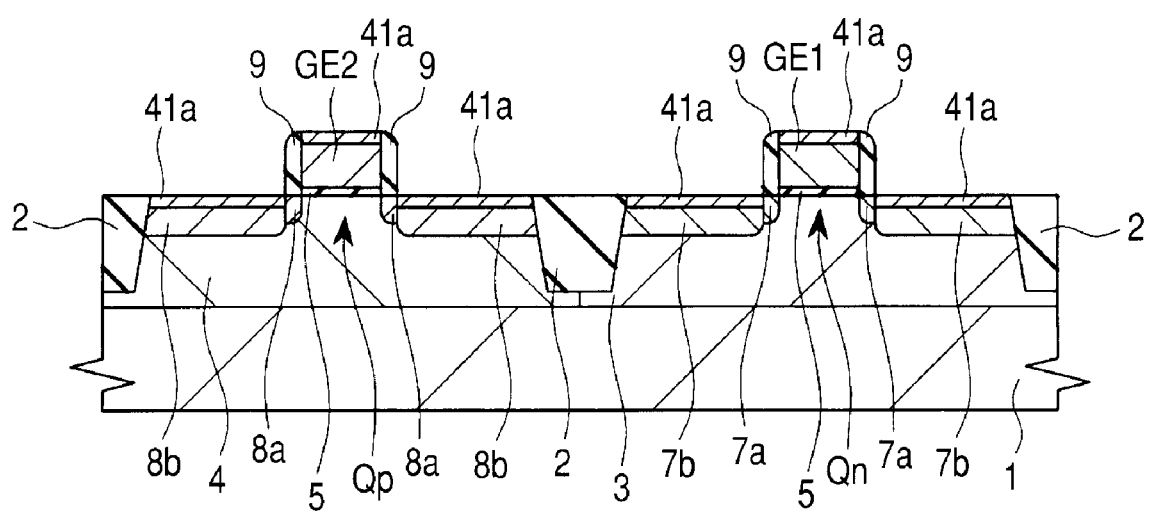
FIG. 11 is a cross-sectional view of a main part of the semiconductor device in the manufacturing procedure thereof, following the step shown in FIG. 5.

As shown in FIG. 11, by the first heat treatment in step S3, the polysilicon film forming the gate electrodes GE1 and GE2 selectively reacts with the alloy film 11, and the single-crystal silicon forming the $n^+$-type semiconductor region 7b and the $p^+$-type semiconductor region 8b selectively reacts with the alloy film thereby to form metal silicide layers 41a which are metal-semiconductor reaction layers. An upper part (upper layer part) of each of the gate electrodes GE1 and GE2, the $n^+$-type semiconductor region 7b, and the $p^+$-type semiconductor region 8b reacts with the alloy film 11 to form the metal silicide layer 41a. Thus, the metal silicide layer 41a is formed on each surface (upper layer part) of each of the gate electrodes GE1 and GE2, the $n^+$-type semiconductor region 7b, and the $p^+$-type semiconductor region 8b.

Thus, the metal silicide layer 41a comprised of silicide containing nickel and the first metal element M is formed by selective reaction between the alloy film 11 and each of the gate electrodes GE1 and GE2, the $n^+$-type semiconductor region 7b, and the $p^+$-type semiconductor region 8b (forming Si) by the first heat treatment in step S3. However, on the stage after the first heat treatment in step S3, the metal silicide layer 41a is in an $(Ni_{1-y}M_y)_2Si$ phase (where $0<y<1$). Note the "M" of a chemical formula of $(Ni_{1-y}M_y)_2Si$ is the first metal element M. When the alloy film 11 is a Ni—Pt alloy film (that is, when the first metal element M is Pt), the metal silicide layer 41a is comprised of a platinum-added nickel silicide layer in the $(Ni_{1-y}Pt_y)_2Si$ phase (where 0<y<1). Thus, the first heat treatment is performed in step S3 preferably at such a heat treatment temperature that forms the metal silicide layer 41a in the $(Ni_{1-y}M_y)_2Si$ phase without making a $Ni_{1-y}M_ySi$ phase.

By the first heat treatment in step S3, the Ni element and the first metal element M of the alloy film 11 are diffused into the n$^+$-type semiconductor region 7b, the p$^+$-type semiconductor region 8b, and the gate electrodes GE1 and GE2, which forms the metal silicide layer 41a. In step S3, the first heat treatment is performed at a heat treatment temperature where a diffusion coefficient of the first metal element M into the n$^+$-type semiconductor region 7b, the p$^+$-type semiconductor region 8b, and the gate electrodes GE1 and GE2 is larger than that of Ni into the regions 7b, 8b, and the gate electrodes GE1 and GE2. And, the first heat treatment is performed such that unreacted part of the alloy film 11 (corresponding to an unreacted part 11a to be described later) remains on the metal silicide layer 41a. This corresponds to the first and second conditions to be described later, and a detailed description thereof will be described below. The rate of the first metal element M included in metal elements (Ni and first metal element M) forming the thus-formed metal silicide layer 41a is larger than that of the first metal element M in the alloy metal film 11. This will be described later in detail.

The barrier film 12 is a film that is less prone to react with the alloy film 11. The barrier film 12 is desirably a film that does not react with the alloy film 11 even after the first heat treatment in step S3, and is preferably a titanium nitride (TiN) film or a titanium (Ti) film from this point of view. In the invention, since the alloy film 11 is formed in a thickness much larger than the thickness (corresponding to a thickness tn3 of a reaction part 11b to be described later) of an alloy film to react with the n$^+$-type semiconductor region 7b and the p$^+$-type semiconductor region 8b, the barrier film 12 as an oxidation prevention film may be omitted.

Then, the barrier film 12 and the unreacted part of the alloy film 11 (that is, the parts of the alloy film 11 not reacting with the gate electrode GE1 or GE2, the n$^+$-type semiconductor region 7b, or the p$^+$-type semiconductor region 7b in the first heat treatment process of step S3) are removed by the wet cleaning process (in step S4 shown in FIG. 6). At this time, the non-reacted parts of the alloy film 11 (that is, the parts of the alloy film 11 that do not react with the gate electrode GE1 or GE2, the n$^+$-type semiconductor region 7b, or the p$^+$-type semiconductor region 7b) are removed from the metal silicide layers 41a, while leaving the metal silicide layers 41a on the surfaces of the gate electrodes GE1 and GE2, the n$^+$-type semiconductor region 7b, and the p$^+$-type semiconductor region 8b. The wet cleaning process in step S4 can be performed by wet cleaning using sulfuric acid, or by wet cleaning using a mixture of sulfuric acid and a hydrogen peroxide solution. FIG. 11 shows the stage where the barrier film 12 and the unreacted parts of the alloy film 11 are removed by the wet cleaning process in step S4.

Then, the second heat treatment (anneal treatment) is applied to the semiconductor substrate 1 (in step S5 shown in FIG. 6). The second heat treatment in step S5 can be performed under ordinary pressure in an atmosphere of inert gas (for example, argon (Ar) gas, neon (Ne) gas, or helium (He) gas) or nitrogen (N$_2$) gas or a mixture gas thereof. For example, the second heat treatment can be carried out by, for example, the rapid thermal anneal (RTA) method. The second heat treatment in step S5 is performed at a heat treatment temperature higher than that of the first heat treatment in step S3 described above.

Figure 12:
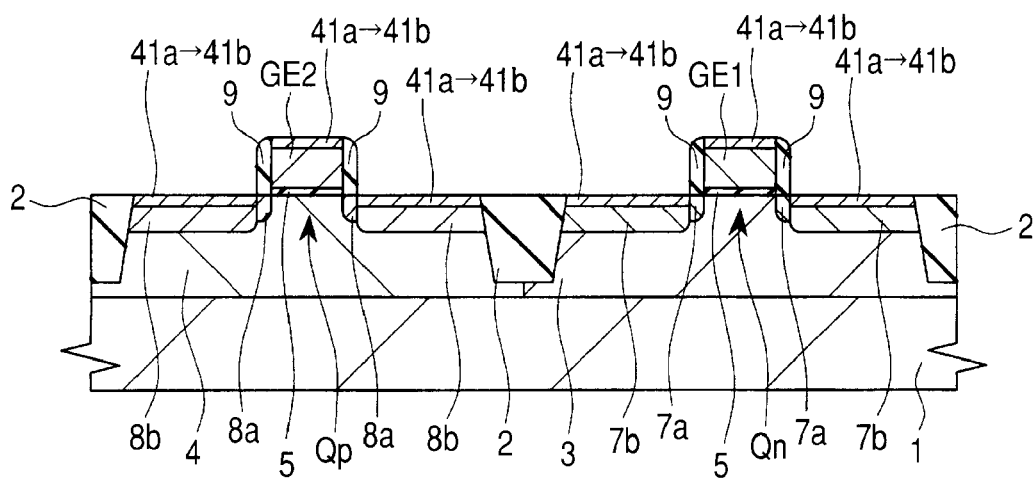
FIG. 12 is a cross-sectional view of a main part of the semiconductor device in the manufacturing procedure thereof, following the step shown in FIG. 11.

The second heat treatment in step S5 is performed for decreasing a resistance of the metal silicide layer 41a and stabilizing the silicide layer 41a. By the second heat treatment in step S5, as shown in FIG. 12, the metal silicide layer 41a in the $(Ni_{1-y}M_y)_2Si$ phase formed by the first heat treatment in step S3 is changed into the metal silicide layer 41b in a $Ni_{1-y}M_ySi$ phase. Thus, the stable metal silicide layer 41b is formed in which a ratio of metal elements (including Ni with the first metal element M added thereto) to Si is very close to a stoichiometric proportion of 1:1.

In other words, the metal silicide layers 41a in the $(Ni_{1-y}M_y)_2Si$ phase further react with silicon of the gate electrodes GE1 and GE2, the n$^+$-type semiconductor region 7b, and the p$^+$-type semiconductor region 8b by the second heat treatment in step S5, so that the metal silicide layer 41b having the low-resistance $Ni_{1-y}M_ySi$ phase which is more stable than the $(Ni_{1-y}M_y)_2Si$ phase is formed on the surfaces (upper layer parts) of the gate electrodes GE1 and GE2, the n$^+$-type semiconductor region 7b, and the p$^+$-type semiconductor region 8b. For this reason, the second heat treatment in step S5 needs to be performed at such a temperature that can change the metal silicide layer 41a in the $(Ni_{1-y}M_y)_2Si$ phase into the metal silicide layer 41b in the $Ni_{1-y}M_ySi$ phase. Thus, it is necessary to set the heat treatment temperature of the second heat treatment in step S5 higher than at least the heat treatment temperature of the first heat treatment in step S3. In order not to cause the metal silicide layer 41b to have a $Ni_{1-y}M_ySi_2$ phase with a higher resistance that that of the $Ni_{1-y}M_ySi$ phase, the second heat treatment in step S5 is preferably performed at such a heat treatment temperature that forms the metal silicide layer 41b in the $Ni_{1-y}M_ySi$ phase and not in the $Ni_{1-y}M_ySi_2$ phase.

The $Ni_{1-y}M_ySi$ phase has a resistivity lower than those of a $(Ni_{1-y}M_y)_2Si$ phase and a $Ni_{1-y}M_ySi_2$ phase, and the metal silicide layer 41b remains in the $Ni_{1-y}M_ySi$ phase having the low resistance also in steps following the step S5 (until the end of manufacturing of the semiconductor device). In the semiconductor device manufactured (for example, even in a state of a semiconductor chip obtained by dividing the semiconductor substrate 1 into pieces), the metal silicide layer 41b is still in the $Ni_{1-y}M_ySi$ phase having the low resistance.

The character "M" in the above-mentioned chemical formulas $(Ni_{1-y}M_y)_2Si$, $Ni_{1-y}M_{1-y}Si$, and $Ni_{1-y}M_ySi_2$ is the above first metal element M. When the metal film 11 is a Ni—Pt alloy film (that is, when the first metal element M is Pt), the metal silicide layer 41a formed by the first heat treatment in step S3 has the $(Ni_{1-y}Pt_y)_2Si$ phase. This layer is changed into the metal silicide layer 41b having the $Ni_{1-y}Pt_ySi$ phase by the second heat treatment in step S5. In this case, the $Ni_{1-y}Pt_ySi$ phase has a lower resistivity than those of the $(Ni_{1-y}Pt_y)_2Si$ phase and $Ni_{1-y}M_ySi_2$ phase. Also, in the processes after step S5 (until the manufacturing of the semiconductor device is completed), the metal silicide layer 41b maintains the low-resistant $Ni_{1-y}Pt_ySi$ phase. In the semiconductor device manufactured (for example, even in a state of a semiconductor chip obtained by dividing the semiconductor substrate 1 into pieces), the metal silicide layer 41b is still in the $Ni_{1-y}Pt_ySi$ phase having a low resistance. In this way, the metal silicide layers 41b in the $Ni_{1-y}M_ySi$ phase are formed on the surfaces (upper layer parts) of the n-channel MISFETQn GE1 and the source/drain region (n$^+$-type semiconductor region 7b), and the surfaces (upper layer parts) of the gate electrode GE2 of the p-channel MISFETQp and the source/drain region (p$^+$-type semiconductor region 8b).

Figure 13:
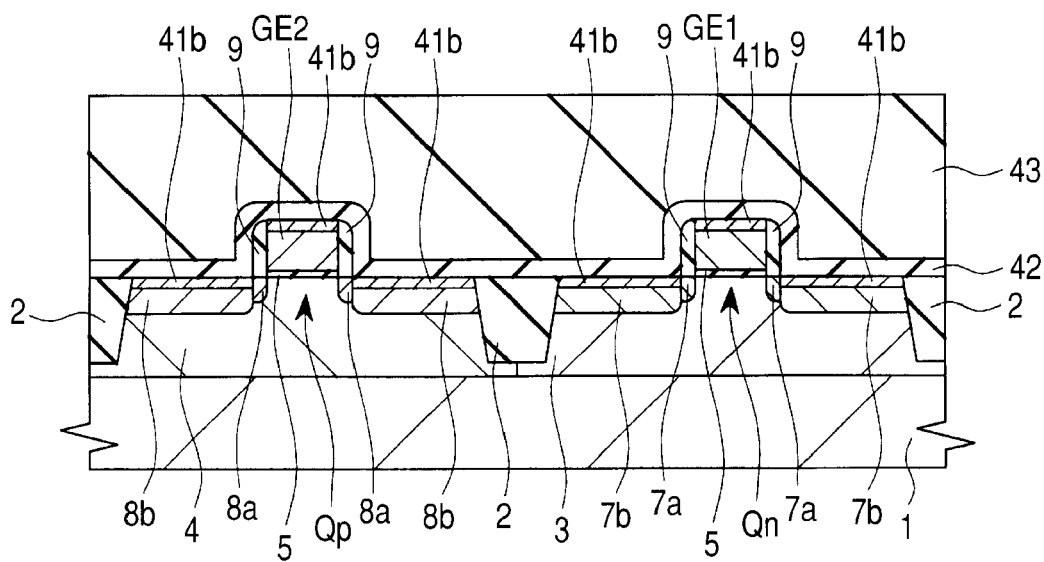
FIG. 13 is a cross-sectional view of a main part of the semiconductor device in the manufacturing procedure thereof, following the step shown in FIG. 12.

Then, as shown in FIG. 13, an insulating film 42 is formed over the main surface of the semiconductor substrate 1. That is, the insulating film (first insulating film) 42 is formed over the semiconductor substrate 1 including the metal silicide layer 41b so as to cover the gate electrodes GE1 and GE2, and the sidewalls 9. The insulating film 42 is comprised of, for example, a silicon nitride film, and can be formed by the plasma CVD method at a deposition temperature (temperature of the substrate) of about 450° C. The, an insulating film 43 which is thicker than the insulating film 42 is formed on the insulating film 42. The insulating film 43 is comprised of, for example, a silicon oxide film or the like. The insulating film 43 can be formed by the plasma CVD method at a deposition temperature of about 400° C. using a tetraethoxysilane or a tetra ethyl ortho silicate. Thus, an interlayer insulating film comprised of an insulating film 42 and an insulating film 43 is formed. Thereafter, the surface of the insulating film 43 is polished by a CMP method, resulting in planarized upper surface of the insulating film 43. Even when the insulating film 42 has a bumpy surface formed due to bumps on a base, the interlayer insulating film with a planarized surface can be obtained by polishing the surface of the insulating film 43 by the CMP method.

Figure 14:
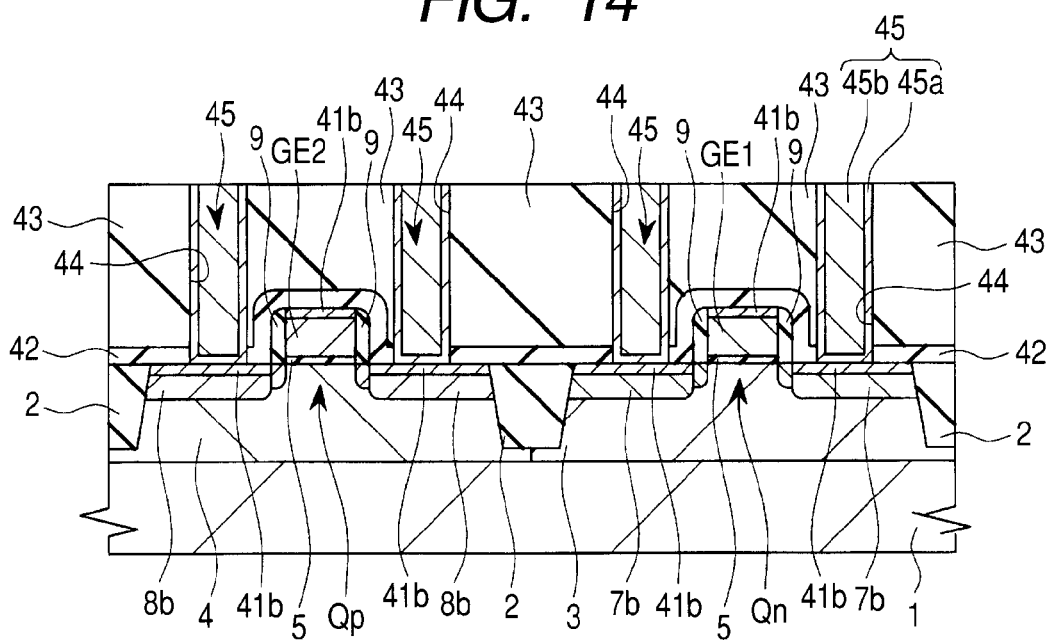
FIG. 14 is a cross-sectional view of a main part of the semiconductor device in the manufacturing procedure thereof, following the step shown in FIG. 13.

Then, as shown in FIG. 14, the insulating films 43 and 42 are dry-etched using a photoresist pattern (not shown) formed on the insulating film 43 as an etching mask thereby to form contact holes (through holes, or holes) 44 in the insulating films 42 and 43. At this time, first, the insulating film 43 is dry etched on conditions where the insulating film 43 is easily etched as compared to the insulating film 42, while the insulating film 42 serves as an etching stopper film, so that contact holes 44 are formed in the insulating film 43. Thereafter, the part of the insulating film 42 located at the bottom of each contact hole 44 is dry etched and removed on conditions where the insulating film 42 is easily etched as compared to the insulating film 43. At the bottoms of the contact holes 44, parts of the main surface of the semiconductor substrate 1, for example, parts of the metal silicide layers 41b on the surfaces of the n$^+$-type semiconductor region 7b and the p$^+$-type semiconductor region 8b, and parts of the metal silicide layers 41b on the surfaces of the gate electrodes GE1 and GE2, are exposed.

Then, conductive plugs (conductors for connection) 45 including tungsten (w) or the like are formed in the contact holes 44. In order to form the plug 45, a barrier conductive film 45a (for example, a titanium film, a titanium nitride film, or a lamination thereof) is formed on the insulating film 43 covering the inside of the contact hole 44 (bottom and side walls) by the plasma CVD method at a deposition temperature (temperature of the substrate) of about 450° C. Then, the main conductive film 45b formed of a tungsten film or the like is formed over the barrier conductive film 45a by the CVD method so as to fill the contact hole 44 therewith, and unnecessary parts of the main conductive film 45b and the barrier conductive film 45a on the insulating film 43 are removed by the CMP method or etch back method, so that the plugs 45 can be formed. The plug 45 formed on the gate electrode GE1 or GE2, the n$^+$-type semiconductor region 7b, or the p$^+$-type semiconductor region 8b is electrically coupled at its bottom to the metal silicide layer 41b on the surface of the gate electrode GE1 or GE2, the n$^+$-type semiconductor region 7b, or the p$^+$-type semiconductor region 8b.

Figure 15:
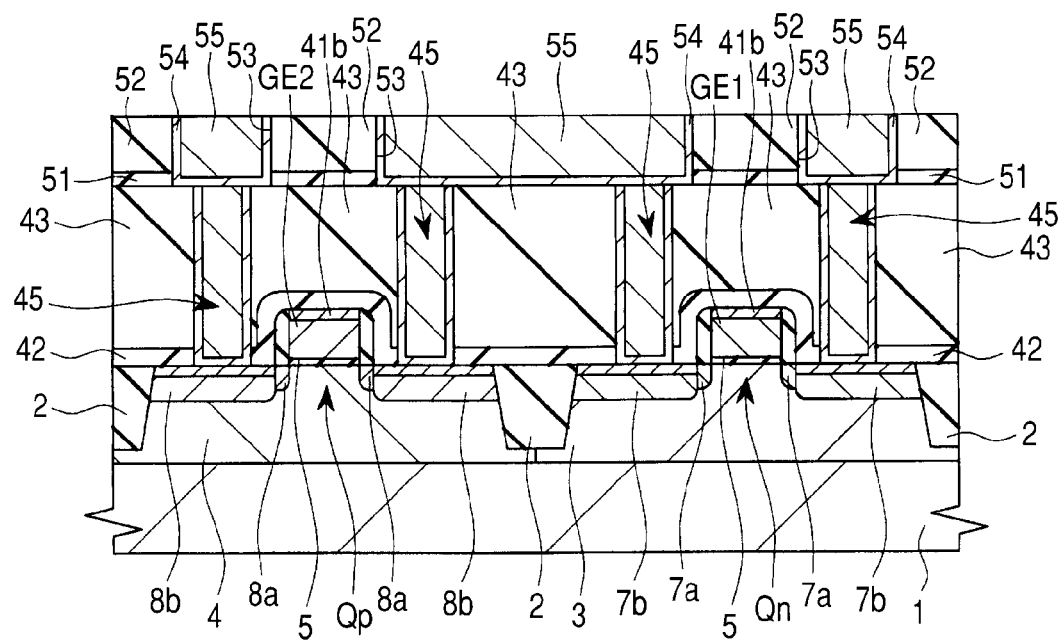
FIG. 15 is a cross-sectional view of a main part of the semiconductor device in the manufacturing procedure thereof, following the step shown in FIG. 14.
Figure 16:
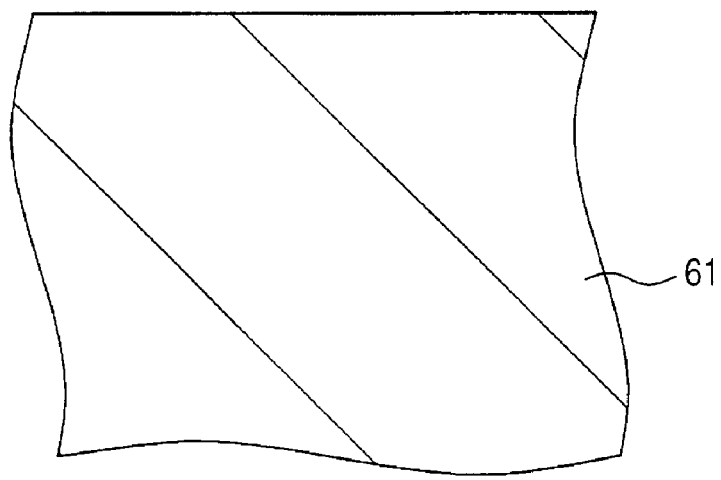
FIG. 16 is a cross-sectional view of a main part of the semiconductor device in the manufacturing procedure thereof (on the stage before formation of an alloy film) in the embodiment of the invention.

Then, as shown in FIG. 15, a stopper insulating film (an insulating film for an etching stopper) 51 and an insulating film 52 for formation of wiring are formed in turn over the insulating film 43 with the plugs 45 embedded therein. The stopper insulating film 51 is a film serving as an etching stopper in processing slots in the insulating film 52. The stopper insulating film 51 in use includes a material having adequate etching selectivity with respect to the insulating film 52. The stopper insulating film 51 can be formed, for example, of a silicon nitride film by the plasma CVD method. The insulating film 52 can be formed, for example, of a silicon oxide film formed by the plasma CVD method. It is noted that the stopper insulating film 51 and the insulating film 52 are provided with a first layer wiring to be described later.

Then, the first layer wiring is formed by a single-damascene method. First, wiring slots 53 are formed in respective predetermined areas of the insulating film 52 and the stopper insulating film 51 by the dry etching using a resist pattern (not shown) as a mask. Then, a conductive barrier film (barrier metal film) 54 is formed over the main surface of the semiconductor substrate 1 (that is, on the surface of the insulating film 52 containing the bottom and side wall of each wiring slot). The conductive barrier film 54 in use can be, for example, a titanium nitride film, a tantalum film, or a tantalum nitride film. Subsequently, a copper seed layer is formed on the conductive barrier film 54 by the CVD method or sputtering method, and a copper plating film is formed on the seed layer using electrolytic plating or the like. The inside of the wiring slot 53 is filled with a copper plating film. The copper plating film, the seed layer, and the barrier metal film 54 located in areas other than the wiring slots 53 are removed by the CMP method thereby to form the first-layer wiring 55 containing copper as a principal conductive material. The wirings 55 are electrically coupled to the n$^+$-type semiconductor region 7b and the p$^+$-type semiconductor region 8b, and the gate electrodes GE1 and GE2, and the like for the source or drain of the n-channel MISFETQn and the p-channel MISFETQp via the plugs 45. Thereafter, wirings of a second or later layer are formed by a dual damascene method. Here, the wirings are not shown and a description thereof will be omitted.

Now, the first heat treatment in step S3 and the second heat treatment in step S5 will be further described in detail below.

Figure 17:
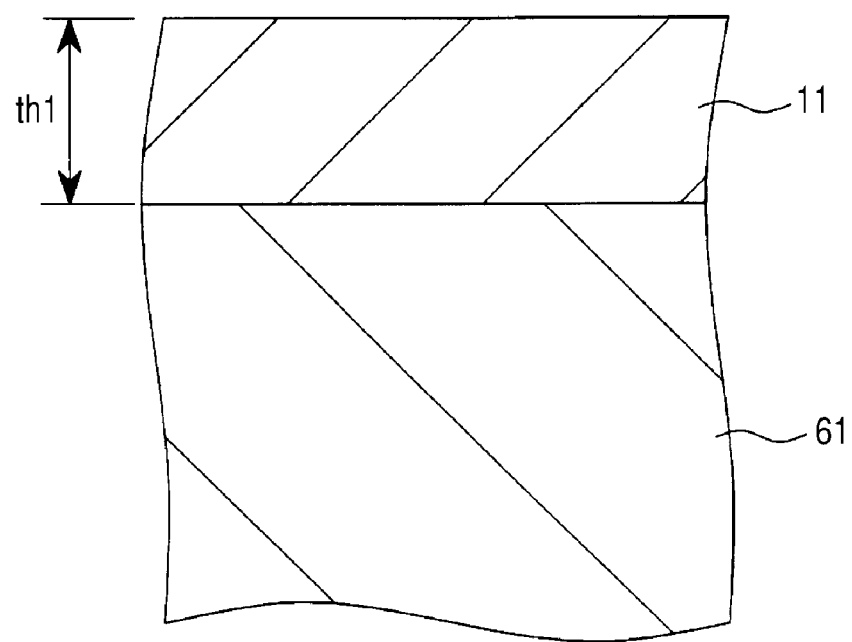
FIG. 17 is a cross-sectional view of a main part of the semiconductor device in the manufacturing procedure thereof (on the stage where the alloy film is formed) in the embodiment of the invention.
Figure 18:
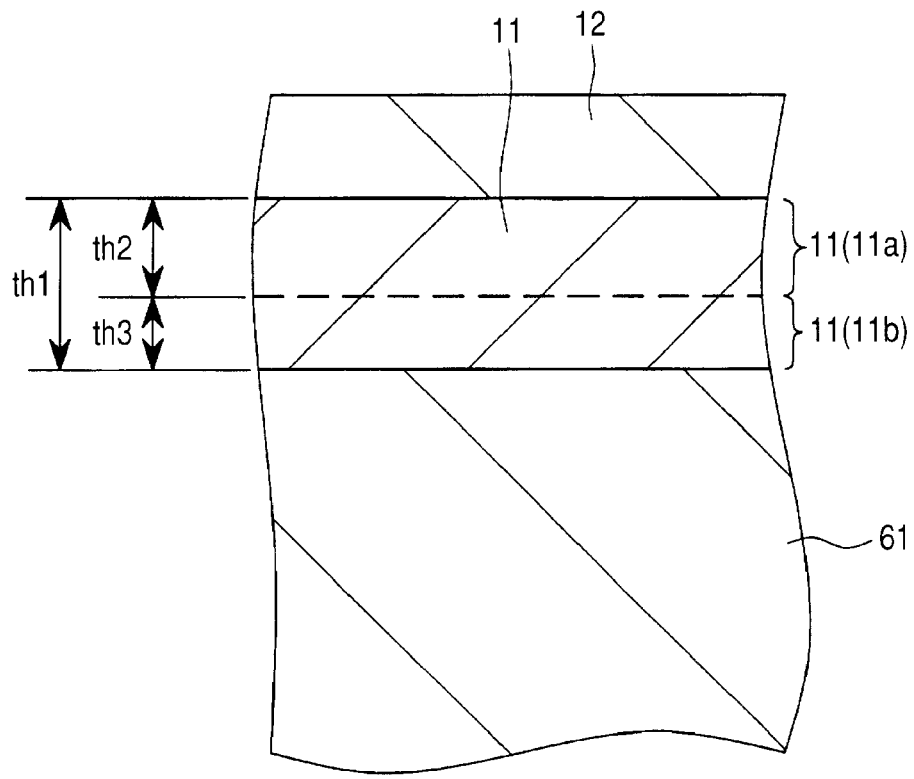
FIG. 18 is a cross-sectional view of a main part of the semiconductor device in the manufacturing procedure thereof (on the stage where a barrier film is formed) in the embodiment of the invention.
Figure 19:
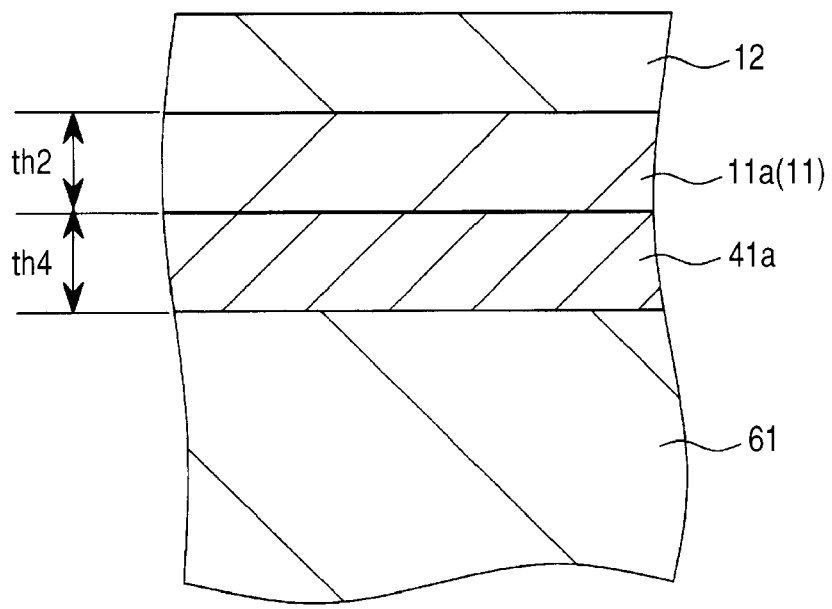
FIG. 19 is a cross-sectional view of a main part of the semiconductor device in the manufacturing procedure thereof (on the stage where a first heat treatment is performed) in the embodiment of the invention.
Figure 20:
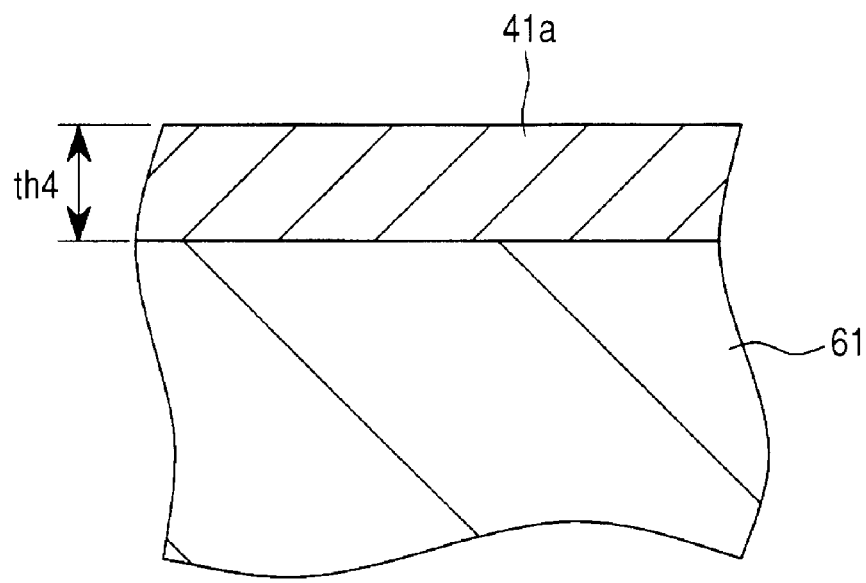
FIG. 20 is a cross-sectional view of a main part of the semiconductor device in the manufacturing procedure thereof (on the stage where the barrier film and an unreacted part of the alloy film are removed) in the embodiment of the invention.
Figure 21:
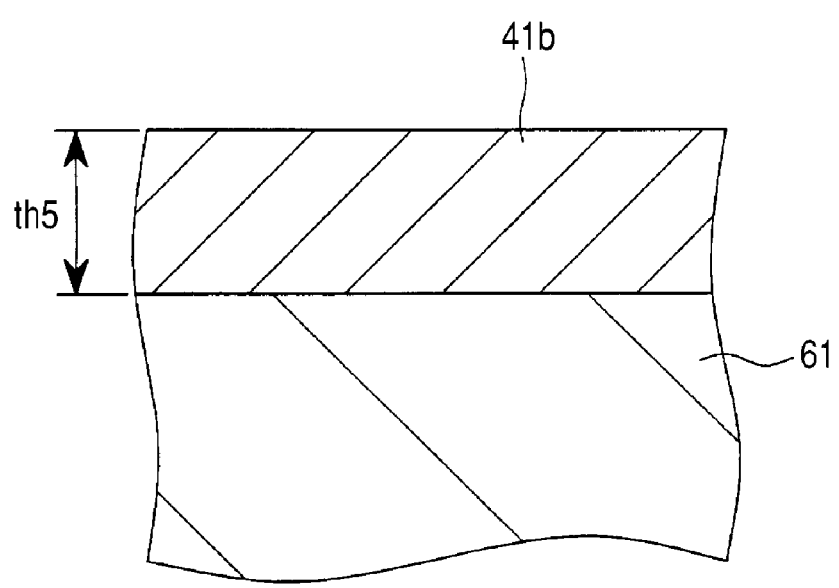
FIG. 21 is a cross-sectional view of a main part of the semiconductor device in the manufacturing procedure thereof (on the stage where a second heat treatment is performed) in the embodiment of the invention.
Figure 22:
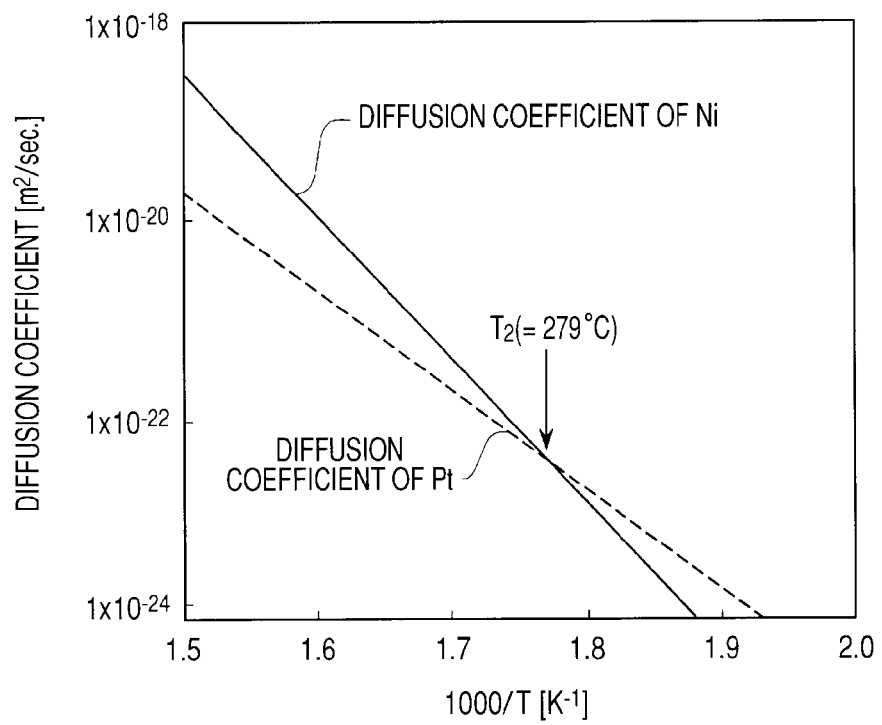
FIG. 22 is a graph showing diffusion coefficients of Ni and Pt in a Si region.

FIGS. 16 to 21 show cross-sectional views of main parts of the semiconductor device in the manufacturing process thereof on the respective stages of steps S1, S2, S3, S4, and S5, each showing an area around an upper part of a silicon (Si) region 61. FIG. 22 is a graph showing diffusion coefficients of Ni and Pt in a Si region (silicon region), while showing Arrhenium plots of the diffusion coefficients of Ni and Pt in the Si region. The longitudinal axis in the graph of FIG. 22 corresponds to the diffusion coefficient of Ni or Pt in the Si region, and the horizontal axis in FIG. 22 corresponds a value obtained by multiplying the inverse of an absolute temperature T by 1000 times. Among FIGS. 16 to 21, FIG. 16 shows the stage directly before the alloy film 11 is formed in step S1. FIG. 17 shows the stage where the alloy film 11 is formed by performing the process in step S1 (the stage before formation of the barrier film 12 in step S2). FIG. 18 shows the stage where the barrier film 12 is formed by performing the process in step S2 (the stage before formation of the first heat treatment in step S3). FIG. 19 shows the stage where the first heat treatment is performed in step S3 (on the stage before a removing step S4 of removing the barrier film 12 and an unreacted part of the alloy film 11). FIG. 20 shows the stage of step S4 where the removing step of the barrier film 12 and the unreacted part of the alloy film 11 is performed (on the stage before a second heat treatment of step S5 is performed). FIG. 21 shows the stage of step S5 where the second heat treatment is performed (the stage before the formation of the insulating film 42).

The silicon region 61 shown in FIGS. 16 to 21 corresponds to any one of the gate electrode GE1 and GE2, the n+-type semiconductor region 7b and the p+-type semiconductor region 8b. This is because any one of the gate electrode GE1 and GE2, the n+-type semiconductor region 7b, and the p+-type semiconductor region 8b is comprised of a silicon region (specifically, while each of the gate electrodes GE1 and GE2 is formed of a polysilicon film, and each of the n+-type semiconductor region 7b and the p+-type semiconductor region 8b is formed of a single crystal silicon region). When the silicon region 61 is the gate electrode GE1 or gate electrode GE2, the silicon region 61 is comprised of polycrystal silicon. When the silicon region 61 is formed of the n+-type semiconductor region 7b or the p+-type semiconductor region 8b, the silicon region 61 is comprised of single crystal silicon.

In order to form the metal silicide as mentioned above, as shown in FIGS. 16 and 17, the alloy film 11 is formed over the main surface (entire surface) of the semiconductor substrate 1 including the silicon region 61 (that is, the gate electrodes GE1 and GE2, and the n+-type semiconductor region 7b, and the p+-type semiconductor region 8b) in step S1. The formation thickness (deposition thickness) of the alloy film 11 at the silicon region 61 is a thickness (film thickness, or first thickness) tn1. The thickness tn1 corresponds to the thickness of the alloy film 11 on the silicon region 61 before the first heat treatment in step S3. The formed alloy film 11 is an $Ni_{1-x}M_x$ alloy film (where 0<x<1) in which the atomic ratio of Ni to the first metal element M is 1−x:x.

Then, as shown in FIG. 18, in step S2, the barrier film 12 is formed on the alloy film 11. Thereafter, when the first heat treatment is applied in step S3, as shown in FIG. 19, the silicon region 61 reacts with the alloy film 11 thereby to form the metal silicide layer 41a in the $(Ni_{1-y}Pt_y)_2Si$ phase (where 0<y<1) on the surface (upper layer part) of the silicon region 61. In this embodiment, the first heat treatment is performed in step S3 such that the unreacted part 11a of the alloy film 11 remains on the metal silicide layer 41a without causing the entire alloy film 11 on the silicon region 61 to react with the silicon region 61. The unreacted part 11a corresponds to a part not reacted with the silicon region 61 by the first heat treatment in step S3, in the alloy film 11 positioned above the silicon region 61 before the first heat treatment in step S3.

The thickness of the unreacted part 11a still remaining at the silicon region 61 after the first heat treatment in step S3 (before the step of removing the barrier film 12 and the unreacted alloy film 11 in step S4) in the alloy film 11 positioned on the silicon region 61 is a thickness (film thickness, or third thickness) tn2. The thickness of the formed metal silicide layer 41a is a thickness tn4.

For easy understanding, FIG. 18 illustrates the unreacted part 11a and a reacted part 11b of the alloy film divided into by a dummy line indicated by a dotted line. The reacted part 11b corresponds to a part with the metal silicide layer 41a formed in reaction with the silicon region 61 by the first heat treatment in step S3, among the alloy film 11 positioned above the silicon region 61 before the first heat treatment in step S3. Thus, a combination of the reacted part 11b and the unreacted part 11a corresponds to the alloy film 11 positioned above the silicon region 61 before the first heat treatment in step S3. The alloy film 11 is actually a single layer with a lower layer part of the alloy film 11 as the reacted part 11b and an upper layer part of the alloy film 11 as the unreacted part 11a. The reacted part 11b and the unreacted part 11a substantially correspond to two areas of the alloy film 11 substantially divided into in the form of layer (the lower area corresponding to the reacted part 11b, and the upper area corresponding to the unreacted part 11a). When the thickness of the reacted part 11b is a thickness (second thickness) tn3, the sum of the thickness tn2 of the unreacted part 11a and the thickness tn3 of the reacted part 11b corresponds to the thickness tn1 of the alloy film 11 (that is, tn1=tn2+tn3).

In this embodiment, the first heat treatment in step S3 is performed such that the unreacted part 11a of the alloy film 11 remains on the metal silicide layer 41a in the form of layer. Thus, the thickness tn3 of the reacted part 11b of the alloy film 11 is smaller than the thickness tn1 of the alloy film 11 on the silicon region 61 before the first heat treatment (tn3<tn1), and the thickness tn2 of the unreacted part 11a of the alloy film 11 remaining on the metal silicide layer 41a after the first heat treatment is larger than zero (tn2>0).

In formation of cobalt silicide, silicon (S) is a diffusion species, and thus movement of Si into a Co film forms the cobalt silicide. In contrast, in use of a $Ni_{1-x}M_x$ alloy film in this embodiment, Ni (nickel) and the first metal element M are diffusion species, and the movement of the Ni (nickel) and first metal element M into the silicon region 61 side forms the metal silicide 41a.

Then, as shown in FIG. 20, the barrier film 12 and the unreacted part of the alloy film 11 (that is, the part of the alloy film 11 not reacted with the silicon region 61 in the first heat treatment of step S3) are removed in step S4. At this time, the unreacted part 11a on the metal silicide layer 41a is also removed. Therefore, the second heat treatment is performed in step S5 to cause the metal silicide layer 41a in the $(Ni_{1-y}M_y)_2Si$ phase to further react with the silicon region 61, so that the metal silicide layer 41b in the $Ni_{1-y}M_ySi$ phase is formed on the surface (upper layer part) of the silicon region 61 as shown in FIG. 21. The thickness of the formed metal silicide layer 41b is a thickness tn5.

In this embodiment, the first heat treatment in step S3 has the features to satisfy the following two conditions (the first condition and the second condition).

That is, as the first condition, the first heat treatment is performed in step S3 at such a heat treatment temperature $T_1$ that a diffusion coefficient of the first metal element M (preferably, Pt) into the silicon region 61 (the gate electrodes GE1 and GE2, the n+-type semiconductor region 7b, and the p+-type semiconductor region 8b) becomes larger than that of nickel (Ni) into the silicon region 61 (the gate electrodes GE1 and GE2, the n+-type semiconductor region 7b, and the p+-type semiconductor region 8b). In other words, in making a comparison of a diffusion coefficient into the silicon region 61 (the gate electrodes GE1 and GE2, the n+-type semiconductor region 7b, and the p+-type semiconductor region 8b) between nickel (Ni) and the first metal element M contained in the alloy film 11 at the heat treatment temperature $T_1$ of the first heat treatment in step S3, the diffusion coefficient of the first metal element M (preferably, Pt) is larger than that of nickel (Ni). In this way, the first metal element M (preferably, Pt) is more easily diffused from the alloy film 11 into the silicon region 61 than nickel (Ni) in the first heat treatment in step S3.

FIG. 22 shows a graph of dependence of diffusion coefficients of Ni and Pt in the Si region (silicon region) on temperature. As shown in the graph of FIG. 22, both diffusion coefficients of Ni and of Pt increase with increasing temperature, but the Ni and Pt elements differ from each other in temperature dependence of the diffusion coefficient. Thus, the graph of FIG. 22 shows that at a temperature higher than the temperature $T_2$, the diffusion coefficient of Ni in the Si region is larger than that of Pt in the Si region, whereby Ni is more easily diffused into the Si region than Pt. At the temperature $T_2$, the diffusion coefficient of Ni into the Si region is the same as that of Pt into the Si region, so that the diffusivity of Ni into the Si region is the same as that of Pt. At a temperature lower than the temperature $T_2$, the diffusion coefficient of Pt into the Si region is larger than that of Ni into the Si region, whereby Pt is more easily diffused into the Si region than Ni. The temperature $T_2$ is 279° C. (that is, $T_2$=279° C.).

Thus, when the first metal element M is Pt (platinum), that is, when the alloy film 11 is an Ni—Pt alloy film ($Ni_{1-x}Pt_x$ alloy film), the heat treatment temperature $T_1$ of the first heat treatment in step S3 is set lower than the above-mentioned $T_2$ (that is, $T_1<T_2$) in order to satisfy the first condition. Specifically, the heat treatment temperature $T_1$ of the first heat treatment in step S3 is less than 279° C. (that is, $T_1<279°$ C.). When the heat treatment temperature $T_1$ of the first heat treatment in step S3 is lower than the above temperature $T_2$ ($T_1<T_2$, specifically, $T_1<279°$ C.), the diffusion coefficient of Pt (platinum) into the silicon region 61 becomes larger than that of nickel (Ni) into the silicon region 61 at the heat treatment temperature $T_1$ of the first heat treatment in step S3. Thus, in the first heat treatment at step S3, Pt (platinum) is more easily diffused than Ni (nickel) from the alloy film 11 into the silicon region 61 (the gate electrodes GE1 and GE2, the $n^+$-type semiconductor region 7b, and the $p^+$-type semiconductor region 8b).

Therefore, in order to satisfy the first condition, it is necessary to make the thermal treatment temperature $T_1$ of the first heat treatment lower than the temperature $T_3$ (for the first metal element M of Pt, when $T_3$=$T_2$) at which the diffusion coefficient of nickel (Ni) into the silicon region 61 is identical to the diffusion coefficient of the first metal element M into the silicon region 61.

As the second condition for the first heat treatment in step S3, the first heat treatment in step S3 is performed such that the unreacted part 11a of the alloy film 11 remains on the metal silicide layer 41a (that is, tn1>tn2>0).

That is, in the first heat treatment in step S3, the entire part of the alloy film 11 positioned above the silicon region 61 is not reacted with the silicon region 61, but only a part of the alloy film 11 positioned above the silicon region 61 is reacted with the silicon region 61. In other words, in the first heat treatment at step S3, the reaction rate R1 of the alloy film 11 to the silicon region 61 is less than 100%. Thus, the upper layer part of the alloy film 11 positioned above the silicon region 61 (the gate electrodes GE1 and GE2, the $n^+$-type semiconductor region 7b, and the $p^+$-type semiconductor region 8b) remains on the metal silicide layer 41a as the unreacted part 11a as it is even after the first heat treatment in step S3. In this way, the first heat treatment in step S3 leaves the unreacted part 11a of the alloy film 11 on the metal silicide layer 41a.

The reaction rate R1 of reaction between the alloy film 11 and the silicon region 61 corresponds to the rate of the part (that is, reacted part 11b) having the metal silicide layer 41a formed therein by reaction with the silicon region 61 by the first heat treatment in step S3 in the alloy film 11 positioned above the silicon region 61. Thus, the reaction rate R1 of reaction between the alloy film 11 and the silicon region 61 corresponds to the thickness of the alloy film 11 consumed for forming the metal film 41a in the first heat treatment in step S3, that is, the thickness tn2 of the reacted part 11b, with respect to the thickness tn1 of the alloy film 11 before the first heat treatment in step S3. The reaction rate R1 of reaction between the alloy film 11 and the silicon region 61 can be represented by the formula of R1=tn3/tn1, that is, R1=(tn1−tn2)/tn1. In the case of expressing the rate in percentage, the reaction rate R1 can be represented by the formula of R1=tn3×100/tn1[%], that is, R1=(tn1−tn2)×100/tn1[%].

In the first heat treatment in step S3, the necessary reason for satisfying both first condition and second condition will be described below.

In the first heat treatment in step S3, the Ni element and the first metal element M forming the alloy film 11 are diffused from the alloy film 11 into the silicon region 61 thereby to form the metal silicide layer 41a. When the first heat treatment satisfies the first condition, the first metal element M (preferably, Pt) is more easily diffused into the silicon region 61 than Ni.

When the ease of diffusion of Ni into the silicon region 61 is the same as that of the first metal element M in the first heat treatment not satisfying the first condition, an atomic number ratio of the Ni element to the first metal element M diffused from the alloy film 11 into the silicon region 61 maintains an original atomic number ratio of the Ni element to the first metal element M forming the alloy film 11. Further, an atomic number ratio of the Ni element to the first metal element M in the metal silicide layer 41a maintains the original atomic number ratio of the Ni element to the first metal element M forming the alloy film 11.

In contrast, in this embodiment, the first heat treatment is performed so as to satisfy the first condition and the second condition. Since the first metal element M is more easily diffused into the silicon region 61 than the Ni element in the first heat treatment, the atomic number ratio of the Ni element to the first metal element M diffused from the alloy film 11 into the silicon region 61 is one in which the rate of the first metal element M is increased as compared to the atomic number ratio of the Ni element to the first metal element M forming the alloy film 11. Thus, the atomic number ratio of the Ni element to the first metal element M in the metal silicide layer 41a is also one in which the rate of the first metal element M is increased as compared to the atomic number ratio of the Ni element to the first metal element M forming the alloy film 11. That is, when the alloy film 11 is the $Ni_{1-x}M_x$ alloy film (where 0<x<1), and the metal silicide layer 41a is in the $(Ni_{1-y}M_y)_2Si$ phase (where 0<y<1), the following relationship is obtained: x<y.

However, unlike the this embodiment, when the first heat treatment in step S3 satisfies the first condition and does not satisfy the second condition with the reaction rate R1 of reaction between the alloy film 11 and the silicon region 61 being 100%, the Ni element and the first metal element M forming the alloy film 11 on the silicon region 61 are entirely diffused into the silicon region 61 to contribute to formation of the metal silicide layer 41a regardless of a difference in diffusion coefficient between these elements. For this reason, even when the first metal element M is more easily diffused into the silicon region 61 than the Ni element, all amounts of the Ni element and the first metal element M forming the alloy film 11 on the silicon region 61 react with the silicon region 61 to form the metal silicide layer 41a. Thus, the atomic number ratio of the Ni element and the first metal element M in the metal silicide layer 41a may maintain the original atomic number ratio of the Ni element to the first metal element M in the alloy film 11. That is, when the alloy film 11 is the $Ni_{1-x}M_x$ alloy film (where 0<x<1), and the metal silicide layer 41a is in the $(Ni_{1-y}M_y)_2Si$ phase (where 0<y<1), the following relationship is obtained: x=y.

Further, unlike the this embodiment, the first heat treatment satisfying the above second condition and not satisfying the first condition is performed in step S3 at such a heat treatment temperature that makes the diffusion coefficient of Ni into the silicon region 61 larger than the diffusion coefficient of the first metal element M into the silicon region 61. In this case, the Ni element is diffused into the silicon region 61 ahead of the first metal element M, which may decrease the rate of the first metal element M in the metal silicide layer 41a. That is, the formation of the metal silicide layer 41a in the $(Ni_{1-y}M_y)_2$S phase using the $Ni_{1-x}M_x$ alloy film as the alloy film 11 results in y<x.

Thus, the first heat treatment is performed in step S3 so as to satisfy both the first condition and the second condition, whereby the rate of the first metal element M (preferably, Pt) with respect to the metal silicide layer 41a can be enhanced. That is, both the first condition and the second condition are satisfied, so that the rate of the first metal element M included in metal elements forming the metal silicide layer 41a (the sum of the Ni and first metal element M) can be larger than the rate of the first metal element M included in the alloy film 11. In other words, both the first condition and the second condition are satisfied, so that the formation of the metal silicide layer 41a in the $(Ni_{1-y}M_y)_2$S phase (where M is preferably Pt) using the $Ni_{1-x}M_x$ alloy film (where M is preferably Pt) as the alloy film 11 can result in x<y. Since the alloy film 11 containing the Ni element and the first metal element M reacts with the silicon region 61 to form the metal silicide layer 41a, the metal elements forming the metal silicide layer 41a are the same as those forming the alloy film 11, specifically, the Ni element and the first metal element M.

Thereafter, since the second heat treatment in step S5 changes the metal silicide layer 41a in the $(Ni_{1-y}M_y)_2Si$ phase into the metal silicide layer 41b in the $Ni_{1-y}M_ySi$ phase with the alloy film 11 removed in the second heat treatment in step S5, both the metal silicide layer 41a in the $(Ni_{1-y}M_y)_2Si$ phase and the metal silicide layer 41b in the $Ni_{1-y}M_ySi$ phase maintain the same ratio of the Ni element to the first metal element M (that is, 1−y:y). That is, the character y of the $(Ni_{1-y}M_y)_2Si$ forming the metal silicide layer 41a takes the same value as the character y of the $Ni_{1-y}M_ySi$ forming the metal silicide layer 41b.

In use of a nickel silicide layer as the metal silicide layer, addition of the first metal element M (in particular, preferably, Pt) to the nickel silicide layer can have the advantages in less agglomeration of the formed metal silicide layer, and in suppression of abnormal growing of a high-resistance $NiSi_2$ phase in the formed metal silicide layer, thus enabling improvement of the reliability of the semiconductor device. Since the Ni element differs from the first metal element M in sputtering angle in depositing the $Ni_{1-x}M_x$ alloy film on the semiconductor substrate, an increase in concentration of the first metal element M in the $Ni_{1-x}M_x$ alloy film can result in a nonuniform $Ni_{1-x}M_x$ alloy film formed on the semiconductor substrate. This phenomenon is remarkable especially when the first metal element M is Pt.

When the concentration of the first metal element M (that is, x of the $Ni_{1-x}M_x$) in the $Ni_{1-x}M_x$ alloy film is increased by adjusting a sputtering angle of the first metal element M using a honeycomb collimator or the like so as to uniformly deposit the $Ni_{1-x}M_x$ alloy film on the semiconductor substrate, the $Ni_{1-x}M_x$ alloy film may be much deposited over the collimator. Thus, there is a limit on increasing the concentration of the above-mentioned first metal element M. However, the effect obtained by addition of the first metal element M (in particular, preferably, Pt) into the above-mentioned nickel silicide layer is enhanced as increasing concentration of the first metal element M (in particular, preferably, Pt) in the nickel silicide layer. Thus, it is desirable to further improve the reliability of the semiconductor device by increasing the concentration of the first metal element M (in particular, preferably, Pt) in the nickel silicide layer.

In this embodiment, the first heat treatment is performed in step S3 so as to satisfy both the first condition and the second condition, whereby the rate of the first metal element M (that is, corresponding to the value of the character y when the metal silicide layer 41a is represented as the $(Ni_{1-y}M_y)_2Si$ alloy film) included in metal elements forming the metal silicide layer 41a can be enhanced (that is, y>x) as compared to the rate of the first metal element M included in the alloy film 11 (that is, corresponding to the character x when the alloy film 11 is represented as $Ni_{1-x}M_x$ alloy film). The rate of the first metal element M included in the metal elements forming the metal silicide layer 41b (that is, corresponding to the character y when the metal silicide layer 41b is represented as $Ni_{1-y}M_ySi$ alloy film) can be enhanced (that is, y>x) as compared to the rate of the first metal element M included in the alloy film 11 (that is, corresponding to the value of the character x when the alloy film 11 is represented as $Ni_{1-x}M_x$ alloy film). Thus, agglomeration of the metal silicide layers 41a and 42 can be suppressed, and abnormal growing of the high-resistance $Ni_{1-y}M_ySi_2$ phase can be suppressed in the metal silicide layer 41b, which can improve the reliability of the semiconductor device.

Figure 23:
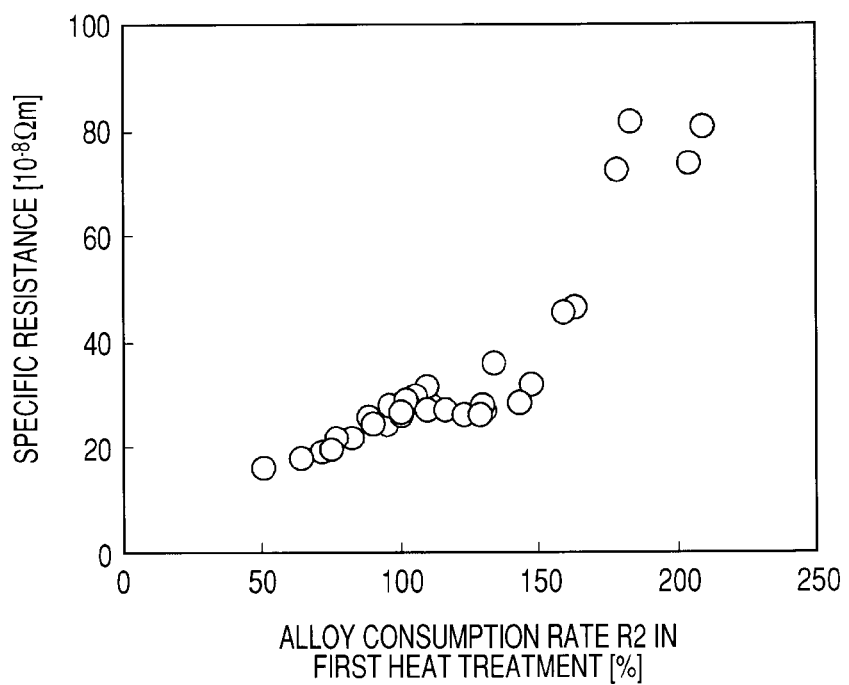
FIG. 23 is a graph showing a specific resistance of a metal silicide layer.

FIG. 23 is a graph showing a specific resistance of the metal silicide layer 41b when the metal silicide layer 41a is formed as the alloy film 11 using $Ni_{0.963}Pt_{0.037}$ alloy film. In FIG. 23, the longitudinal axis of the graph corresponds to a specific resistance of the metal silicide layer 41b, and the horizontal axis of the graph corresponds to an alloy film consumption rate R2 in the first heat treatment.

The alloy film consumption rate R2 of the first heat treatment indicated on the horizontal axis of the graph in FIG. 23 corresponds to a value obtained by dividing the thickness tn6 of the alloy film 11 consumable in the first heat treatment (corresponding to the silicon region 61) by the thickness tn1 of the alloy film 11 before the first heat treatment (that is, R2=tn6/tn1). The thickness tn6 of the alloy film 11 consumable (reactable with the silicon region 61) in the first heat treatment corresponds to the thickness of a part reacted with the silicon region 61 by the first heat treatment (that is, thickness tn3 of the reacted part 11b) when the thickness tn1 of the alloy film 11 is sufficiently thick (as compared to the thickness tn6). Accordingly, when the alloy film consumption rate R2 of the first heat treatment is equal to or less than 100%, the thickness tn6 of the alloy film 11 consumable by the first heat treatment (reactable with the silicon region 61) is the same (that is, n6=tn3) as the thickness tn3 of the reacted part 11b of the alloy film 11 in the first heat treatment. Thus, for the alloy film consumption in the first heat treatment of 100% or less (R2≦100%), the alloy film consumption rate R2 in the first heat treatment is the same as that of the reaction ratio (R2=R1). In contrast, when the alloy film consumption rate R2 in the first heat treatment exceeds 100%, the thickness tn1 of the alloy film 11 is thinner than the thickness tn6 of the alloy film 11 consumable by the first heat treatment (tn1<tn6), so that the thickness tn3 of the reacted part 11b of the alloy film 11 in the first heat treatment is the same as the thickness tn1 of the alloy film 11 (tn3=tn1<tn6). Thus, for the alloy film consumption rate R2 of the first heat treatment of 100% or more (R2≧100%), the reaction rate R1 is constantly 100% (R1=100%), so that both rates are different values.

For example, when the alloy film 11 having a thickness tn1 of 20 μm is subjected to the first heat treatment with the thickness tn3 of the reacted part 11b of the alloy film 11 of 10 μm, the following relationships are obtained: tn6=tn3=10 μm, and tn1=20 μm. Each of the above reaction rate R1 and the alloy film consumption rate R2 in the first heat treatment is 50%. For example, the first heat treatment is performed on the alloy film 11 having the thickness tn1 of 10 μm under the same heat treatment conditions as the case of the reacted part 11b of the alloy film 11 having the thickness tn3 of 20 μm which is obtained by forming the alloy film 11 in the thickness tn1 of 40 μm and by applying the first heat treatment thereto. This results in tn6=20 μm, and tn1=10 μm. The alloy film consumption rate R2 of the first heat treatment is 200%, and the reaction rate R1 of the first heat treatment is 100%. The same heat treatment conditions include at least the same heat treatment temperature and heat treatment time.

The graph of FIG. 23 is the plot obtained under the mixtures of different heat treatment temperatures and heat treatment times of the first heat treatment, while the first heat treatment constantly satisfies the above first condition. When the alloy film consumption rate R2 of the first heat treatment is less than 100%, the above second condition is satisfied. However, when the alloy film consumption rate R2 of the first heat treatment is equal to or more than 100%, the above second condition is not satisfied. This is because for the alloy film consumption rate R2 of the first heat treatment of 100% or more, the entire alloy film 11 on the silicon region 61 reacts with the silicon region 61 (that is, the reaction rate R1 being 100%), and for the alloy film consumption rate R2 of the first heat treatment of less than 100%, only a lower area of the alloy film 11 on the silicon region 61 reacts with the silicon region 61 (that is, the reaction rate R1 being less than 100%).

The graph of FIG. 23 shows the following facts. For the alloy film consumption rate R2 in the first heat treatment of about 150% or less, the metal silicide layer 41b has a low resistivity and is in the $Ni_{1-y}M_ySi$ phase, specifically, $Ni_{1-y}Pt_ySi$ phase. For the alloy film consumption rate R2 in the first heat treatment exceeding 150%, however, the resistivity of the metal silicide layer 41b is increased. This is because a $Ni_{1-y}M_ySi_2$ phase having a high resistivity, specifically, $Ni_{1-y}Pt_ySi_2$ phase is abnormally grown in the metal silicide layer 41b.

For the alloy film consumption rate R2 in the first heat treatment of 100 to 150%, the resistivity of the metal silicide layer 41b is substantially constant. For the alloy film consumption rate R2 in the first heat treatment of less than 100%, the resistivity of the metal silicide layer 41b is decreased as decreasing alloy film consumption rate R2 in the first heat treatment. This is based on the following reason. For the alloy film consumption rate R2 in the first heat treatment of less than 100%, the first heat treatment satisfies the first condition and the second condition as described above, which enhances the rate of the first metal element M (here, Pt) in the metal silicide layer 41b. That is, the value of the character "y" provided when the metal silicide layer 41a is represented as the $Ni_{1-y}M_ySi$ alloy film, specifically, $Ni_{1-y}Pt_ySi$ in this embodiment is enhanced.

The $Ni_{1-y}M_ySi$ alloy film decreases its resistivity as increasing value of y of, especially, $Ni_{1-y}Pt_ySi$ material. In other words, for the alloy film consumption rate R2 of the first heat treatment of less than 100%, the rate of the first metal element M (specifically, Pt in this embodiment) in the metal silicide layer 41b is enhanced (that is, the value of y in the $(Ni_{1-y}M_y)$ Si becomes large) with decreasing alloy film consumption rate R2 of the first heat treatment, which reduces the resistivity of the metal silicide layer 41b.

Accordingly, like this embodiment, the first heat treatment is performed in step S3 so as to satisfy the first condition and the second condition thereby to enhance the rate of the first metal element M (preferably, Pt) in the formed metal silicide layer 41b, which can further reduce the resistivity of the metal silicide layer 41b.

FIG. 24 is a table showing a summary of various conditions where the $Ni_{1-y}Pt_ySi$ layers corresponding to the metal silicide layer 41b were formed, and the properties of the formed $Ni_{1-y}Pt_ySi$ layers. Each $Ni_{1-y}Pt_ySi$ layer was formed by forming a semiconductor region (impurity diffusion layer) corresponding to the silicon region 61 on the main surface of the semiconductor substrate, forming thereon an $Ni_{0.963}Pt_{0.037}$ alloy film corresponding to the alloy film 11, and performing heat treatment corresponding to the first and second heat treatment. That is, in specimens No. 1 to No. 8, the $Ni_{1-y}Pt_ySi$ layers corresponding to the metal silicide layer 41b were formed on different conditions. FIG. 24 is a table showing a summary of formation conditions of the respective specimens No. 1 to No. 8, and the properties of the formed $Ni_{1-y}Pt_ySi$ layers.

In any one of the specimens No. 1 to No. 8, the alloy film 11 used was $Ni_{0.963}Pt_{0.037}$ alloy film, and the heat treatment temperature of the first heat treatment was 270° C. Thus, in any one of the specimens No. 1 to No. 8, the first heat treatment satisfies the first condition. Also, the respective specimens No. 1 to No. 8 have the following same heat treatment condition of the second heat treatment: the heat treatment temperature of the second heat treatment of 500° C., and the heat treatment time appropriate for a spike anneal process to be describe later.

However, the specimens No. 1 to No. 8 differ in other conditions. That is, in the specimens No. 1 to No. 4, n-type impurities are introduced into a semiconductor substrate (silicon single crystal substrate) to form an $n^+$-type semiconductor region (corresponding to the silicon region 61), and then an $Ni_{0.963}Pt_{0.037}$ alloy film (corresponding to the alloy film 11) is formed thereon. In contrast, in the specimens No. 5 to No. 8, p-type impurities are introduced into a semiconductor substrate (silicon single crystal substrate) to form a $p^+$-type semiconductor region (corresponding to the silicon region 61), and then an $Ni_{0.963}Pt_{0.037}$ alloy film (corresponding to the alloy film 11) is formed thereon. The thicknesses tn1 of the $Ni_{0.963}Pt_{0.037}$ alloy film (corresponding to the alloy film 11) in deposition in the specimens No. 1 to No. 8 were 10 nm, 20 nm, 10 nm, 100 nm, 10 nm, 20 nm, 10 nm, and 100 nm, respectively. The heat treatment times of the first heat treatment in the specimens No. 1 to No. 8 were 59 seconds, 59 seconds, 600 seconds, 59 seconds, 59 seconds, 59 seconds, 600 seconds, and 59 seconds, respectively. In the specimens No. 1, No. 2, and No. 4, the heat treatment temperature and heat treatment time of the first heat treatment were the same. The thickness tn6 of the $Ni_{0.963}Pt_{0.037}$ alloy film (corresponding to the alloy film 11) consumable in the first heat treatment was the same value of 10 nm. In the specimen No. 3, the heat treatment time of the first heat treatment was 600 seconds, so that the $Ni_{0.963}Pt_{0.037}$ alloy film consumable in the first heat treatment (corresponding to the alloy film 11) had a thickness tn6 of 18.5 nm, which was larger than the cases of the specimens No. 1, No. 2, and No. 4. In the specimens No. 5, No. 6, and No. 8, the heat treatment temperature and time of the first heat treatment were the same. The thickness tn6 of the $Ni_{0.963}Pt_{0.037}$ alloy film (corresponding to the alloy film 11) consumable in the first heat treatment was the same value of 12.3 nm. Since in the specimen No. 7, the heat treatment time of the first heat treatment was set to a long time of 600 seconds, the thickness tn6 of the $Ni_{0.963}Pt_{0.037}$ alloy film (corresponding to the alloy film 11) consumable in the first heat treatment was 22.3 nm, which was larger than those of the specimens No. 5, No. 6, and No. 8. Since the p-type silicon region is more easily reacted with the alloy film 11 than the n-type silicon region, the thickness tn6 of each of the specimens No. 5, No. 6, and No. 8 with the $p^+$-type silicon region 61 is larger than that of each of the specimens No. 1, No. 2, and No. 4 with the n$^+$-type silicon region 61 even when these specimens have the same heat treatment temperature and heat treatment time of the first heat treatment. This relation can be applied to the specimens No. 3 and No. 7 in the same way.

The alloy film consumption rate R2 of the first heat treatment corresponds to a value obtained by dividing the thickness tn6 by the thickness tn1 (that is, tn6/tn1), and described in the table of FIG. 24 as described above. For the alloy film consumption rate R2 of the first heat treatment of 100% or more, the above second condition is not satisfied, whereas for the alloy film consumption rate R2 of the first heat treatment of less than 100%, the second condition is satisfied. Thus, in the case of the specimens No. 2, No. 4, No. 6, and No. 8, the first heat treatment satisfies both the first condition and the second condition. In the case of specimens No. 1, No. 3, No. 5, and No. 7, the first heat treatment satisfies the first condition and not the second condition.

The table of FIG. 24 shows the thickness tn2 of the unreacted part 11a of the Ni$_{0.963}$Pt$_{0.037}$ alloy film (corresponding to the alloy film 11) in performing the first heat treatment, the thickness tn3 of the reacted part 11b, and the reaction rate R1 in each of the specimens No. 1 to No. 8. When the thickness tn6 is equal to or less than the thickness tn1, the thickness tn3 is the same as the thickness tn6. When the thickness tn6 is larger than the thickness tn1, the thickness tn3 is the same as the thickness tn1. The thickness tn2 is a difference between the thickness tn1 and the thickness tn3. The reaction rate R1 is represented by the formula of R1=tn3/tn1 (note that when represented in percentage, the value is multiplied by 100) as described above.

The rate of Pt included in metal elements forming the Ni$_{1-y}$Pt$_y$Si layer (corresponding to the metal silicide layer 41b) formed by the first heat treatment and the second heat treatment is represented by "concentration of Pt", which is shown in the table of FIG. 24. The term "concentration of Pt" corresponds to a value obtained by multiplying the value of y in the Ni$_{1-y}$Pt$_y$Si by 100 (note that this value is multiplied by 100 because of expression in percentage). The term "concentration of Pt" is a value measured by an inductively coupled plasma-atomic emission spectrometry (ICP-AES). The particle sizes (crystal particle sizes) of the Ni$_{1-y}$Pt$_y$Si layers (corresponding to the metal silicide layers 41b) formed by the first heat treatment and the second heat treatment are shown in the table of FIG. 24. The particle size is a value obtained by calculation which involves preparing a photograph taken of the Ni$_{1-y}$Pt$_y$Si layer (corresponding to the metal silicide layer 41b) (herein corresponding to an SEM photograph shown in FIGS. 25 to 32), and then dividing the length of a diagonal line of the photograph by the number of grain boundaries across the diagonal line of the photograph. The particle size is a value corresponding to an average particle size (an average value of crystal particle sizes).

Figure 25:
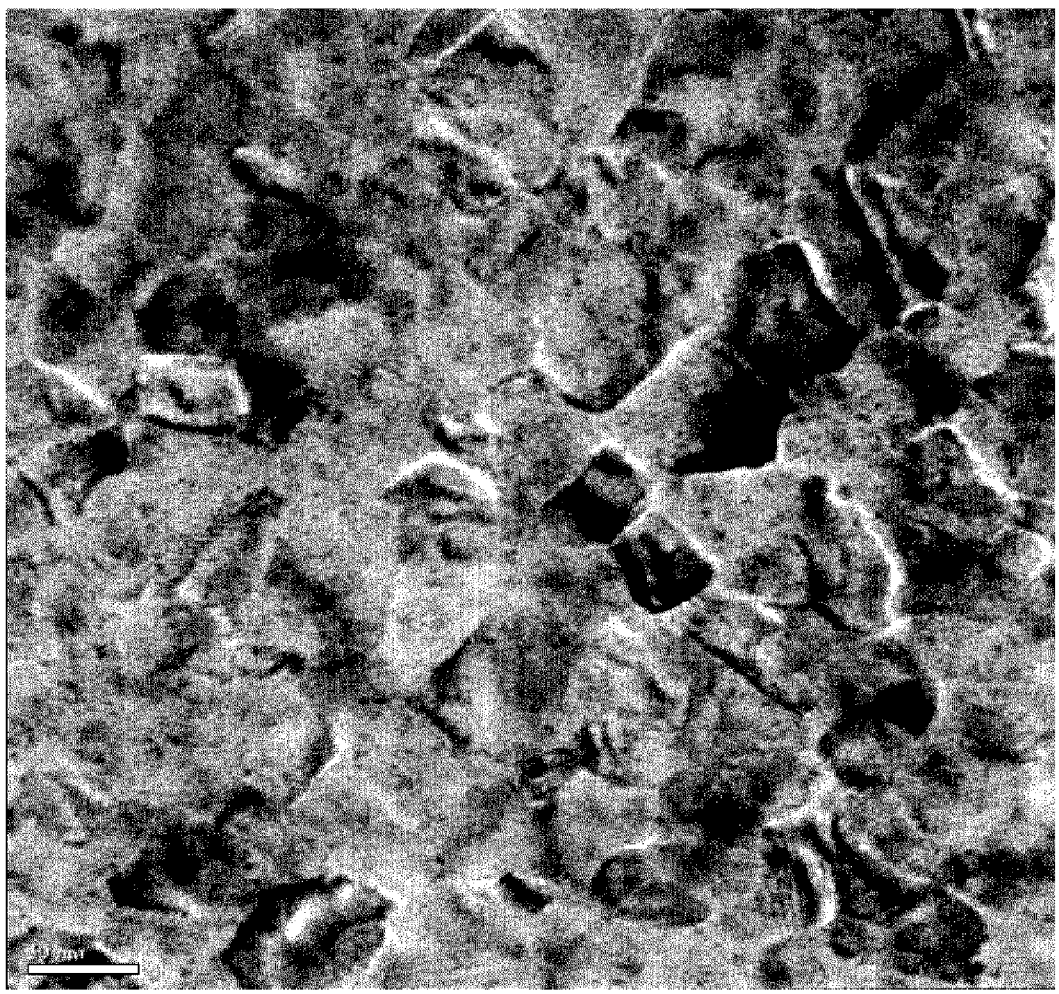
FIG. 25 is an explanatory diagram showing an SEM photograph of a $Ni_{1-y}Pt_ySi$ layer in a specimen No. 4 shown in FIG. 24.
Figure 26:
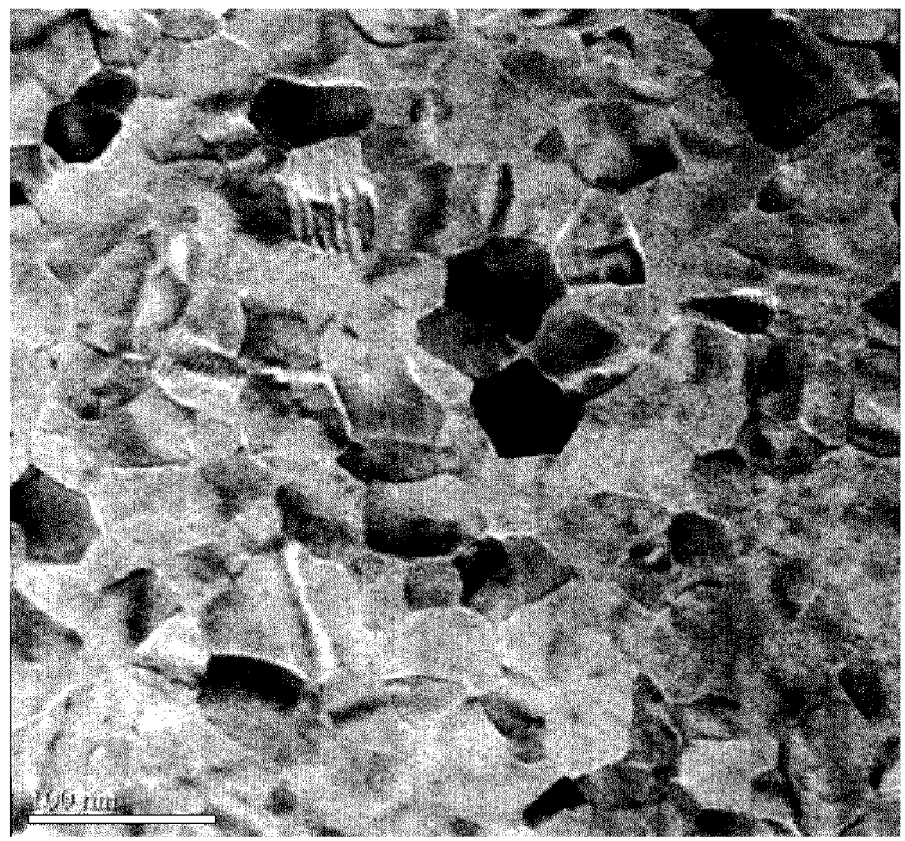
FIG. 26 is an explanatory diagram showing an SEM photograph of a $Ni_{1-y}Pt_ySi$ layer in a specimen No. 2 shown in FIG. 24.
Figure 27:
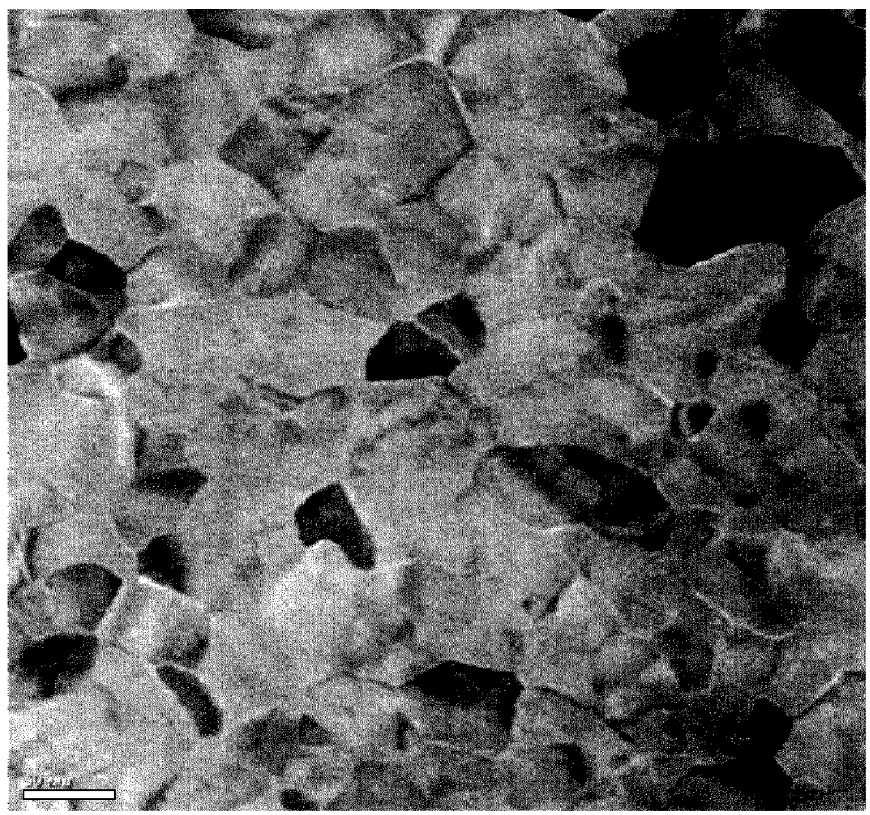
FIG. 27 is an explanatory diagram showing an SEM photograph of a $Ni_{1-y}Pt_ySi$ layer in a specimen No. 1 shown in FIG. 24.
Figure 28:
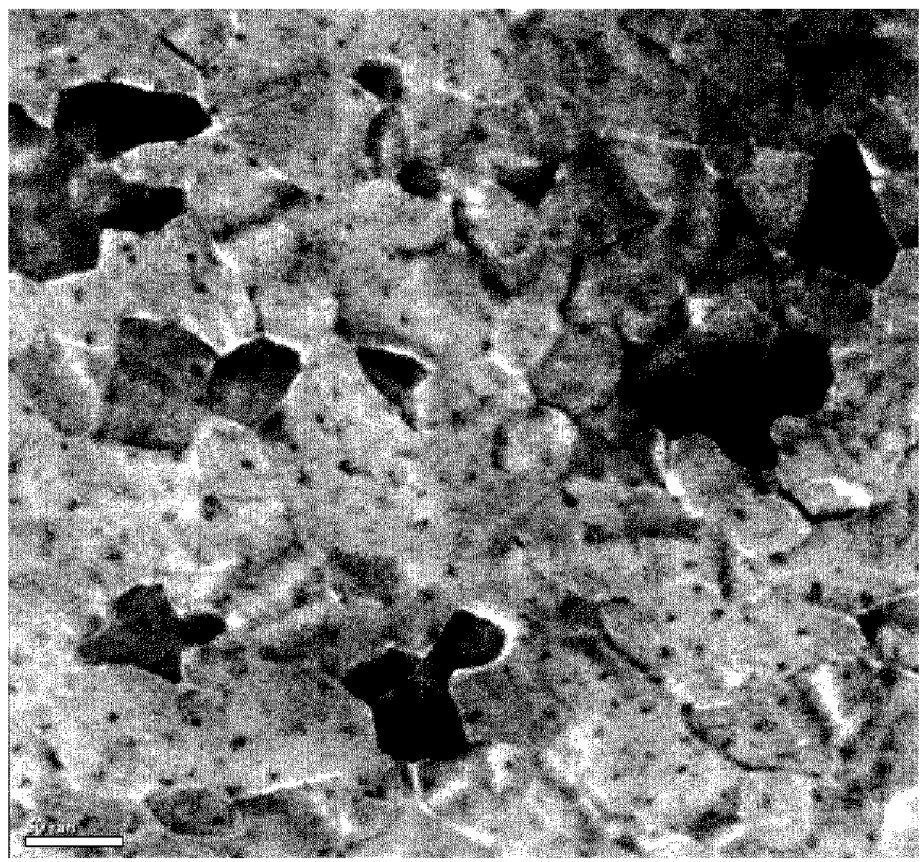
FIG. 28 is an explanatory diagram showing an SEM photograph of a $Ni_{1-y}Pt_ySi$ layer in a specimen No. 3 shown in FIG. 24.
Figure 29:
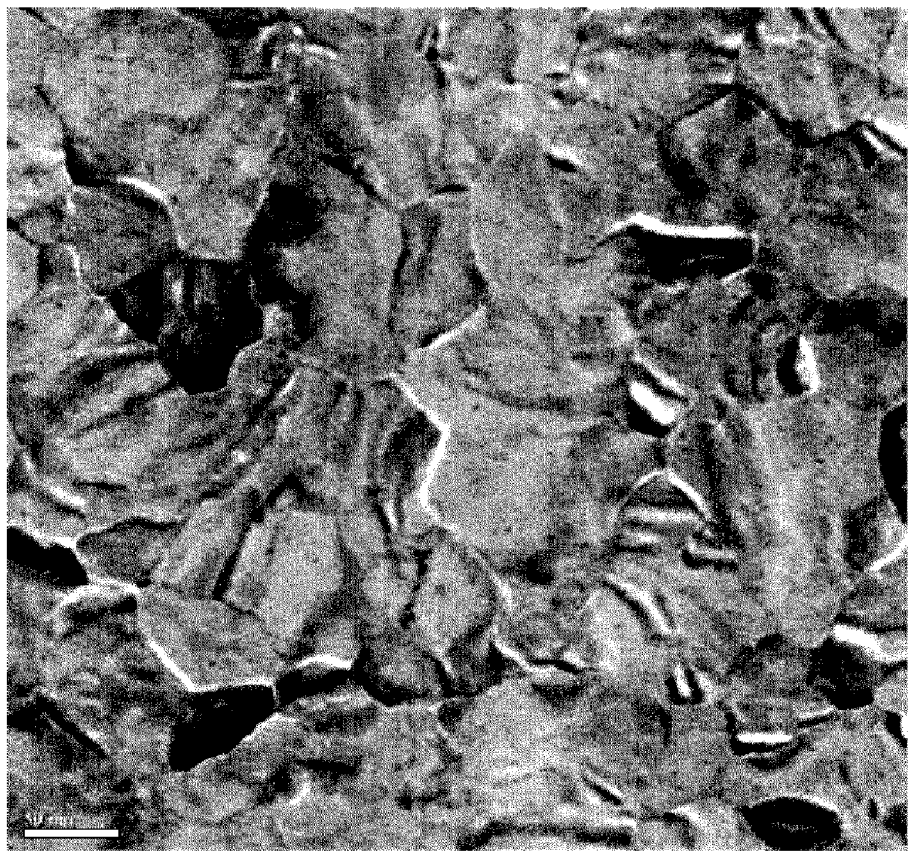
FIG. 29 is an explanatory diagram showing an SEM photograph of a $Ni_{1-y}Pt_ySi$ layer in a specimen No. 8 shown in FIG. 24.
Figure 30:
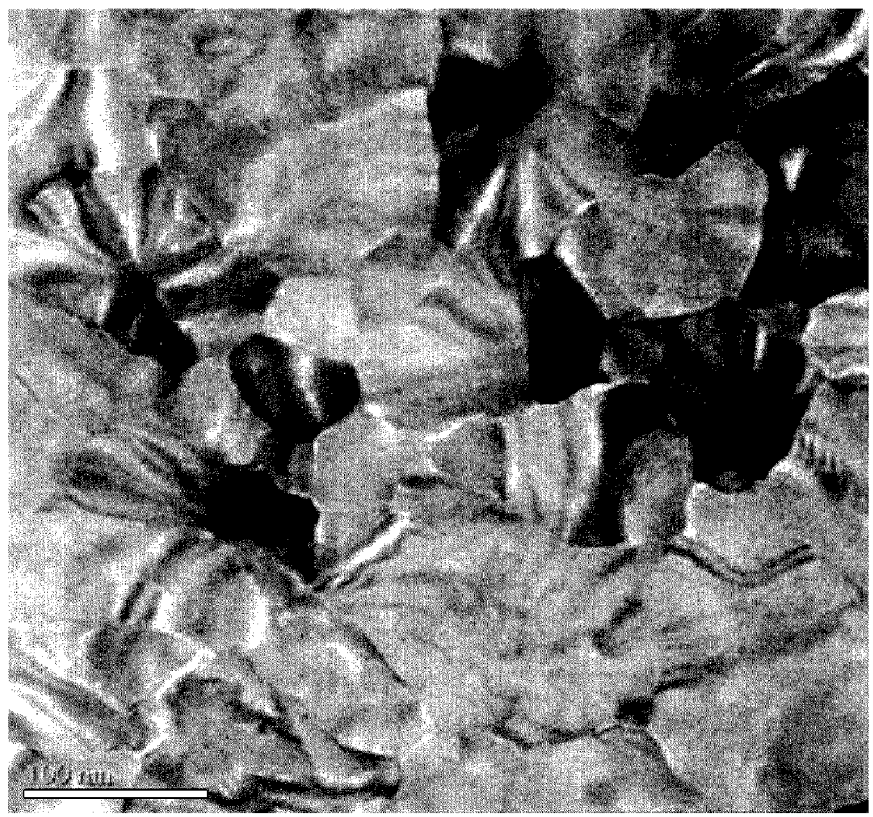
FIG. 30 is an explanatory diagram showing an SEM photograph of a $Ni_{1-y}Pt_ySi$ layer in a specimen No. 6 shown in FIG. 24.
Figure 31:
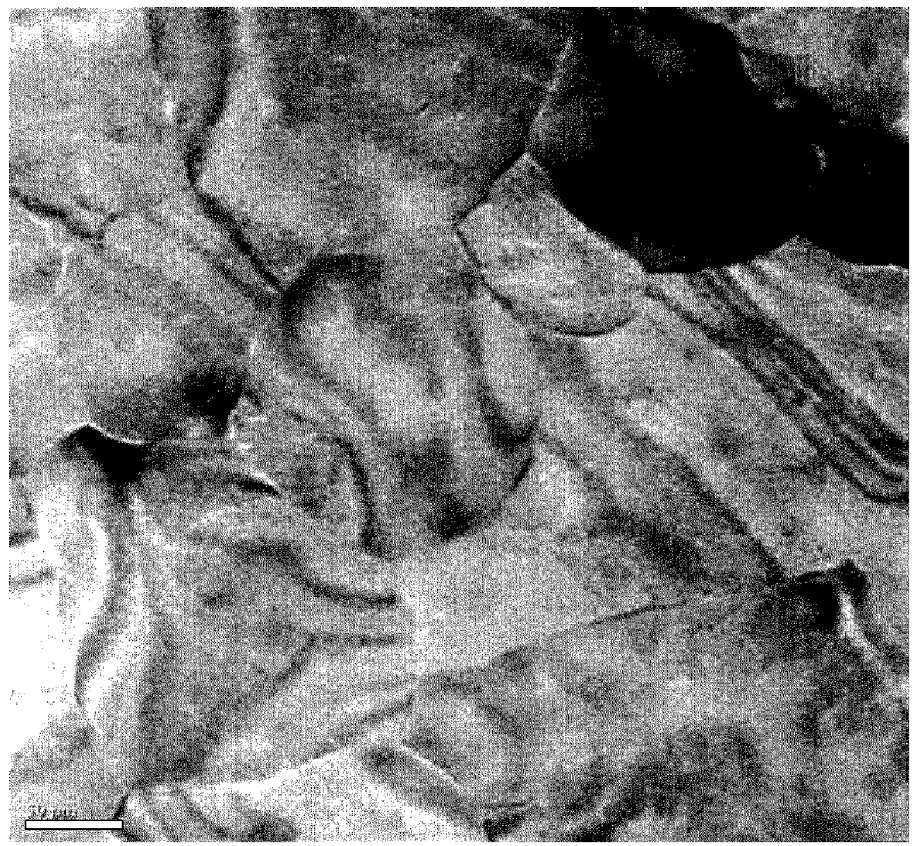
FIG. 31 is an explanatory diagram showing an SEM photograph of a $Ni_{1-y}Pt_ySi$ layer in a specimen No. 5 shown in FIG. 24.
Figure 32:
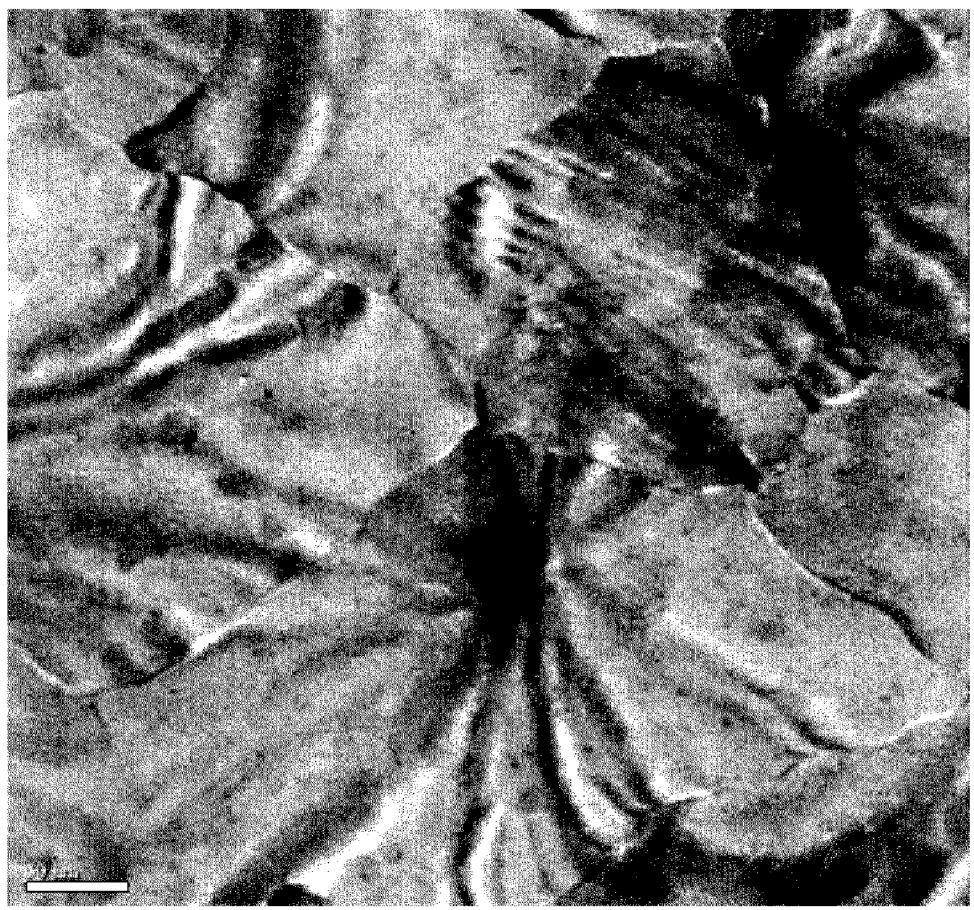
FIG. 32 is an explanatory diagram showing an SEM photograph of a $Ni_{1-y}Pt_ySi$ layer in a specimen No. 7 shown in FIG. 24.

FIGS. 25 to 32 are explanatory diagrams showing scanning electron microscope (SEM) photographs of the Ni$_{1-y}$Pt$_y$Si layers (corresponding to the metal silicide layers 41b) formed by the first heat treatment and the second heat treatment in the specimens No. 1 to No. 8 shown in the table of FIG. 24. FIG. 25 corresponds to the specimen No. 4, FIG. 26 corresponds to the specimen No. 2, FIG. 27 corresponds to the specimen No. 1, and FIG. 28 corresponds to the specimen No. 3. The alloy film consumption rate R2 of the first heat treatment is increased from FIG. 25 (specimen No. 4), to FIG. 26 (specimen No. 2), FIG. 27 (specimen No. 1), and FIG. 28 (specimen No. 3) in that order. FIG. 29 corresponds to the specimen No. 8, FIG. 30 corresponds to the specimen No. 6, FIG. 31 corresponds to the specimen No. 5, and FIG. 32 corresponds to the specimen No. 7. The alloy film consumption rate R2 of the first heat treatment is increased from FIG. 29 (specimen No. 8), to FIG. 30 (specimen No. 6), FIG. 31 (specimen No. 5), and FIG. 32 (specimen No. 7) in that order.

Figure 33:
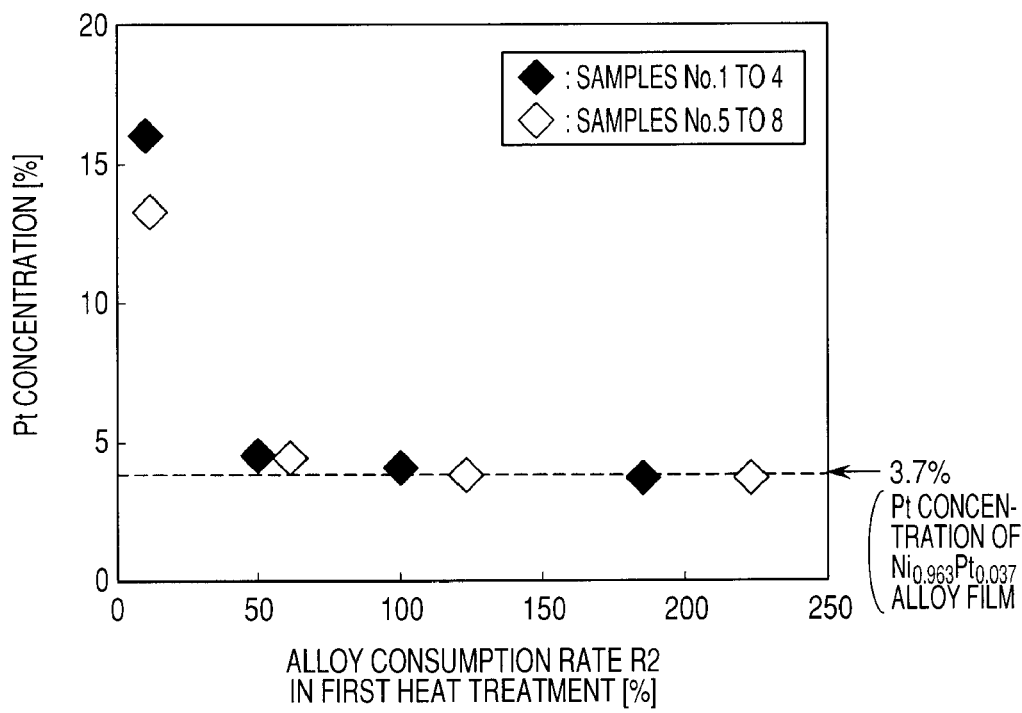
FIG. 33 is a graph of the plot with alloy film consumption rates of the first heat treatment on the horizontal axis and with "concentrations of Pt" on the longitudinal direction about the specimens shown in the table of FIG. 24.
Figure 34:
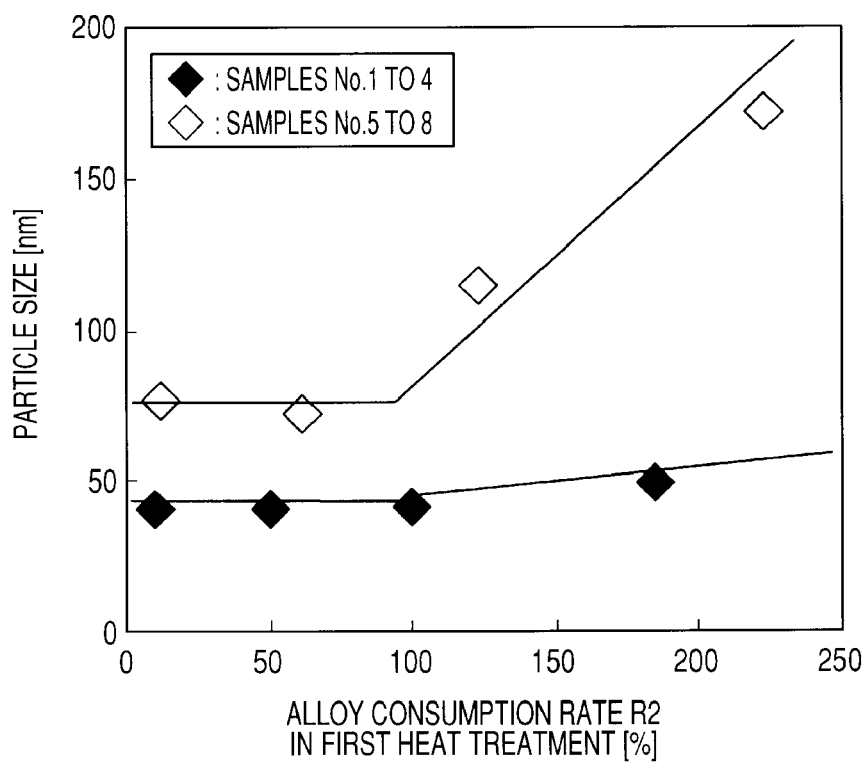
FIG. 34 is a graph of the plot with alloy film consumption rates of the first heat treatment on the horizontal axis and with particle sizes on the longitudinal direction about the specimens shown in the table of FIG. 24.

FIG. 33 is a graph of the plot with "alloy film consumption rates R2 of the first heat treatment" on the horizontal axis and with "concentrations of Pt" on the longitudinal direction about the specimens No. 1 to No. 8 shown in the table of FIG. 24. FIG. 34 is a graph of the plot with "alloy film consumption rates R2 of the first heat treatment" on the horizontal axis and with "particle sizes" on the longitudinal direction about the specimens No. 1 to No. 8 shown in the table of FIG. 24.

The graphs in the table of FIG. 24 and in FIG. 33 show that for the alloy film consumption rate R2 in the first heat treatment of 100% or more (in the specimens No. 1, No. 3, No. 5, and No. 7), the concentration of Pt in the Ni$_{1-y}$Pt$_y$Si layer formed (or a value provided by multiplying the value of y of Ni$_{1-y}$Pt$_y$Si by 100) is substantially the same as the concentration of Pt in the Ni$_{0.963}$Pt$_{0.037}$ alloy film formed as the alloy film 11 (that is, 3.7%, represented by a dotted line in the graph of FIG. 33). In contrast, for the alloy film consumption rate R2 in the first heat treatment of less than 100% (in the specimens No. 2, No. 4, No. 6, and No. 8), the concentration of Pt in the formed Ni$_{1-y}$Pt$_y$Si layer (a value provided by multiplying the value of y of the formed Ni$_{1-y}$Pt$_y$Si layer by 100) is larger than the concentration of Pt (that is, 3.7%) in the Ni$_{0.963}$Pt$_{0.037}$ alloy film formed as the alloy film 11. It is shown that for the alloy film consumption rate R2 in the first heat treatment of less than 100%, the concentration of Pt in the formed Ni$_{1-y}$Pt$_y$Si layer increases with decreasing alloy film consumption rate R2 of the first heat treatment. For the alloy film consumption rate R2 in the first heat treatment of less than 100% (in the specimens No. 2, No. 4, No. 6, and No. 8), the first heat treatment satisfies both the first condition and the second condition. Thus, the concentration of Pt in the formed Ni$_{1-y}$Pt$_y$Si layer is larger than the concentration of Pt (that is, 3.7%) in the Ni$_{0.963}$Pt$_{0.037}$ alloy film formed as the alloy film 11.

Accordingly, like this embodiment, the first heat treatment is performed in step S3 so as to satisfy both the first condition and the second condition, whereby the rate of the first metal element M (preferably, Pt) included in the metal elements forming the metal silicide layer 41b can be larger than that of the first metal element M (preferably, Pt) included in the alloy film 11.

As can be seen from the table of FIG. 24, the SEM photographs in FIGS. 25 to 33, and the graph of FIG. 34, for the alloy film consumption rate R2 in the first heat treatment of 100% or more, excessive heat treatment after consuming all the Ni$_{0.963}$Pt$_{0.037}$ alloy film in the first heat treatment greatly grows the crystal particles of the metal silicide. In contrast, for the alloy film consumption rate R2 in the first heat treatment of less than 100% (that is, when the second condition is satisfied), such excessive heat treatment is not applied, which suppresses the growing of crystal particles of the metal silicide material, resulting in a substantially constant value of the crystal particle size of the metal silicide layer. Thus, variations in resistance of the metal silicide layer can be suppressed.

Figure 35:
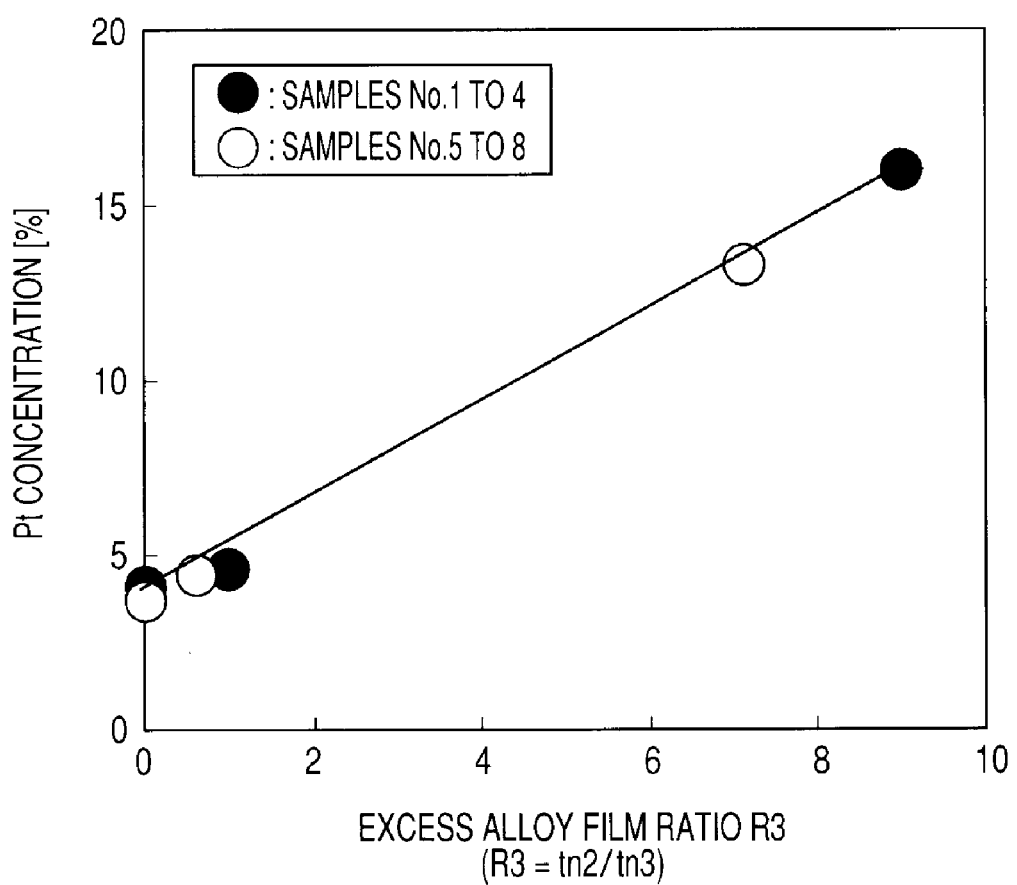
FIG. 35 is a graph of the plot with excess alloy film ratios on the horizontal axis and with concentrations of Pt on the longitudinal direction about the specimens shown in the table of FIG. 24.
Figure 36:
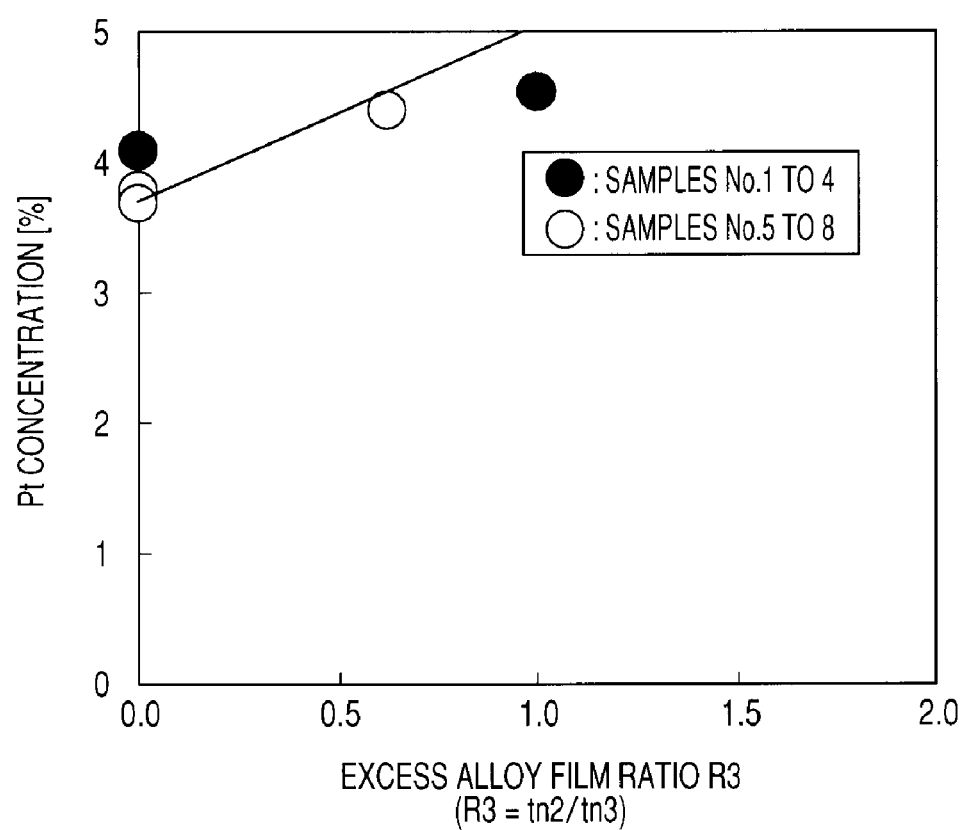
FIG. 36 is a graph of the plot with excess alloy film ratios of on the horizontal axis and with particle sizes on the longitudinal direction about the specimens shown in the table of FIG. 24.

FIGS. 35 and 36 are graphs of the plots with "excess alloy film ratio R3" on the horizontal axis and with "concentration of Pt" on the longitudinal axis about the specimens No. 1 to No. 8 shown in the table of the FIG. 24. FIG. 36 shows an enlarged view of a part (in a range of the excess alloy film ratio of 0 to 2) of the graph of FIG. 35. Thus, the value of y provided when the metal silicide layer 41b is represented as (Ni$_{1-y}$Pt$_y$)Si is multiplied by 100 (the value being multiplied by 100 for expression in percentage) to correspond to the value on the longitudinal axis in the graphs of FIGS. 35 and 36.

The term excess alloy film ratio R3 represented on the horizontal axis of the graphs of FIGS. 35 and 36 corresponds to a value provided by dividing the thickness tn2 of the unreacted part 11a of the alloy film 11 in the first heat treatment by the thickness tn3 of the reacted part 11b of the alloy film 11 (that is, R3=tn2/tn3).

The formulas of R1=tn3/tn1, R3=tn2/tn3, and tn1=tn2+tn3 can be used to represent a formula of R3=(1/R1)−1.

The excess alloy film ratio R3 of zero on the horizontal axis in FIGS. 35 and 36 (R3=0) corresponds to the above-mentioned reaction rate R1=100% (that is, the entire alloy film 11 on the silicon region 61 reacts with the silicon region 61 by the first heat treatment thereby to form the metal silicide layer 41a). An increase in excess alloy film ratio R3 (that is, tn2/tn3) on the horizontal axis of FIGS. 35 and 36 corresponds to a decrease in reaction rate R1 in the first heat treatment.

As can be seen from the graphs of FIGS. 35 and 36, for the excess alloy film ratio R3 of zero (R3=0) (that is, for the above reaction rate R1=100%), the concentration of Pt (a value provided by multiplying the value of y of the formed $Ni_{1-y}Pt_ySi$ alloy film by 100) in the formed $(Ni_{1-y}Pt_y)Si$ layer (corresponding to the metal silicide layer 41b) is substantially the same as the concentration of Pt (namely, 3.7%) in the $Ni_{0.963}Pt_{0.037}$ alloy film formed as the alloy film 11. As the excess alloy film ratio R3 increases, the concentration of Pt in the formed $Ni_{1-y}Pt_ySi$ layer is increased. This phenomenon can be understood by use of models for explanation with reference to FIGS. 37 and 38.

Figure 37:
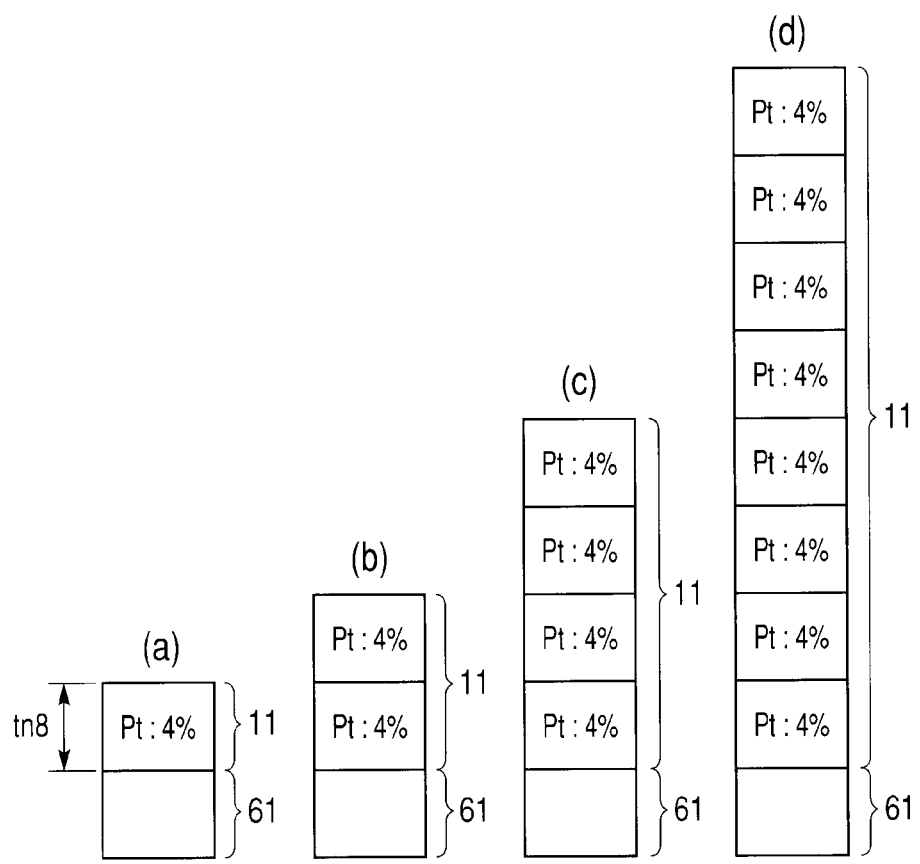
FIG. 37 is an explanatory diagram for explaining an increase in concentration of Pt.
Figure 38:
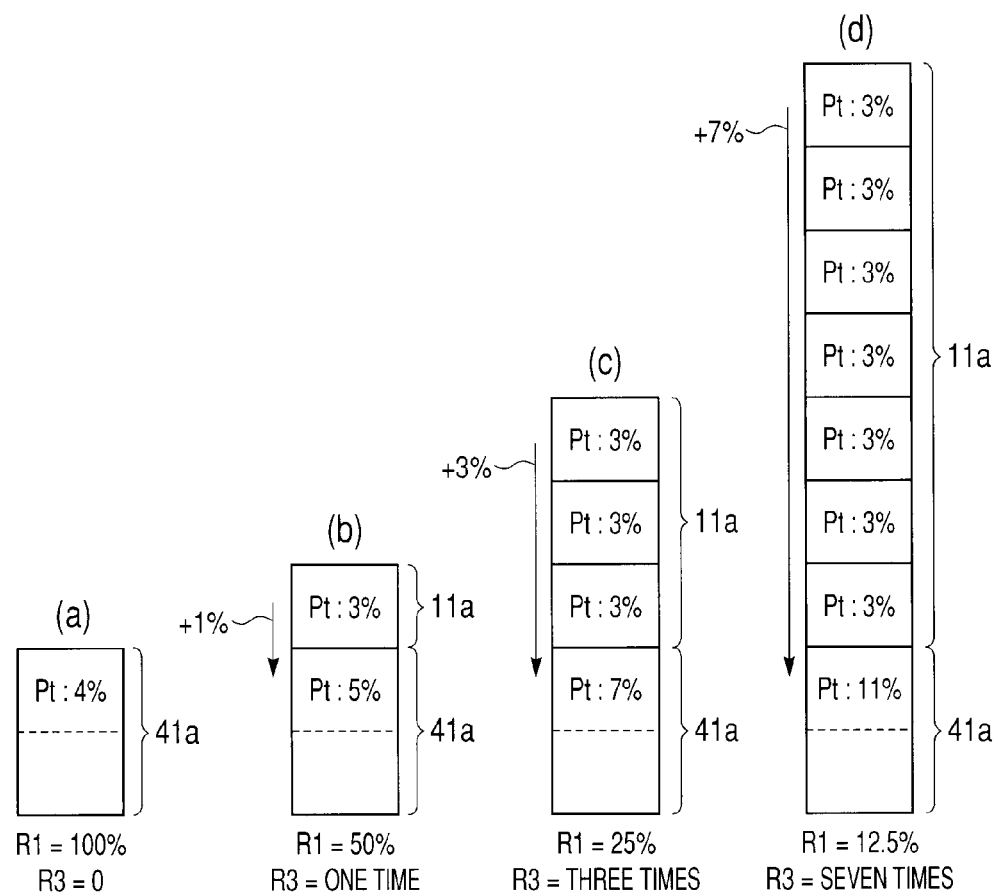
FIG. 38 is an explanatory diagram for explaining an increase in concentration of Pt.

FIGS. 37 and 38 are explanatory diagrams for explaining the increase of concentration of Pt. FIG. 37 schematically shows the state directly before the first heat treatment in step S3, and FIG. 38 schematically shows the state directly after the first heat treatment in step S3. By using the thickness tn8 of the alloy film 11 formed on the silicon region 61 in FIG. 37A as reference, the alloy film 11 is formed on the silicon region 61 in a thickness of twice as large as the thickness tn8 in FIG. 37B, in a thickness of fourth times as large as the thickness tn8 in FIG. 37C, and in a thickness of eight times as large as the thickness tn8 in FIG. 37D. The formed alloy film 11 shown in FIG. 37 is a $Ni_{0.96}Pt_{0.04}$ alloy film, and thus the concentration of Pt is 4%. In the alloy film 11 shown in FIG. 37, the term "Pt: 4%" is described so as to indicate the concentration of Pt of 4%. FIGS. 38A, 38B, 38C, and 38D correspond to the states subjected to the first heat treatment of FIGS. 37A, 37B, 37C, and 37d, respectively. The first heat treatment performed satisfies the first condition. In each of the cases shown in FIGS. 38A, 38B, 38C, and 38D, the first heat treatment is performed on such heat treatment conditions that the thickness tn3 of the reacted part 11b of the above-mentioned alloy film 11 is the same, and the thickness tn3 of the reacted part 11b of the alloy film 11 is the same as the thickness tn8 (that is, tn3=tn8). Therefore, in the case of FIG. 38A, the reaction rate R1 is equal to 100% (R1=100%), so that the excess alloy film ratio R3 is equal to 100% (R3=100%). In the case of FIG. 38B, the alloy film 11 is formed in the thickness twice as large as the thickness tn8, and thus the thickness tn2 of the unreacted part 11a of the alloy film 11 is one time as large as the thickness tn8, which results in reaction rate R1 of 50% (R1=50%), and in excess alloy film ratio R3 of 1 (R3=1). In the case of FIG. 38C, the alloy film 11 is formed in the thickness four times as large as the thickness tn8, and thus the thickness tn2 of the unreacted part 11a of the alloy film 11 is three times as large as the thickness tn8, which results in reaction rate R1 of 25% (R1=25%), and in excess alloy film ratio R3 of 3 (R3=3). In the case of FIG. 38D, the alloy film 11 is formed in the thickness eight times as large as the thickness tn8, and thus the thickness tn2 of the unreacted part 11a of the alloy film 11 is seven times as large as the thickness tn8, which results in reaction rate R1 of 12.5% (R1=12.5%), and in excess alloy film ratio R3 of 7 (R3=7). Therefore, in the case of FIG. 38A, the second condition is not satisfied, but in the cases of FIGS. 38B, 38C, and 38D, the second condition is satisfied.

In the case of FIG. 38A, the entire alloy film 11 reacts with the silicon region 61. When the concentration of Pt in the alloy film 11 is 4%, the metal silicide layer 41a also has the same concentration of Pt of 4%. The concentration of Pt in the metal silicide layer 41a is the rate of Pt included in metal elements forming the metal silicide layer 41a, and corresponds to a value of y provided when the metal silicide layer 41a is represented as $(Ni_{1-y}Pt_y)_2Si$ (which is obtained by multiplying the value of y by 100 when represented in percentage).

In contrast, in the case of FIG. 38B, the unreacted part 11a of the alloy film 11 exists in the same thickness as the above thickness tn8, while the first heat treatment satisfies the first condition, and thus the Pt element is diffused in advance of Ni from the alloy film 11 into the silicon region 61 in the first heat treatment. Thus, the concentration of Pt in the unreacted part 11a of the alloy film 11 is decreased, for example, to 3% as compared to the concentration of Pt at the time of deposition (4%), and thus the concentration of Pt in the metal silicide layer 41a is increased by the above decrease (for example, by 1%), for example, to be 5%. This is because the decrease in concentration of Pt (1%) in the unreacted part 11a of the alloy film 11 leads to the increase in concentration of Pt (+1%) in the metal silicide layer 41a.

In the case of FIG. 38C, the unreacted part 11a of the alloy film 11 exists in the thickness three times as large as the thickness tn8, while the first heat treatment satisfies the first condition, and thus the Pt element is diffused in advance of Ni from the alloy film 11 into the silicon region 61 in the first heat treatment. Thus, the concentration of Pt in the unreacted part 11a of the alloy film 11 is decreased to, for example, 3% as compared to that at the time of deposition (4%), and thus the concentration of Pt in the metal silicide layer 41a is increased by the above decrease (for example, by 3%), for example, to be 7%. This is because the decrease in concentration of Pt (for example, 1%×3) in the entire unreacted part 11a of the alloy film 11 leads to the increase in concentration of Pt in the metal silicide layer 41a (for example, +3%). In comparison with the case of FIG. 38B, in the case of FIG. 38C, since the thickness of the unreacted part 11a of the alloy film 11 is large, the decrease in concentration of Pt in the entire unreacted part 11a becomes large, which leads to the increase in concentration of Pt in the metal silicide layer 41a.

In the case of FIG. 38D, the unreacted part 11a of the alloy film 11 exists in the thickness seven times as large as the thickness tn8, while the first heat treatment satisfies the first condition, and thus the Pt element is diffused in advance of Ni from the alloy film 11 into the silicon region 61 in the first heat treatment. Thus, the concentration of Pt in the unreacted part 11a of the alloy film 11 is decreased to, for example, 3% as compared to that at the time of deposition (4%), and thus the concentration of Pt in the metal silicide layer 41a is increased by the above decrease (for example, by 7%), for example, to be 11%. This is because the decrease in concentration of Pt (1%×7) in the entire unreacted part 11a of the alloy film 11 leads to the increase in concentration of Pt (+7%) in the metal silicide layer 41a. In comparison with the cases of FIGS. 38A and 38B, in the case of FIG. 38D, since the thickness of the unreacted part 11a of the alloy film 11 is large, the decrease in concentration of Pt in the entire unreacted part 11a becomes large, which leads to the increase in concentration of Pt in the metal silicide layer 41a.

In the models for explanation with reference to FIGS. 37 and 38, when the excess alloy film ratios R3s are 0, 1, 3, and 7, the concentrations of Pt in the metal silicide layers 41a are 4%, 5%, 7%, and 11%, respectively. The concentration of Pt in the layer 41a after the second heat treatment is the same as that of Pt in the metal silicide layer 41a. In the models explained in FIGS. 37 and 38, when the excess alloy film ratios R3s are 0, 1, 3, and 7, the concentrations of Pt in the metal silicide layers 41b are 4%, 5%, 7%, and 11%, respectively. Thus, the graph of FIG. 35 described above is closely analogous to the result obtained from the models explained in FIGS. 37 and 38, and can be almost explained by the models explained in FIGS. 37 and 38. The concentration of Pt in the metal silicide layer 41b is the rate of Pt included in metal elements forming the metal silicide layer 41b, and corresponds to a value of y provided when the metal silicide layer 41b is represented as $Ni_{1-y}Pt_ySi$ (which is obtained by multiplying the value of y by 100 when represented in percentage).

Accordingly, as can be seen from FIGS. 35 to 38, as the excess alloy film ratio R3 in the first heat treatment is increased (that is, as the reaction rate R1 is decreased), the rate of the first metal element M included in the metal elements (the sum of the Ni and first metal element M) forming the metal silicide layer 41b (the value of y provided when the metal silicide layer 41b is represented as $Ni_{1-y}M_ySi$) can be enhanced. In order to enhance the rate of the first metal element M included in the metal elements forming the metal silicide layer 41b, it is preferable that the first thermal treatment in step S3 is performed so as to satisfy the above-mentioned first condition and second condition, and that the excess alloy film ratio R3 (or the above-mentioned reaction rate R1) in the first heat treatment is controlled.

That is, in this embodiment, the first heat treatment in step S3 is performed so as to satisfy the first condition and the second condition, so that the excess alloy film ratio R3 in the first heat treatment is larger than zero (R3>0), and the reaction rate R1 is less than 100% (R1≦100). The rate of the first metal element M included in the metal elements (the sum of the Ni and first metal element M) forming the metal silicide layer 41b (that is, the value of y provided when the metal silicide layer 41b is represented by $Ni_{1-y}M_ySi$) can be enhanced (y>x) as compared to the rate of the first metal element M included in the alloy film 11 (that is, the value of x provided when the alloy film 11 is represented as a $Ni_{1-x}M_x$ alloy film).

Further, in this embodiment, the first heat treatment is preferably performed in step S3 in such a manner that the excess alloy film ratio R3 in the first heat treatment is equal to or more than 0.25 (R3≧0.25) (that is, in such a manner that the reaction rate R1 is equal to or less than 80%). Moreover, the first heat treatment is more preferably performed in step S3 in such a manner that the excess alloy film ratio R3 in the first heat treatment is equal to or more than 0.25 (R3≧1) (that is, in such a manner that the reaction rate R1 is equal to or less than 50%). Thus, the rate of the first metal element M included in the metal elements forming the metal silicide layer 41b (the value of y provided when the metal silicide layer 41 is represented as $Ni_{1-y}M_ySi$) can be securely enhanced.

The phrase of the excess alloy film ratio R3 in the first heat treatment of 0.25 or more (R3≧0.25) means that the thickness tn2 of the unreacted part 11a of the alloy film 11 in performing the first heat treatment is 0.25 times or more as large as the thickness tn3 of the reacted part 11b of the alloy film 11 (that is, tn2≧tn3×0.25) based on the relationship of R3=tn2/tn3. In this case, the thickness tn1 of the alloy film 11 is 1.25 times or more as large as the thickness tn3 of the reacted part 11b of the alloy film 11 (that is, tn1=tn2+tn3≧tn3×1.25). The phrase of the excess alloy film ratio R3 in the first heat treatment of 1 or more (R3≧1) means that the thickness tn2 of the unreacted part 11a of the alloy film 11 in the first heat treatment is equal to or more than the thickness tn3 of the reacted part 11b of the alloy film 11 (that is, tn2≧tn3) based on the relationship of R3=tn2/tn1. In this case, the thickness tn1 of the alloy film 11 is twice or more as large as the thickness tn3 of the reacted part 11b of the alloy film 11 (that is, tn1=tn2+tn3≧tn3×2).

Therefore, in this embodiment, the above first condition and second condition are satisfied, and further the thickness tn1 of the alloy film 11 is preferably 1.25 times or more as large as the thickness tn3 of the reacted part 11b of the alloy film 11 (that is, tn1≧tn3×1.25), and more preferably twice or more as large as the thickness tn3 (that is, tn1≧tn3×2). Thus, the rate of the first metal element M included in the metal elements forming the metal silicide layer 41b can be surely enhanced.

For example, as can be seen from the graphs of FIGS. 35 and 36, in use of an $Ni_{0.963}Pt_{0.037}$ alloy film as the alloy film 11, the first heat treatment is performed in step S3 such that the excess alloy film ratio R3 of the first heat treatment is equal to or more than 0.25 (in this case, such that the thickness tn1 of the alloy film 11 is 1.25 times or more as large as the thickness tn3 of the reacted part 11b of the alloy film 11), which can result in the concentration of Pt in the metal silicide layer 41b of 4% or more. In other words, when the metal silicide layer 41b is represented as $Ni_{1-y}Pt_ySi$, the formula of y≧0.04 can be satisfied. In use of the $Ni_{0.963}Pt_{0.037}$ alloy film as the alloy film 11, the first heat treatment is performed in step S3 such that the excess alloy film ratio R3 is equal to or more than 1 (R3≧1) (in this case, such that the thickness tn1 of the alloy film 11 is twice or more as large as the thickness tn3 of the reacted part 11b of the alloy film 11), which can result in the concentration of Pt in the metal silicide layer 41b of 5% or more. In other words, when the metal silicide layer 41b is represented as $Ni_{1-y}Pt_ySi$, the formula of y≧0.05 can be satisfied.

When the thickness tn5 of the formed metal silicide layer 41b is excessively thin, the resistance of the metal silicide layer 41b becomes large. The thickness tn3 of the reacted part 11b of the alloy film 11 in the first heat treatment is preferably equal to or more than 5 nm (tn3≧5 nm), and more preferably equal to or more than 7 nm (tn3≧7 nm). Thus, the thickness tn5 of the formed metal silicide layer 41b can be ensured, which can provide the sufficient effect of forming the metal silicide layer 41b having a low resistivity over the source/drain or gate electrode.

As the thickness tn2 of the unreacted part 11a of the alloy film 11 becomes thicker with the thicknesses tn3 of the reacted parts 11b of the alloy film 11 set to the same in the first heat treatment, the rate of the first metal element M included in the metal elements forming the metal silicide layer 41b (the value of y provided when the metal silicide layer 41b is represented by $(Ni_{1-y}M_y)Si$) can be enhanced. However, when the thickness tn2 of the unreacted part 11a of the alloy film 11 is too thick, the thickness tn1 of the alloy film 11 also becomes too thick, which takes much time to deposit the alloy film 11 in step S1, leading to an increase in manufacturing costs of the semiconductor device. Since Pt (platinum) is expensive, when the alloy film 11 is a Ni—Pt alloy film, the extremely large thickness tn2 of the unreacted part 11a of the alloy film 11 leads to an increase in manufacturing costs. The thickness tn2 of the unreacted part 11a of the alloy film 11 in performing the first heat treatment is preferably equal to or less than 200 nm (tn2≦200 nm) and more preferably equal to or less than 100 nm (tn2≦100 nm). Thus, the time required for depositing the alloy film 11 can be saved, and the manufacturing costs of the semiconductor device can be suppressed.

As mentioned above, the addition of the first metal element M (in particular, preferably, Pt) to the metal silicide layers 41a and 41b has advantages in less agglomeration of the formed metal silicide layers 41a and 41b, and in suppression of abnormal growing of a high-resistance $(Ni_{1-y}M_y)Si_2$ phase in the metal silicide layer 41a and 41b. Thus, the first heat treatment is effectively performed in step S3 in such a manner that the rate of the first metal element M included in the metal elements forming the metal silicide layers 41a and 41b (that is, the value of y provided when the metal silicide layer 41a and 41b are presented as $(Ni_{1-y}M_y)_2Si$, and $Ni_{1-y}M_ySi$, respectively) is preferably equal to or more than 4% (y≧0.04), and more preferably equal to or more than 5% (y≧0.05). This arrangement can more securely obtain the above-mentioned advantages.

In this embodiment, the alloy film 11 having the content of the first metal element M of less than 4% (4 atomic %) (that is, x≦0.04 when the alloy film 11 is represented as the $Ni_{1-y}M_y$ alloy film) can be used to form the metal silicide layer 41b containing a high concentration of the first metal element M in this way. Therefore, the above effect is extremely great in the application of this embodiment when an alloy film having the content of the first metal element M of less than 4% (4 atomic %) is used as the alloy film 11. The content of the first metal element M in the alloy film 11 is used for the same meaning as the rate of the first metal element M included in the alloy film 11.

In the first heat treatment in step S3, in order to control the excess alloy film ratio R3 in the first heat treatment, it is necessary to control the thickness tn3 of the reacted part 11b of the alloy film 11 in performing the first heat treatment from the viewpoint of the relationship of R3=tn2/tn3. The thickness tn2 of the unreacted part 11a of the alloy film 11 is a value obtained by subtracting the thickness tn3 of the reacted part 11b of the alloy film 11 from the thickness tn1 of the alloy film 11 in deposition (that is, tn2=tn1−tn3). Thus, by controlling the thickness tn1 of the alloy film 11 in deposition and the thickness tn3 of the reacted part 11b of the alloy film 11 in performing the first heat treatment, the excess alloy film ratio R3 in the first heat treatment can be controlled.

Figure 39:
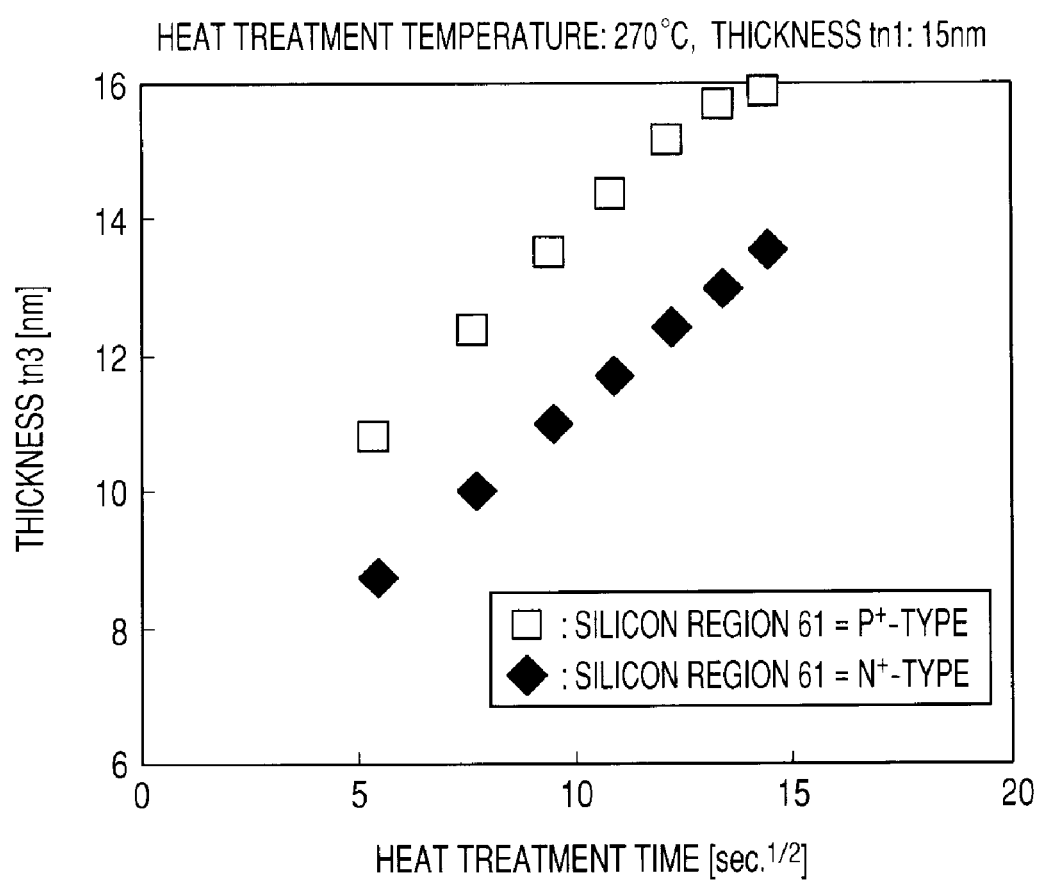
FIG. 39 is a graph showing the thickness of a reacted part of the alloy film in performing a heat treatment corresponding to the first heat treatment.
Figure 40:
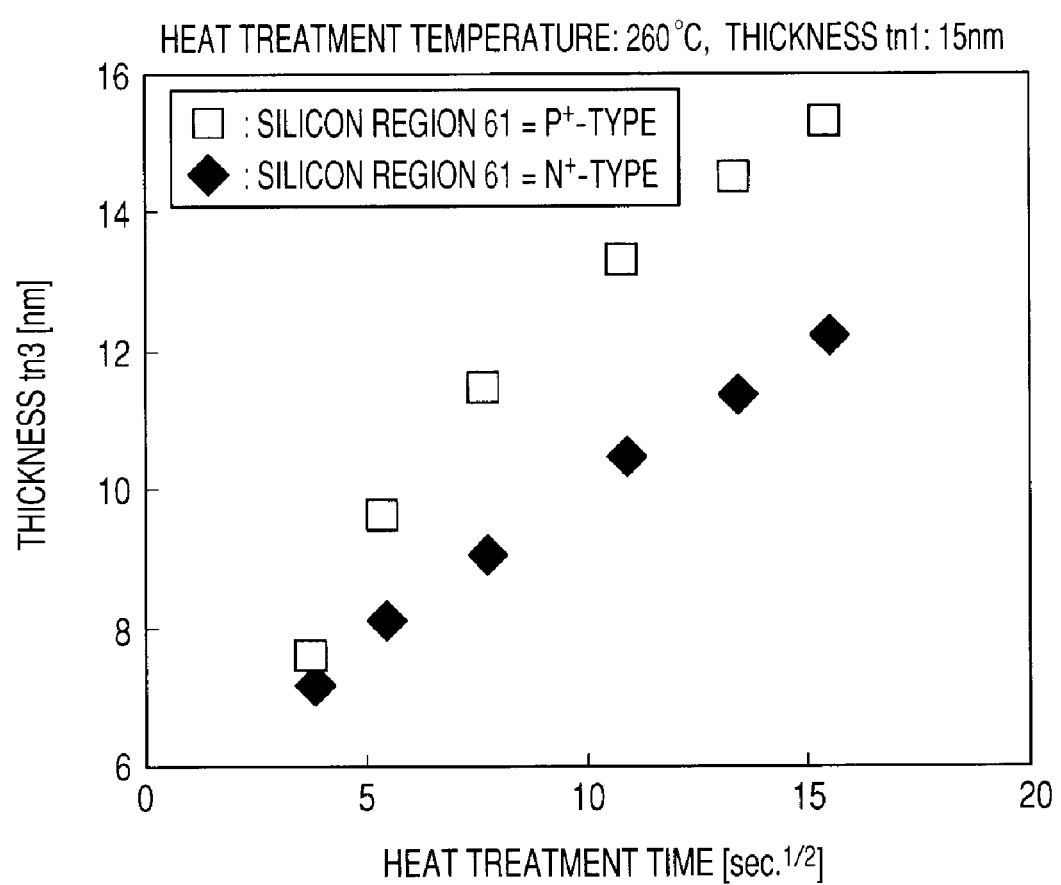
FIG. 40 is a graph showing the thickness of a reacted part of the alloy film in performing a heat treatment corresponding to the first heat treatment.
Figure 41:
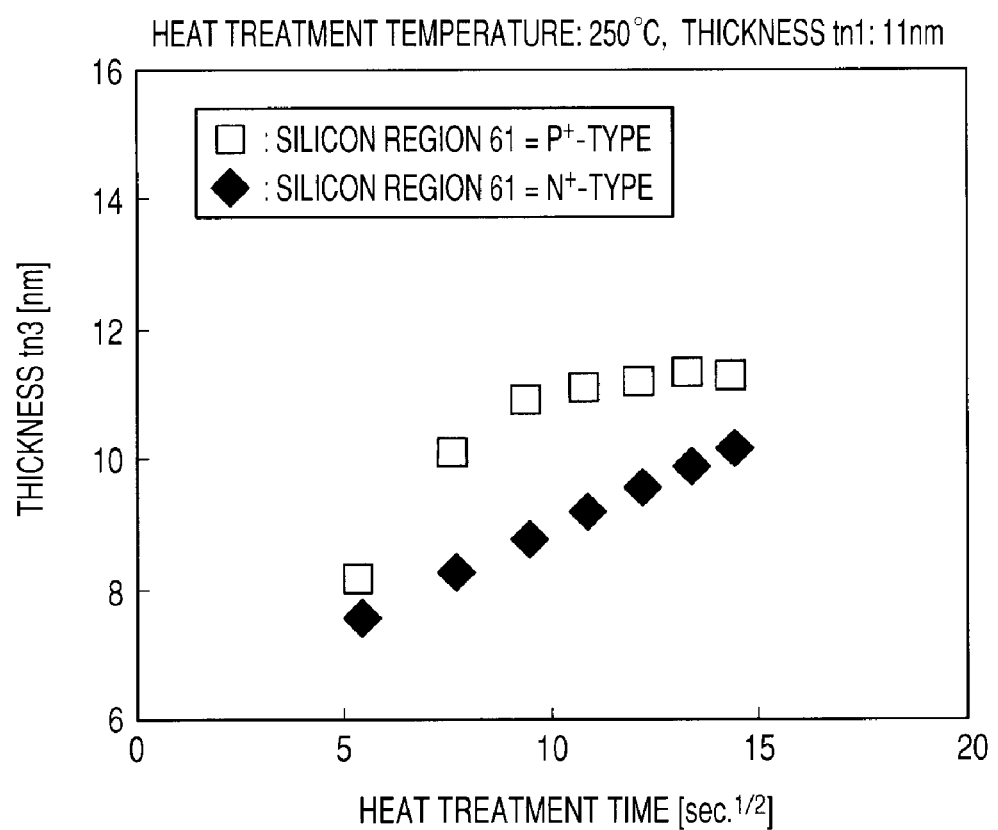
FIG. 41 is a graph showing the thickness of a reacted part of the alloy film in performing a heat treatment corresponding to the first heat treatment.

FIGS. 39 to 41 show graphs of the thicknesses tn3 of the reacted parts of the alloy films 11 each of which is provided by forming a semiconductor region (impurity diffusion layer) corresponding to the silicon region 61 on the main surface of the semiconductor substrate, forming thereon an $Ni_{0.963}Pt_{0.037}$ alloy film corresponding to the alloy film 11, and applying the heat treatment corresponding to the first heat treatment. In the graphs of FIGS. 39 to 41, the longitudinal axis corresponds to the thickness tn3 of the reacted part 11b of the alloy film 11 ($Ni_{0.963}Pt_{0.037}$ alloy film) in performing the first heat treatment. In the graphs of FIGS. 39 to 41, the horizontal axis corresponds to the one-half power of a heat treatment time in the first heat treatment. The graph of FIG. 39 shows the case of the heat treatment temperature of the first heat treatment of 270° C. The graph of FIG. 40 shows the case of the heat treatment temperature of the first heat treatment of 260° C. The graph of FIG. 41 shows the case of the heat treatment temperature of the first heat treatment of 250° C. In any one of FIGS. 39 to 41, the alloy film 11 in use is the $Ni_{0.963}Pt_{0.037}$ alloy film. The thickness tn1 of the $Ni_{0.963}Pt_{0.037}$ alloy film in deposition is 15 nm in the cases of FIGS. 39 and 40. The thickness tn1 of the $Ni_{0.963}Pt_{0.037}$ alloy film in deposition is 11 nm in the case of FIG. 41. The thicknesses tn3s of the reacted parts 11b of the alloy films 11 are examined in the case of the $N^+$-type semiconductor region corresponding to the silicon region 61, and in the case of the $P^+$-type semiconductor region corresponding to the silicon region 61, and then plotted in the respective FIGS. 39 to 41.

In comparison among FIGS. 39 to 41, with the same heat treatment time of the first heat treatment, as the heat treatment temperature is increased, the thickness tn3 of the reacted part 11b of the alloy film 11 becomes large. In contrast, as the heat treatment temperature is decreased, the thickness tn3 of the reacted part 11b of the alloy film 11 becomes small. With the same heat treatment temperature of the first heat treatment, as the heat treatment time becomes longer, the thickness tn3 of the reacted part 11b of the alloy film 11 becomes large. As the heat treatment time becomes shorter, the thickness tn3 of the reacted part 11b of the alloy film 11 becomes small. Thus, by adjusting the heat treatment temperature and time of the first heat treatment, the thickness tn3 of the reacted part 11b of the alloy film 11 can be controlled. Adjustment of the thickness tn1 of the alloy film 11 in deposition and the heat treatment temperature and time of the first heat treatment can control the excess alloy film ratio R3 in the first heat treatment.

When the heat treatment temperature $T_1$ of the first heat treatment in step S3 is too low, the time required for the first heat treatment becomes longer, and the manufacturing time for the semiconductor device also becomes longer, which results in low throughput of the semiconductor device. Thus, in this embodiment, the heat treatment temperature $T_1$ of the first heat treatment in step S3 is more preferably equal to or more than 200° C. ($T_1 \geq 200$), while satisfying the first condition and the second condition. Thus, the time required for the first heat treatment in step S3 can be reduced, and the manufacturing time of the semiconductor device is suppressed, which can prevent the decrease in throughput of the semiconductor device.

As described above, the heat treatment temperature $T_1$ of the first heat treatment is lower than the temperature $T_3$ ($T_1 < T_3$) at which a diffusion coefficient of Ni into the silicon region 61 is identical to a diffusion coefficient of the first metal element M into the silicon region 61 (note that when the first metal element M is Pt, $T_3 = T_2$). Thus, the first metal element M is diffused in advance of Ni from the alloy film 11 into the silicon region 61 in the first heat treatment. However, it is more preferable that a difference ($T_3 - T_1$) between the above-mentioned temperature $T_3$ (for the first metal element M of Pt, $T_3 = T_1$) and the process temperature $T_1$ of the first heat treatment in step S3 is assured to some degrees so as to diffuse the first metal element M in advance of Ni as much as possible from the alloy film 11 into the silicon region 61 in the first heat treatment. Thus, the treatment temperature $T_1$ of the first heat treatment in step S3 is preferably lower than the above temperature $T_3$ by 5° C. or more ($T_1 \leq T_3 - 5°$ C.), and more preferably lower than the above temperature $T_3$ by 9° C. or more ($T_1 \leq T_3 - 9°$ C.). When the alloy film 11 is the Ni—Pt alloy film, the treatment temperature $T_1$ of the first heat treatment in step S3 is preferably lower than the above temperature $T_2$ by 5° C. or more ($T_1 \leq T_2 - 5°$ C.). The treatment temperature $T_1$ of the first heat treatment in step S3 is preferably lower than the above temperature $T_2$ by 9° C. or more ($T_1 \leq T_2 - 9°$ C.). In this way, in the first heat treatment, the first metal element M can be diffused from the alloy film 11 into the silicon region 6 in advance of Ni.

Figure 42:
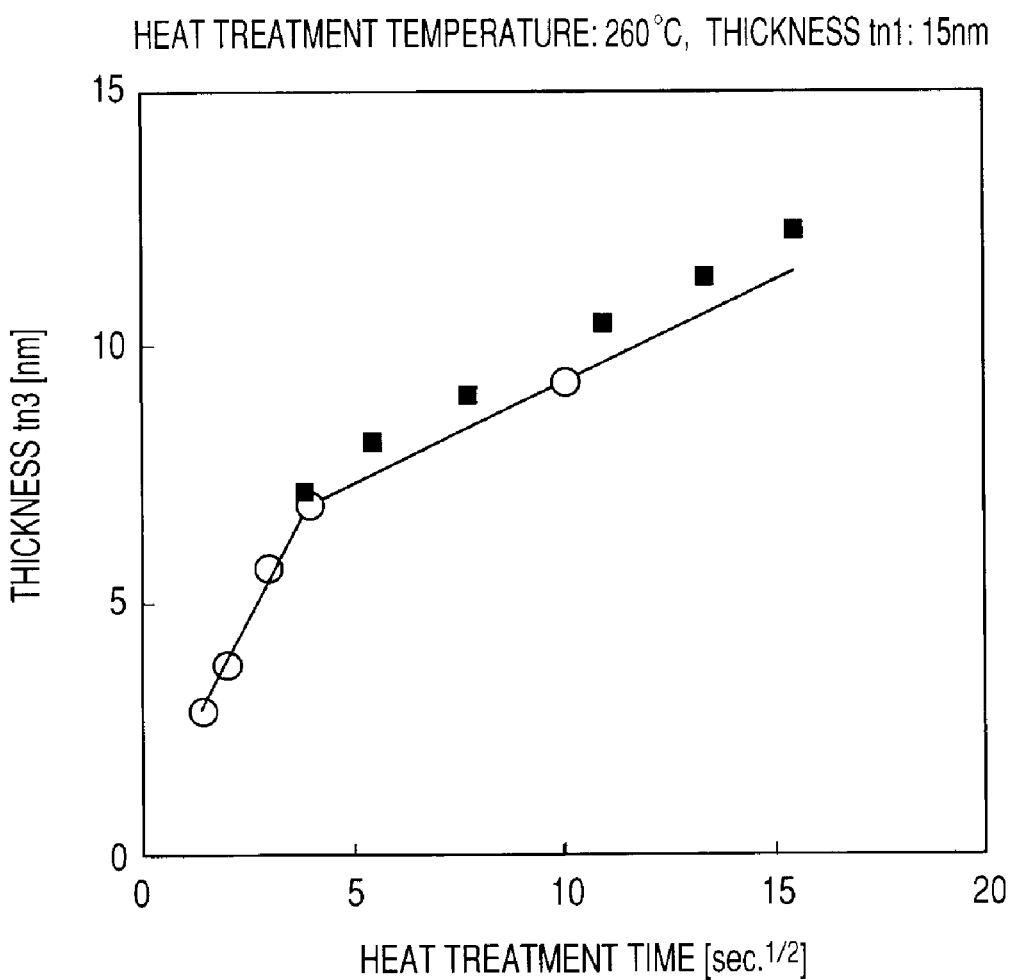
FIG. 42 is a graph showing the thickness of a reacted part of the alloy film in performing a heat treatment corresponding to the first heat treatment.

FIG. 42 is the same kind of graph as FIG. 40 described above. FIG. 42 is the plot showing the case where the silicon region 61 in FIG. 40 is the N+-type semiconductor region by a black rectangle. Also, FIG. 42 shows open circles showing the following case. That is, the N+-type semiconductor region is formed in a large area on the entire main surface of the semiconductor wafer, a $Ni_{0.963}Pt_{0.037}$ alloy film (corresponding to the alloy film 11) is deposited thereon in a thickness of 15 nm, and then the heat treatment corresponding to the first heat treatment is performed at 260° C.

As shown in FIG. 42, in a range of the heat treatment time of less than 20 seconds where the amount of consumption of the $Ni_{0.963}Pt_{0.037}$ alloy film (corresponding to the thickness tn3 of the reacted part 11b) is small, an interface reaction (interface diffusion control) is limited, resulting in a large diffusion coefficient (as an inclination of the graph of FIG. 41 is increased, the diffusion coefficient becomes larger). In contrast, in the range of the heat treatment time of 20 seconds or more where the consumption amount of the $Ni_{0.963}Pt_{0.037}$ alloy film (corresponding to the thickness tn3 of the reacted part 11b) is large, bulk diffusion is limited, resulting in a small diffusion coefficient (as an inclination of the graph of FIG. 41 is decreased, the diffusion coefficient becomes smaller). The heat treatment time of the first heat treatment is preferably not the time for the interface diffusion control, but the time for the bulk diffusion control (in the case of FIG. 42, 20 seconds or more).

Figure 43:
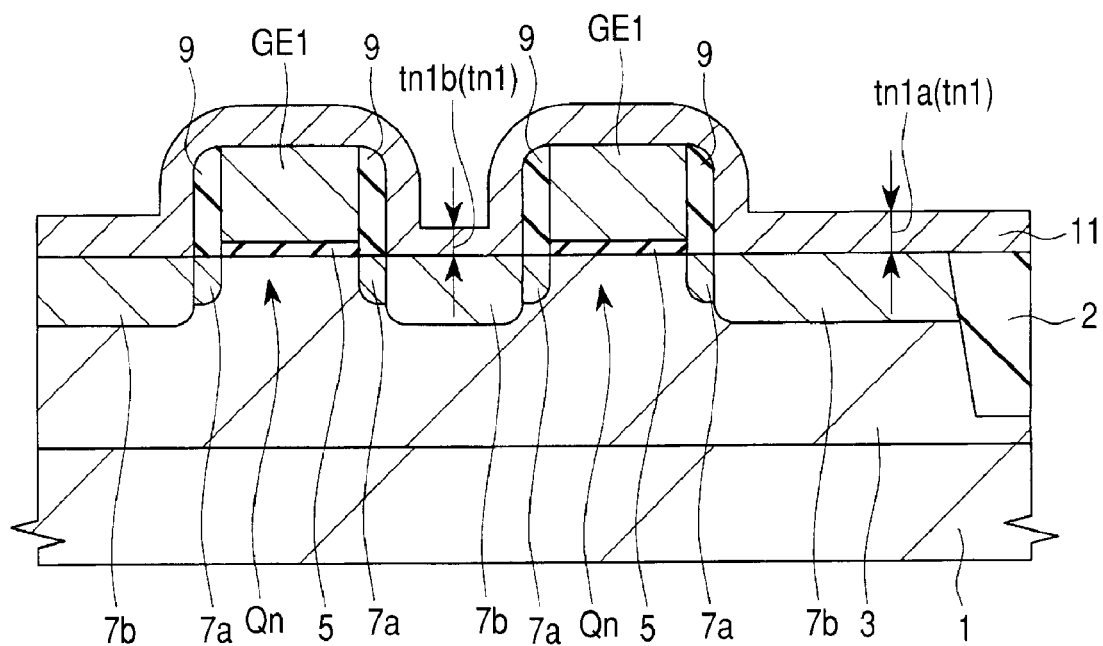
FIG. 43 is a cross-sectional view of a main part of the semiconductor device in the manufacturing procedure thereof (on the stage where the alloy film is formed) in the embodiment of the invention.

The first heat treatment is performed in step S3 so as to satisfy the above first and second conditions thereby to provide the following effects, which will be described below in relation to FIG. 43. FIG. 43 is a cross-sectional view of a main part showing the stage on which the alloy film 11 is formed in step S1.

The formation thickness (corresponding to the above thickness tn1) of the formed alloy film 11 which is a nickel alloy film depends on patterns of an underlayer. In a small pitch pattern with a small spacing between the adjacent patterns, coverage of the alloy film 11 is poor, resulting in the thin alloy film 11, as compared to a wide pitch pattern with a large spacing between the adjacent patterns. For example, as shown in FIG. 43, the formation thickness (deposition thickness) tn1b of the alloy film 11 in an area between the adjacent gate electrodes GE1s with a small interval therebetween is thinner than the formation thickness (deposition thickness) tn1a of the alloy film 11 in other regions (that is, tn1b<tn1a). When the heat treatment is performed in such a state to cause a silicide reaction such that the reaction rate R1 of the reaction between the alloy film 11 and the n+-type semiconductor region 7b is 100%, the formed metal silicide layer reflects the formation thickness of the alloy film 11. The metal silicide layer is thickly formed at an area where the thick alloy film 11 has been formed. The metal silicide layer is also thinly formed at an area where the thin alloy film 11 has been formed. For example, in the area between the adjacent gate electrodes GE1s with the small gap therebetween, the formation thickness of the alloy film 11 is thin as compared to other areas, which causes the metal silicide layer to be thinly formed. Variations in thickness of the metal silicide layer can lead to variations in property of the MISFET. Thus, it is desired that the thicknesses of the metal silicide layers are the same as much as possible. A $Ni_{1-y}M_ySi_2$ phase tends to grow abnormally when the metal silicide layer is thin, which can induce variations in resistance of the metal silicide layer or an increase in leak current. From this point, it is desired to reduce variations in thickness of the metal silicide layer.

In contrast, in this embodiment, the first heat treatment is performed in step S3 so as to satisfy the second condition. Thus, the thickness tn3 of the reacted part 11b of the alloy film 11 is the same or constant over an area of the alloy film 11 in a large formation thickness and an area of the alloy film 11 in a small formation thickness without reflecting a difference in formation thickness (deposition thickness) of the alloy film 11. That is, the alloy film 11 has a thin formation thickness in the area between the adjacent gate electrodes with the small gap therebetween as compared with other areas, but the alloy film 11 does not react in the entire thickness. The thickness tn3 of the reacted part 11b of the alloy film 11 in the first heat treatment in step S3 is the same or constant over one area between the adjacent gate electrodes with the small gap therebetween and over other areas.

For this reason, it is necessary to thickly deposit the alloy film 11 in step S1 such that the formation thickness (deposition thickness) of the alloy film 11 is larger than the thickness tn3 of the reacted part 11b of the alloy film 11 in the first thermal treatment in step S3 (that is, tn1b>tn3) even at the area where the alloy film 11 may be formed thinly. In other words, the alloy film 11 is deposited at any area of the main surface of the semiconductor substrate 1 in step S1 such that the thickness tn1 of the alloy film 11 on the silicon region 61 is larger than the thickness tn3 (tn1>tn3) of the reacted part 11b of the alloy film 11 in the first heat treatment in step S3. Specifically, even in the small pitch pattern (in the area between the adjacent gate electrodes with the small gap) to induce the thin alloy film 11, the alloy film 11 is deposited in step S1 such that the thickness tn1 of the alloy film 11 (for example, the above tn1b) is larger than the thickness tn3 (tn1>tn3, for example, tn1b>tn3) of the reacted part 11b of the alloy film 11 in the first heat treatment in step S3. Thus, the reaction rate R1 of reaction between the alloy film 11 in the first heat treatment in step S3 and the silicon region 61 is less than 100% (R1≦100) at any area of the main surface of the semiconductor substrate 1.

Thus, in this embodiment, even when the formation thickness of the alloy film 11 differs depending on the position, the first heat treatment is performed in step S3 so as to satisfy the first condition and the second condition, so that the thickness tn4 of the formed metal silicide layer 41a can be constant over the area of the alloy film 11 in a large formation thickness and an area of the alloy film 11 in a small formation thickness. Therefore, the thickness tn5 of the metal silicide layer 41b can be the same or constant over the areas. Thus, variations in thickness of the metal silicide layers 41b can be reduced, which can also reduce variations in property of the MISFET. Since the variations in thickness of the metal silicide layer 41b can be reduced, and the metal silicide layers 41b can have the same thickness as much as possible, the abnormal growing of $Ni_{1-y}M_ySi_2$ phase can be suppressed, which can reduce variations in resistance of the metal silicide layer 41b, and the increase of leak current. Therefore, the reliability of the semiconductor device can be improved.

In this embodiment, the barrier film 12 is formed on the alloy film 11 in step S2, but the unreacted part 11a of the alloy film 11 remains on the metal silicide layer 41a in the first heat treatment in step S3, and can serve as a protective film (antioxidant film). That is, since the unreacted part 11a of the alloy film 11 remains in the first heat treatment, even when the surface of the alloy film 11 is exposed in the first heat treatment, the exposure does not have an adverse influence on the reaction between the alloy film 11 and the silicon region 61. Thus, the formation step of the barrier film 12 in step S2 can be omitted below. In this case, after forming the alloy film 11 in step S1, the first heat treatment is performed in step S3 without forming the barrier film 12. Then, the unreacted part of the alloy film 11 is removed from the alloy film 11 in step S4, and the second heat treatment is performed in step S5.

Figure 44:
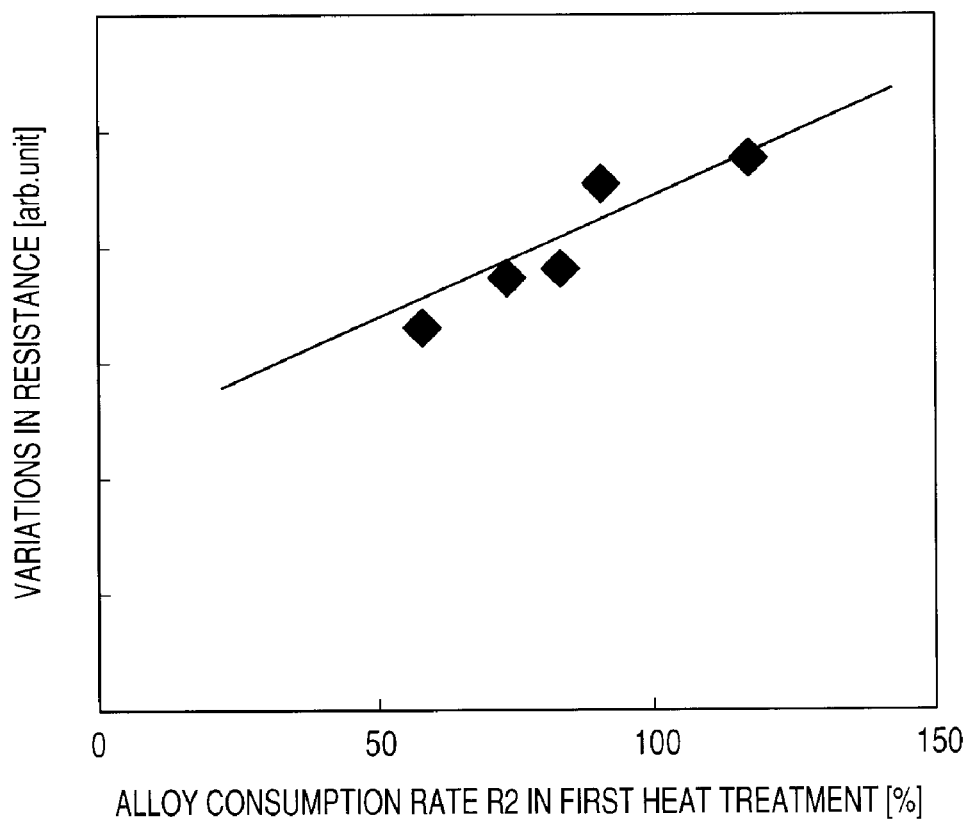
FIG. 44 is a graph showing variations in resistance of a metal silicide layer when the metal silicide layer is formed.

FIG. 44 is a graph showing variations in resistance of the metal silicide layer in forming the metal silicide layer corresponding to the metal silicide layer 41b. In the graph of FIG. 44, the horizontal axis corresponds to the above-mentioned alloy film consumption rate R2 of the first heat treatment. Also, in the graph of FIG. 44, the longitudinal axis shows corresponding to variations in resistance of the formed metal silicide layer (corresponding to the metal silicide layer 41b) in arbitrary units. In the case shown in FIG. 44, a Ni—Pt alloy film is used as the alloy film 11, and the first heat treatment is performed so as to satisfy the first condition.

As can be seen from the graph of FIG. 44, when the alloy film consumption rate R2 in the first heat treatment is 100% or more, variations in resistance of the formed metal silicide layer becomes larger. Like this embodiment, by decreasing the alloy film consumption rate R2 in the first heat treatment (to less than 100%), variations in resistance of the formed metal silicide layer can be reduced. This is because, when the alloy film consumption rate R2 in the first heat treatment is decreased (to less than 100%), the first heat treatment satisfies the first condition and the second condition, thereby increasing the concentration of Pt in the metal silicide layer, which can suppress abnormal growing of the high-resistance $Ni_{1-y}M_ySi_2$ phase. The decrease in alloy film consumption rate R2 in the first heat treatment (to less than 100%) suppresses the excessive growing of crystalline grains in the metal silicide layer because an excess amount of heat is not applied thereto (see, for example, SEM photographs of FIGS. 25 to 33, and FIG. 34), which also serves to reduce variations in resistance of the formed metal silicide layer.

Therefore, like this embodiment, the first heat treatment is performed in step S3 so as to satisfy the first condition and the second condition, which can reduce variations in resistance of the formed metal silicide layer 41b. Thus, the reliability of the semiconductor device can be improved.

Figure 45:
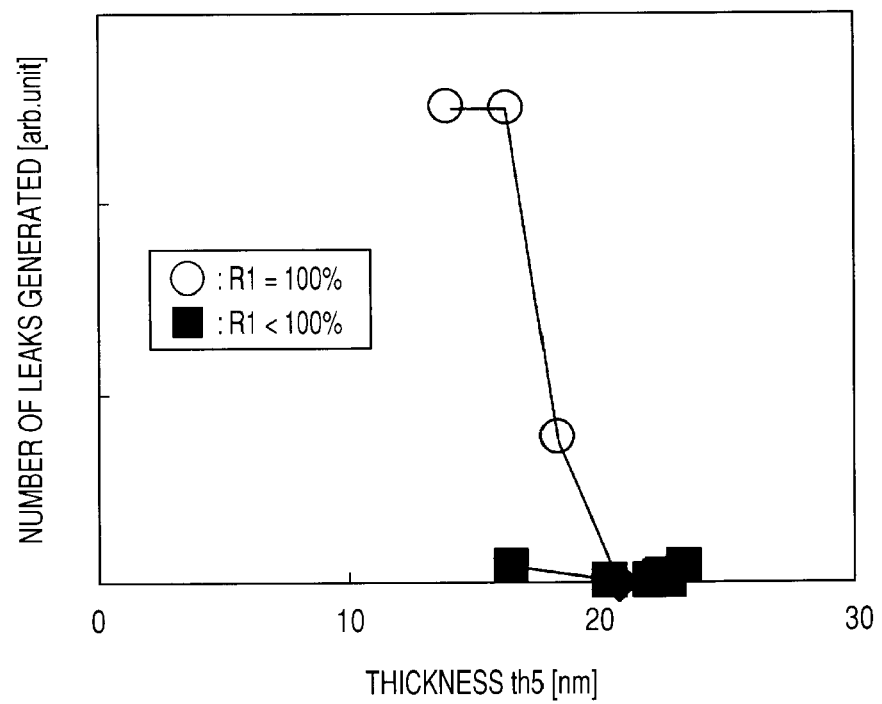
FIG. 45 is a graph showing the number of leaks generated when the metal silicide layer is formed on a source/drain region of a MISFET.
Figure 46:
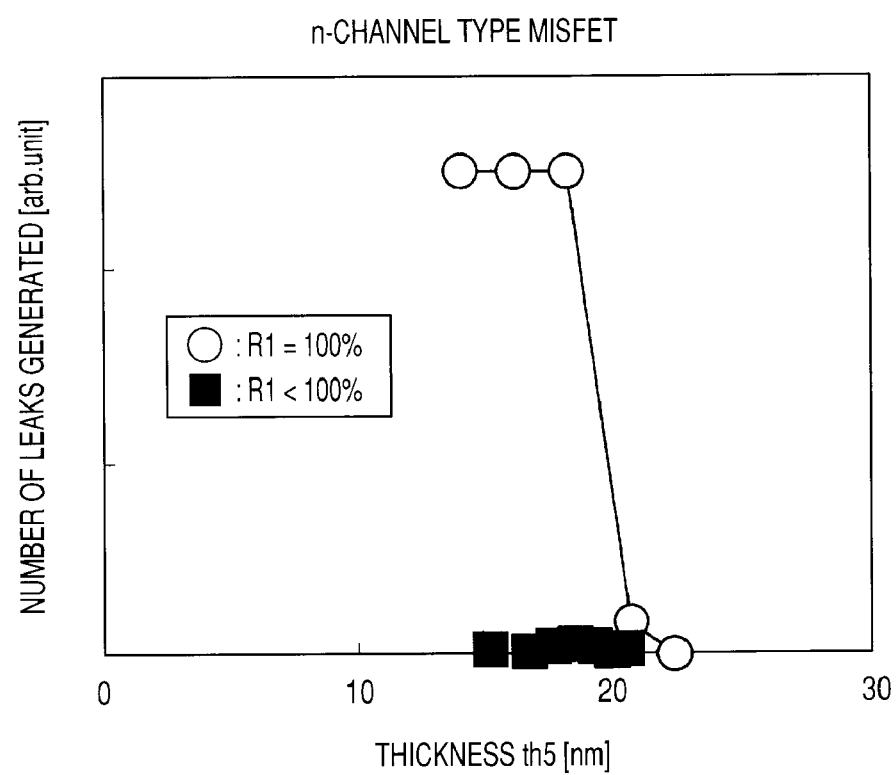
FIG. 46 is a graph showing the number of leaks generated when the metal silicide layer is formed on a source/drain region of a MISFET.

FIGS. 45 and 46 are graphs showing the number of leaks generated when the metal silicide layer corresponding to the metal silicide layer 41b is formed at the source/drain region of the MISFET. In the graphs of FIGS. 45 and 46, the horizontal axis corresponds to the thickness tn5 of the formed metal silicide layer (corresponding to the metal silicide layer 41b). In the graph of FIGS. 44 and 45, the number of generated leaks on the longitudinal axis corresponds to the number of MISFETs in which junction leaks of a prescribed value or more are generated, and are indicated in arbitrary units. In the case shown in FIG. 44, a Ni—Pt alloy film is used as the alloy film 11, and the first heat treatment is performed so as to satisfy the first condition. The graph of FIG. 45 shows the case of the p-channel MISFET, and the graph of FIG. 46 shows the case of the n-channel MISFET. The case of the reaction rate R1 of 100% in the first heat treatment is indicated by an open circle (○), and the case of the reaction rate R1 of less than 100% in the first heat treatment is indicated by a black rectangle (■). The mark satisfying the second condition is the black rectangle indicative of the reaction rate R1 of less than 100%.

The graphs of FIG. 45 and FIG. 46 show that for the reaction rate R1 of 100% in the first heat treatment, as the thickness tn5 of the formed metal silicide layer becomes smaller, the number of generated leaks is increased. This is because the thin metal silicide layer allows the $Ni_{1-y}M_ySi_2$ phase to abnormally grow, which leads to an increase of leak current.

In contrast, like this embodiment, as shown in the graphs of FIGS. 45 and 46, for the reaction rate R1 in the first heat treatment of less than 100%, even when the thickness tn5 of the formed metal silicide layer (metal silicide layer 41b) becomes thin, the number of generated leaks is not increased. That is, the generation of leaks can be suppressed regardless of the thickness t5 of the metal silicide layer (metal silicide layer 41b). This is because, when the reaction rate R1 of the first heat treatment is less than 100%, the first heat treatment satisfies the first and second conditions thereby to increase the concentration of Pt in the metal silicide layer, and also to suppress the abnormal growing of the $Ni_{1-y}M_ySi_2$ phase, which can prevent increase in leak current due to the abnormal growing of the $Ni_{1-y}M_ySi_2$ phase. Accordingly, like this embodiment, the first heat treatment is performed in step S3 so as to satisfy the first condition and the second condition thereby to enable prevention of the increase in leak current. Thus, the reliability of the semiconductor device can be improved.

In order for the first heat treatment in step S3 to satisfy the above first condition, it is necessary to set the temperature of the heat treatment to less than 279° C., for example, in use of an Ni—Pt alloy film as the alloy film 11. Thus, a heater is more preferably used for the first heat treatment in step S3, which enables the temperature control at such a temperature, so that the metal silicide layer 41a can be more appropriately formed in the first heat treatment.

In the first heat treatment of step S3, the rate of temperature increase is preferably set to 10° C./sec or more, and more preferably to 30 to 250° C./sec. The temperature of the first heat treatment in step S3 is increased by setting the rate of temperature increase preferably to 10° C./sec or more, and more preferably to 30 to 250° C./sec, which causes a silicide reaction to uniformly occur in a plane of a wafer, and can suppress application of the excessive amount of heat in a process of the increase in temperature of the silicide reaction. Thus, the metal silicide layer 41a only in the $(Ni_{1-y}M_y)_2Si$ phase, not containing a $Ni_{1-y}M_ySi_2$ phase, a $Ni_{1-y}M_ySi$ phase, a $(Ni_{1-y}M_y)_3Si$ phase, a $(Ni_{1-y}M_y)_5Si$ phase and the like can be formed more appropriately. That is, the metal silicide layer 41a in the $(Ni_{1-y}M_y)_2Si$ phase with less variations in composition can be formed.

Further, in order to improve the thermal conductivity of an atmosphere of the first heat treatment in step S3, the first heat treatment is applied preferably under a normal pressure filled with inert gas whose thermal conductivity is larger than that of nitrogen, for example, helium (He) gas or neon (Ne) gas, or with atmospheric gas containing nitrogen gas to which inert gas having a higher thermal conductivity than the nitrogen gas is added. For example, the thermal conductivities of nitrogen gas, neon gas, and helium gas at 100° C. are $3.09\times10^{-2}$ $Wm^{-1}K^{-1}$, $5.66\times10^{-1}$ $Wm^{-1}K^{-1}$, and $17.77\times10^{-2}$ $Wm^{-1}K^{-1}$, respectively. The thermal conductivity of the atmosphere for the first heat treatment in step S3 is improved to easily achieve the control of the rate of temperature increase described above.

Figure 47A:
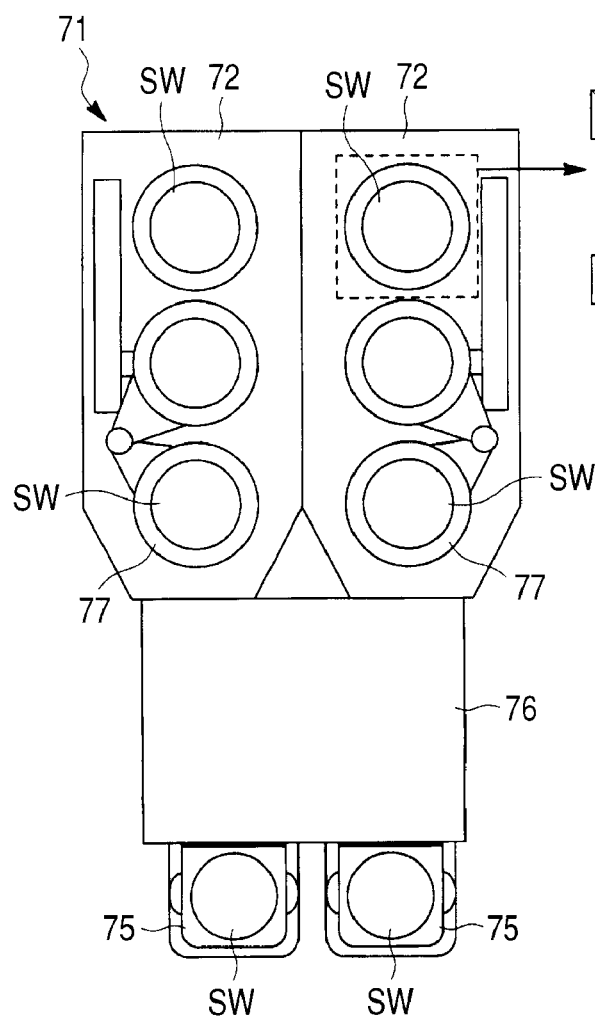
FIG. 47A is an explanatory diagram showing one example of a heat treatment device used in the manufacturing procedure of the semiconductor device in the embodiment of the invention.
Figure 47B:
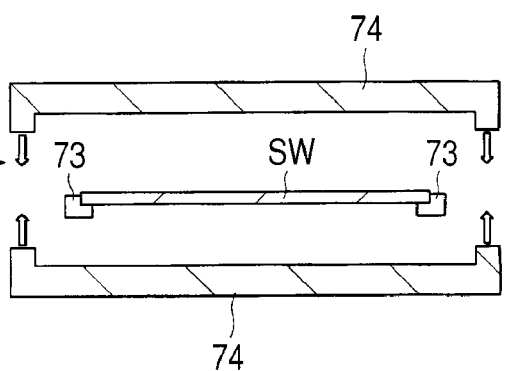
FIG. 47B is an explanatory diagram showing one example of the heat treatment device used in the manufacturing procedure of the semiconductor device in the embodiment of the invention.

FIGS. 47A and 47B are explanatory diagrams showing one example of a heat treatment device (here, a heater 71) used in the first heat treatment in step S3. FIG. 47A is a plan view of an entire structure of the heat treatment device, and FIG. 47B is a cross-sectional view of a main part thereof inside a chamber.

In performing the first heat treatment in step S3, the wafer SW is positioned on a susceptor 73 in the chamber 72 for a process of the heater (heat treatment device) 71. A semiconductor wafer SW corresponds to the above semiconductor substrate 1. The chamber 72 has its inside constantly filled with inert gas (for example, an atmosphere of nitrogen gas to which neon gas is added). Resistance heaters 74 are positioned above and below the wafer SW (on the front and back sides), and the wafer SW is heated by heat transfer from the resistance heaters 74 spaced apart a predetermined distance and sandwiching the wafer SW therebetween. The distance between the wafer SW and the resistance heater 74 is, for example, 1 mm or less. The temperature of the resistance heater 74 is measured with a thermocouple, and the resistance heater 74 is controlled to be at a predetermined temperature. A hole for gas introduction is formed in each resistor heater 74, and the atmospheric gas of the first heat treatment is supplied above and below (toward the front and back sides) of the wafer SW via the holes. The flow of the atmospheric gas and the pressure inside the chamber 72 in the first heat treatment are respectively adjusted, whereby the pressures applied on the front and back sides of the wafer SW are equal to each other to cause the wafer SW to float. Further, the amount of heat transferred to the wafer SW is made constant over the wafer SW, which suppresses variations in temperature in the plane of the wafer SW.

Figure 48A:
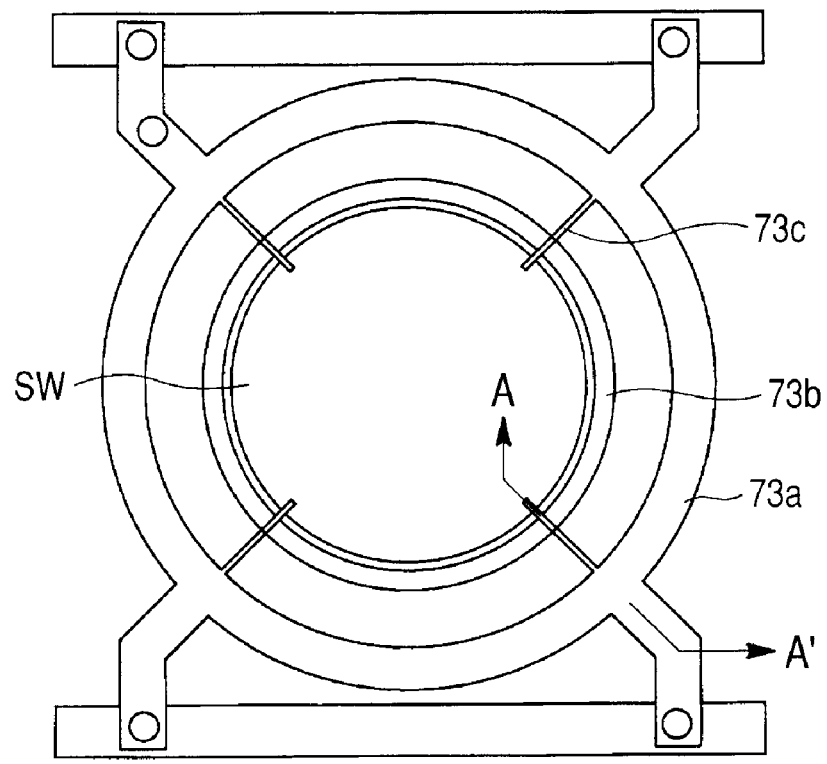
FIG. 48A is an explanatory diagram of a susceptor included in the heat treatment device shown in FIGS. 47A and 47B.
Figure 48B:
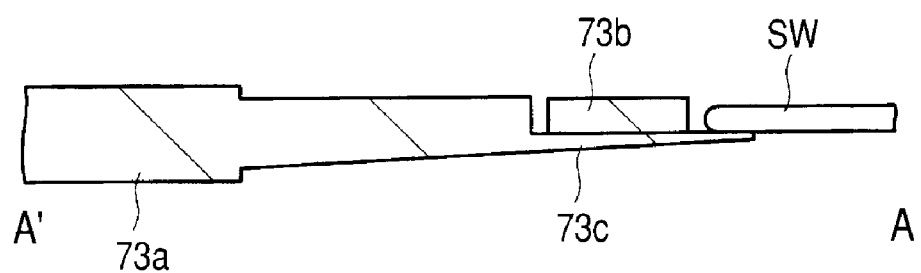
FIG. 48B is an explanatory diagram of the susceptor included in the heat treatment device shown in FIGS. 47A and 47B.

FIGS. 48A and 48B are explanatory diagrams of the susceptor 73 included in the heater 71. FIGS. 48A and 48B are plan view and cross-sectional view of main parts of the susceptor 73 included in the heater 71, respectively. The section taken along the line A-A in FIG. 48A substantially corresponds to FIG. 48B. FIGS. 48A and 48B shows a carrier plate 73a, a guard ring 73b, and support pins 73c. The susceptor 73 are in four-point contact with the wafer SW by use of four support pins 73c provided in the susceptor 73. Thus, the number of contact points between the susceptor 73 and the wafer SW is small, which can suppress a decrease in temperature in the plane of the wafer due to the susceptor 73.

The procedure for the first heat treatment in step S3 using the heater 71 will be described below. First, after hoops 75 are docked with the heater 71, the wafer SW is transferred from the hoop 75 onto a load lock 77 inside the chamber 72 for processing via a chamber 76 for wafer delivery. In order to avoid mixture of outside air (mainly, oxygen) into the chamber 72 for processing, inert gas (for example, nitride gas) is allowed to flow through the inside of the road lock 77 under ambient pressure thereby to exclude the outside air. Subsequently, the wafer SW is transferred from the load lock 77 onto the susceptor 73. Then, the wafer SW is sandwiched between the resistance heaters 74 to be heated. Thereafter, the wafer SW cooled is returned to the load lock 77, and then to the hoop 75 via a chamber 76 for delivery of the wafer.

The heater 71 heats gas between the wafer SW and the resistance heater 74 as a medium by thermal transfer. The temperature of the wafer SW can be increased up to the same temperature as that of the resistance heater 74 at the rate of temperature increase of 10° C./sec or more (for example, at 30 to 250° C./sec), which can suppress the application of excessive amount of heat onto the wafer SW.

In the second heat treatment at step S5 as described above, in order to prevent application of the excessive amount of heat to the metal silicide layers 41a and 41b, it is preferable to set the rate of temperature increase to 10° C./sec or more, and further more preferably 10 to 250° C./sec. Moreover, the second heat treatment is performed in the amount of heat required for converting the metal silicide layer 41a in the $(Ni_{1-y}M_y)_2Si$ phase formed by the first heat treatment in step S3 into the metal silicide layer 41b in the $Ni_{1-y}M_ySi$ phase. Thus, the application of the excessive heat amount of heat to the wafer can be suppressed to cause the uniform silicide reaction and a stabilizing reaction, resulting in the formation of the metal silicide layer 41b in the $Ni_{1-y}M_ySi$ phase with few defects on its surface and with less variations in composition. When the rate of heat increase of 10° C./sec or more can be achieved in the second heat treatment of step S5, any one of a lamp heater or a heater can be used. The heat treatment temperature in the second heat treatment in step S5 is higher than that of the first heat treatment of step S3, and is not in a temperature range of 280° C. or less, which is difficult to control by use of the lamp heater. Thus, the lamp heater can also be used for the second heat treatment of step S5.

Further, in order to improve the thermal conductivity of an atmosphere of the second heat treatment in step S5, the second heat treatment is applied preferably under a normal pressure filled with inert gas whose thermal conductivity is larger than that of nitrogen, for example, helium (He) gas or neon (Ne) gas, or with atmospheric gas containing nitrogen gas to which inert gas (He or Ne) having a higher thermal conductivity than the nitrogen gas is added. The thermal conductivity of the atmosphere for the second heat treatment in step S5 is improved to easily achieve the control of the rate of temperature increase described above.

An RTA process can be used in the second thermal treatment in step S5, where any one of a soak anneal process and a spike anneal process can be used. The soak anneal process is a heat treatment method which involves increasing the temperature of the wafer up to the heat treatment temperature, then holding the wafer at the heat treatment temperature for a certain time, and decreasing the temperature thereof. The spike anneal process is a heat treatment which involves increasing the temperature of the wafer up to the heat treatment temperature for a short time, and then decreasing the temperature of the wafer without holding the heat treatment temperature (where a holding time is zero second). The spike anneal process can reduce the amount of heat applied to the wafer as compared to the soak anneal process. The spike anneal process is performed as the second heat treatment in step S5, and thus can suppress the excessive growing of crystal grains of the metal silicide layers 41a and 41b by the second heat treatment and can also reduce variations in resistance of the metal silicide layer 41b. In contrast, the first heat treatment in step S3 is preferably the soak anneal process because the thickness tn3 of the reacted part 11b of the alloy film 11 can be controlled by the heat treatment time.

In this embodiment, before forming the $n^+$-type semiconductor region 7b and the $p^+$-type semiconductor region 8b, carbon (C) ions are implanted into an area for formation of the $n^+$-type semiconductor region 7b, and germanium (Ge) ions are implanted into an area for formation of the $p^+$-type semiconductor region 8b. Thereafter, n-type impurities (for example, phosphorous (P) ions or arsenic (As) ions) for formation of the $n^+$-type semiconductor region 7b, and p-type impurities (for example, boron (B)) for formation of the $p^+$-type semiconductor region 8b can be implanted. In this way, carbon (C) ions and germanium (Ge) ions are previously implanted, which can suppress the penetration or expansion of the n-type impurities for formation of the $n^+$-type semiconductor region 7b and of the p-type impurities for formation of the $p^+$-type semiconductor region 8b, which impurities are to be ion implanted.

Figure 49:
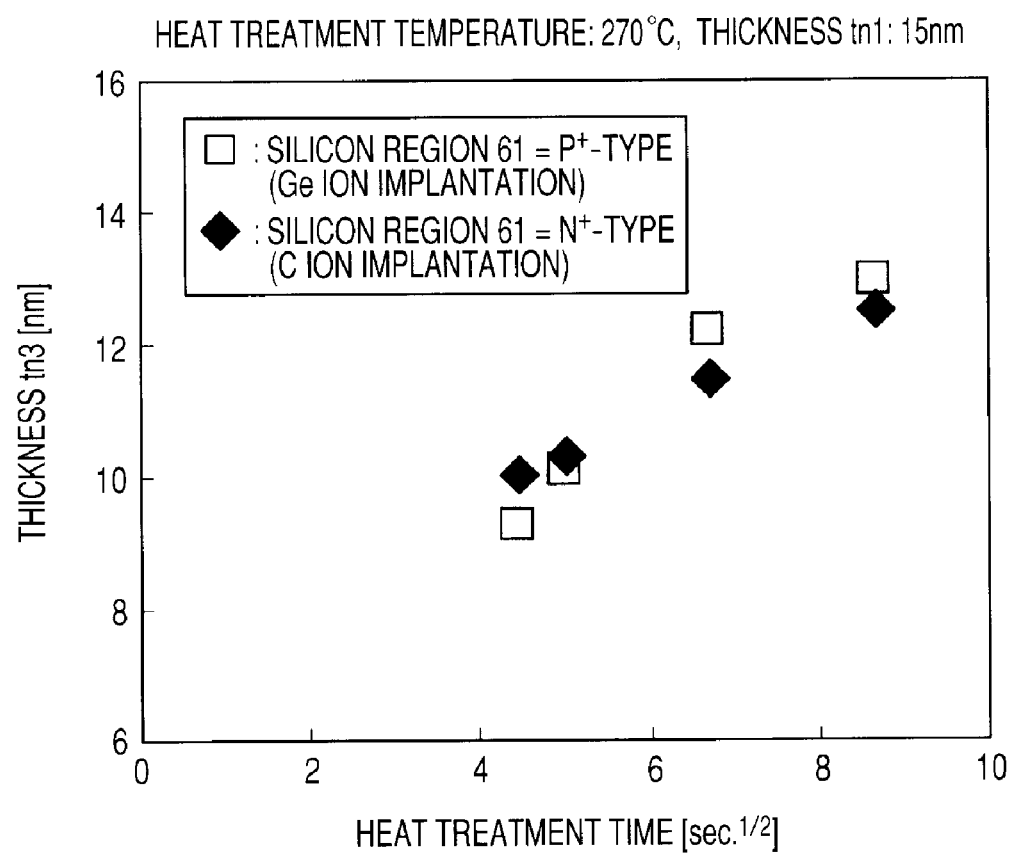
FIG. 49 is a graph showing the thickness of a reacted part of the alloy film in performing a heat treatment corresponding to the first heat treatment.
Figure 50:
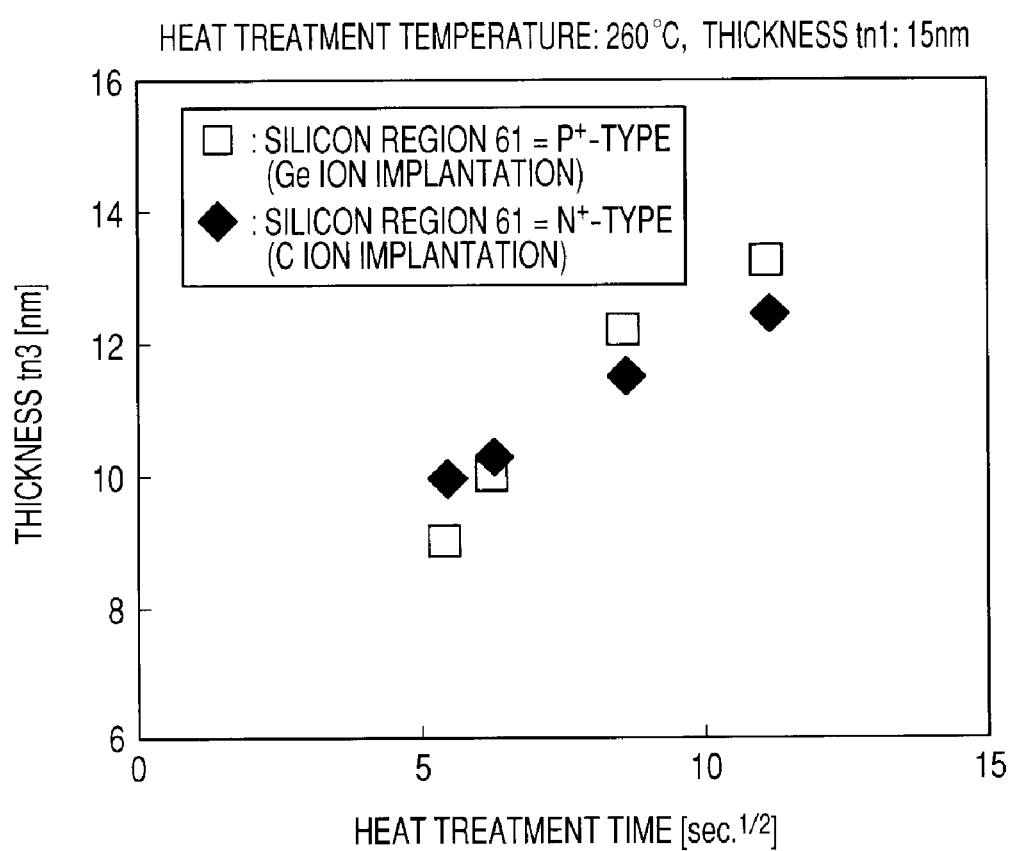
FIG. 50 is a graph showing the thickness of a reacted part of the alloy film in performing a heat treatment corresponding to the first heat treatment.
Figure 51:
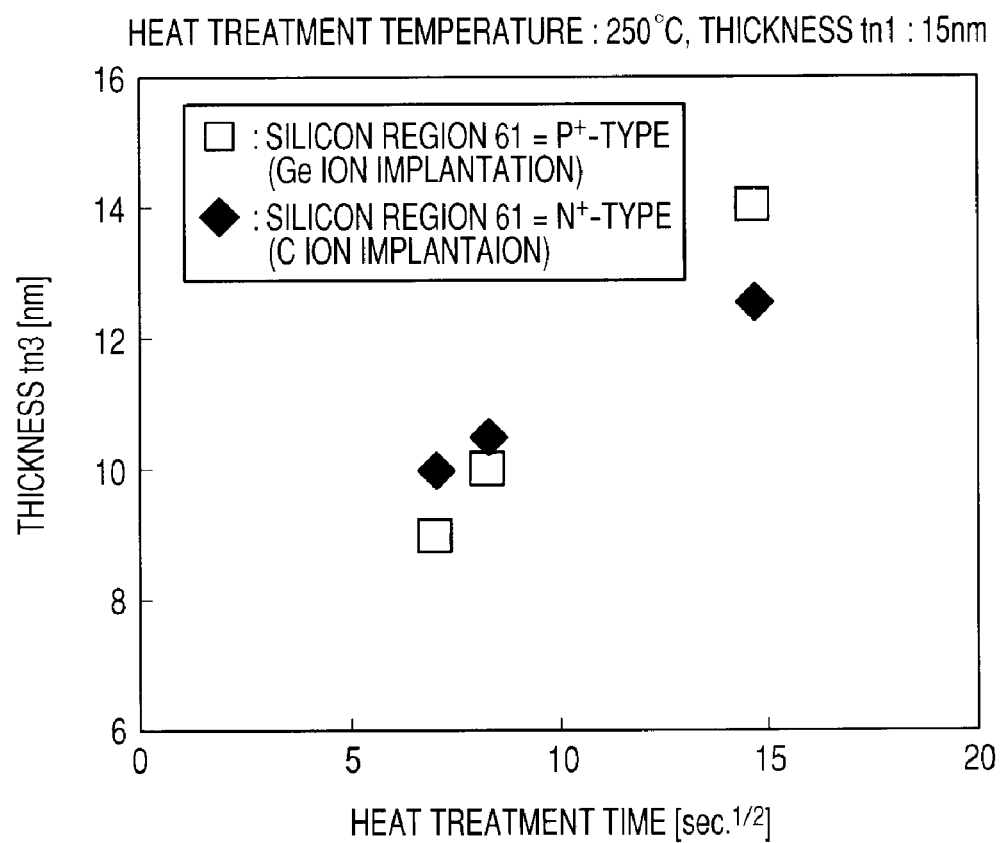
FIG. 51 is a graph showing the thickness of a reacted part of the alloy film in performing a heat treatment corresponding to the first heat treatment.

FIGS. 49 to 51 are graphs showing the thickness tn3 of the reacted part 11b of the alloy film 11. The alloy film is obtained by forming the semiconductor region (impurity diffusion layer) corresponding to the silicon region 61 on the main surface of the semiconductor substrate, forming thereon a $Ni_{0.963}Pt_{0.037}$ alloy film corresponding to the alloy film 11, and applying the heat treatment corresponding to the first heat treatment. Then, FIGS. 49 to 51 correspond to the graphs shown in FIGS. 39 to 41 described above. In the graphs of FIGS. 49 to 51, the longitudinal axis corresponds to the thickness tn3 of the reacted part 11b of the alloy film 11 (here, $Ni_{0.963}Pt_{0.037}$ alloy film) in performing the first heat treatment. In the graphs of FIGS. 49 to 51, the horizontal axis corresponds to the one-half power of a heat treatment time in performing the first heat treatment. The thicknesses tn3s of the reacted parts 11b of the alloy film 11 are examined in the case of the N+-type semiconductor region corresponding to the silicon region 61, and in the case of the P+-type semiconductor region corresponding to the silicon region 61, and then plotted in the respective FIGS. 49 to 51. In the cases of FIGS. 49 to 51, carbon (C) ions are implanted into the semiconductor substrate, and then ions of n-type impurities are implanted thereby to form the n+-type semiconductor region corresponding to the silicon region 61. Further, germanium (Ge) ions are implanted into the semiconductor substrate, and then ions of p-type impurities are implanted thereby to form the p+-type semiconductor region corresponding to the silicon region 61. In contrast, in cases where the above FIGS. 39 to 41 are shown, ion implantation of carbon (C) and germanium (Ge) is not performed. The graph of FIG. 49 corresponds to the case where the heat treatment temperature of the first heat treatment is 270° C. The graph of FIG. 50 corresponds to the case where the heat treatment temperature of the first heat treatment is 260° C. The graph of FIG. 51 corresponds to the case where the heat treatment temperature of the first heat treatment is 250° C. In any one of the cases shown in FIGS. 49 to 51, the thickness tn1 of the $Ni_{0.963}Pt_{0.037}$ alloy film (corresponding to the alloy film 11) in deposition is 15 nm.

As can be seen from comparison between the graphs of FIGS. 39 to 41 and the graphs of FIGS. 49 to 51, the dependency of the thickness tn3 of the reacted part 11b of the alloy film 11 on the heat treatment condition for the first heat treatment slightly differs according to whether or not the carbon (C) ions or germanium (Ge) ions are implanted into the silicon region 61, but the same trend toward the dependency appears. That is, as can be seen from comparison with FIGS. 49 to 51, also when the carbon (C) or germanium (Ge) ions are implanted into the silicon region 61, at the same heat treatment time of the first heat treatment, as the heat treatment temperature is increased, the thickness tn3 of the reacted part 11b of the alloy film 11 is increased. As the heat treatment temperature is decreased, the thickness tn3 of the reacted part 11b of the alloy film 11 is decreased. At the same heat treatment temperature in the first heat treatment, as the heat treatment time becomes longer, the thickness tn3 of the reacted part 11b of the alloy film 11 becomes thicker. As the heat treatment time becomes shorter, the thickness tn3 of the reacted part 11b of the alloy film 11 becomes thinner. Thus, also when the carbon (C) ions or germanium (Ge) ions are implanted into the silicon region 61, adjustment of the heat treatment temperature and/or time in the first heat treatment can control the thickness tn3 of the reacted part 11b of the alloy film 11. Therefore, adjustment of the thickness tn1 of the alloy film 11 in deposition and of the heat treatment temperature and time in the first heat treatment can control the excess alloy film ratio R3 in the first heat treatment.

In the description of this embodiment, the metal silicide layers 41a and 41b are formed on the semiconductor region (7b, 8b) for the source or drain and on the gate electrode (GE1, GE2). In another embodiment, the metal silicide layers 41a and 41b can be formed on the semiconductor regions for the source or drain (on the n+-type semiconductor region 7b and the p+-type semiconductor region 8b) without having the other metal silicide layers 41a and 41b formed on the gate electrodes GE1 and GE2.

As described above, in forming a CMISFET on the semiconductor substrate 1, it is most desirable that the first condition and the second condition are satisfied in both n-channel MISFETQn and p-channel MISFETQp because the metal silicide layers 41b formed in the n-channel MISFETQn and the p-channel MISFETQp in such a state can obtain the above-mentioned various effects. Alternatively, when the above first condition and second condition are satisfied in at least one of the n-channel MISFETQn and the p-channel MISFETQp, the metal silicide layer 41b formed in the MISFET effectively obtains the above-mentioned various effects.

In the description of this embodiment as the best embodiment, the metal silicide layers 41a and 41b are formed on the semiconductor regions for the source or drain (the n+-type semiconductor region 7b and the p+-type semiconductor region 8b) formed over the semiconductor substrate 1. Alternatively, in another embodiment, the metal silicide layers 41a and 41b can be formed on a semiconductor region other than the semiconductor region for the source or drain formed at the semiconductor substrate 1 in the same way as this embodiment. In that case, the use of the forming way of the metal silicide layers 41a and 41b, like this embodiment, can prevent the formation of $Ni_{1-y}M_ySi_2$ part in the formed metal silicide layer, and thus can obtain the effects of reducing the resistance of the metal silicide layer, and of reducing variations in resistance thereof. Like this embodiment, the metal silicide layers 41a and 41b are formed on the semiconductor regions for the source or drain formed on the semiconductor substrate 1 (here, the n+-type semiconductor region 7b and the p+-type semiconductor region 8b). Thus, this embodiment can obtain not only the effect of reducing the resistance of the metal silicide layer 41b and variations in resistance thereof, but also the effects of preventing the abnormal growing the $Ni_{1-y}M_ySi_2$ toward the channel region and of reducing the leak current. Such effects are very great.

Second Embodiment

Figure 52:
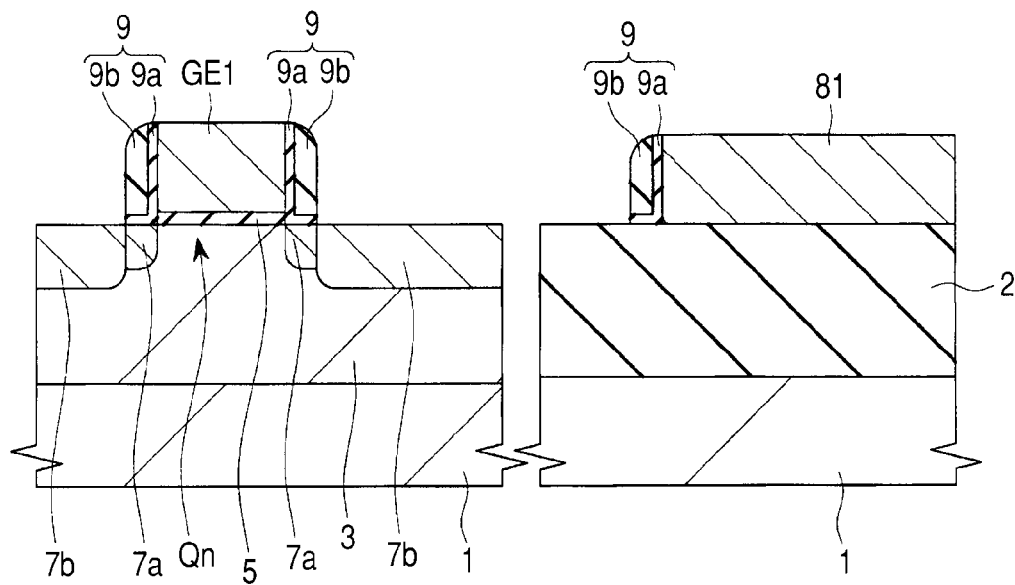
FIG. 52 is a cross-sectional view of a main part of a semiconductor device in a manufacturing procedure of the semiconductor device according to another embodiment of the invention.
Figure 54:
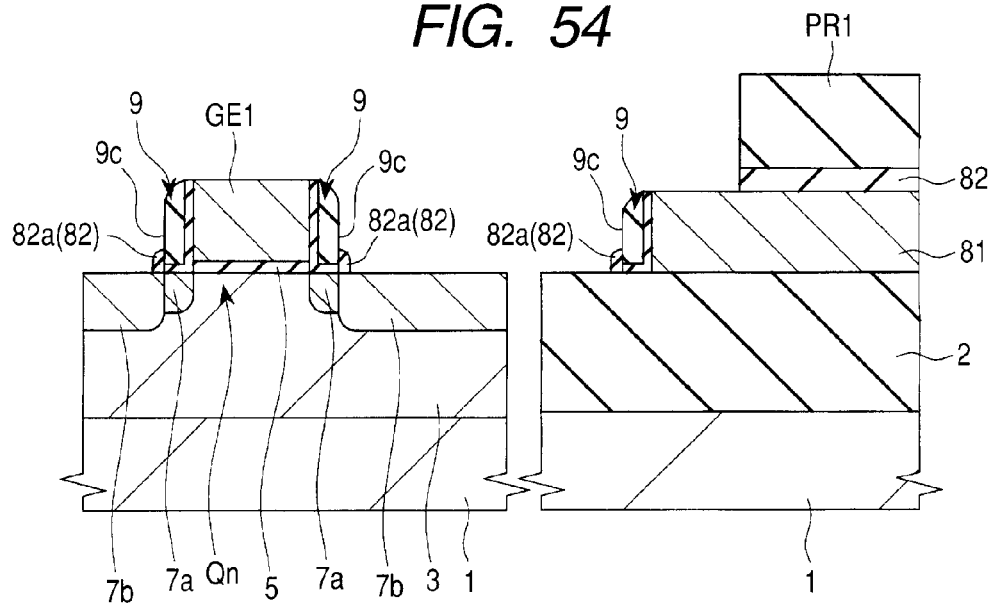
FIG. 54 is a cross-sectional view of a main part of the semiconductor device in the manufacturing procedure thereof, following the step shown in FIG. 53.
Figure 55:
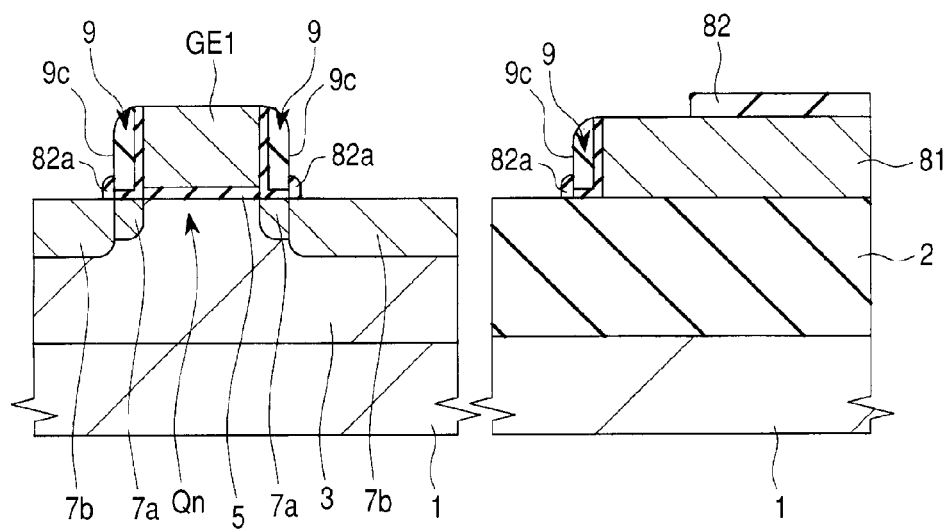
FIG. 55 is a cross-sectional view of a main part of the semiconductor device in the manufacturing procedure thereof, following the step shown in FIG. 54.
Figure 56:
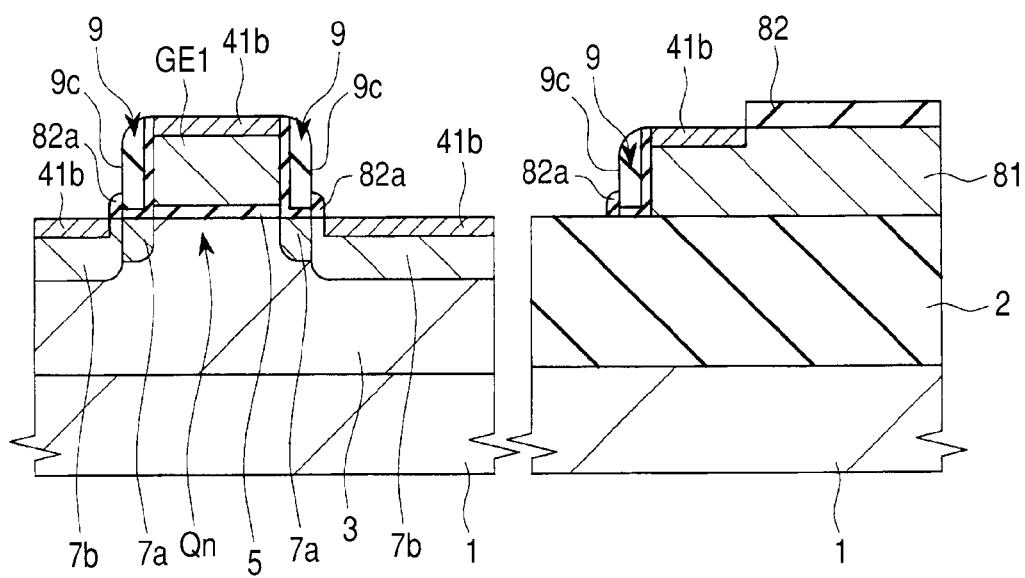
FIG. 56 is a cross-sectional view of a main part of the semiconductor device in the manufacturing procedure thereof, following the step shown in FIG. 55.

FIGS. 52 to 56 are cross-sectional diagrams of main parts of a semiconductor device in a manufacturing procedure thereof in this embodiment. FIG. 52 corresponds to the same process step of the procedure as that shown in FIG. 4. FIG. 56 corresponds to the same process step of the procedure as that shown in FIG. 12.

The same processes as those of the first embodiment described with reference to FIGS. 1 to 4 are performed thereby to obtain the structure of FIG. 52 corresponding to that shown in FIG. 4. The structure of an n-channel MISFETQn shown in FIG. 52 is substantially the same as that described in the first embodiment, and a description thereof will be omitted below. Also, in this embodiment, not only the n-channel MISFETQn, but also the above-mentioned p-channel MISFETQp can be formed like the first embodiment. It is noted that for simplification, the illustration and description of the p-channel MISFETQp will be omitted.

In this embodiment, the silicon film 6 is patterned by a photolithography method and a dry etching method, so that not only the gate electrode GE1, but also a silicon film pattern 81 for a resistance element (polysilicon resistance element) is formed. Thus, the silicon film pattern 81 is comprised of a silicon film in the same layer as that of the gate electrode GE1. The silicon film pattern 81 is formed, for example, at an element isolation region 4, and electrically insulated from the semiconductor substrate 1. Sidewalls 9 are formed by forming a silicon oxide film 9a and a silicon nitride film 9b in turn over the semiconductor substrate 1 so as to cover the gate electrode GE1 and the silicon film pattern 81, and applying anisotropic etching, such as an RIE method, to a lamination of the films 9a and 9b (with the film 9a positioned on a lower layer side, and with the film 9b positioned on an upper layer side). The sidewalls 9 are formed not only on a sidewall of the gate electrode GE1, but also on a sidewall of the silicon film pattern 81.

Figure 53:
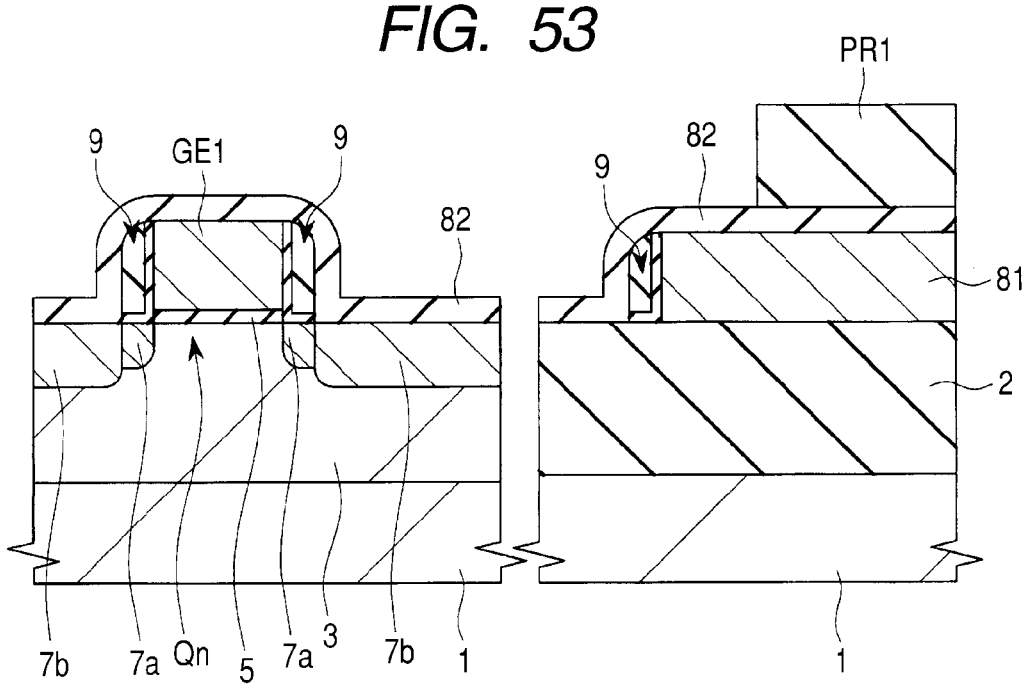
FIG. 53 is a cross-sectional view of a main part of the semiconductor device in the manufacturing procedure thereof, following the step shown in FIG. 52.

In this embodiment, after obtaining the structure shown in FIG. 4, as shown in FIG. 53, an insulating film (second insulating film) 82 is formed so as to cover the gate electrode GE1, the silicon film pattern 81, and the sidewalls 9 on the sidewalls of these elements over the semiconductor substrate 1. The insulating film 82 is comprised of a silicon oxide film, and can be formed, for example, by use of TEOS. The thickness (deposition thickness) of the insulating film 82 can be, for example, in a range of about 10 to 50 nm. The insulating film 82 is formed so as to prevent the formation of the metal silicide layers 41a and 41b in the silicide step at areas not requiring the metal silicide layers 41a and 41b.

After forming the insulating film 82, a photoresist pattern (a resist pattern, a photoresist film, a resist film) PR1 is formed on the insulating film 82 by the photolithography technique. The photoresist pattern PR1 is formed at the area for preventing the formation of the metal silicide layers 41a and 41b in the salicide process. In the salicide process, the area for preventing the formation of the metal silicide layers 41a and 41b is, for example, an area without the metal silicide layers 41a and 41b in the silicide film pattern 81. Since the metal silicide layers 41a and 41b are formed on the gate electrodes GE1 and GE2, the n$^+$-type semiconductor region 7b, and the p$^+$-type semiconductor region 8b in the following step, the photoresist pattern PR1 is not formed (arranged) on the gate electrodes GE1 and GE2, the sidewalls 9 provided on the sidewalls of the gate electrodes GE1 and GE2, the n$^+$-type semiconductor region 7b, and the p$^+$-type semiconductor region 8b.

Then, as shown in FIG. 54, the insulating film 82 is dry etched using the photoresist pattern PR1 as an etching mask. Thus, an area of the insulating film 82 covered with the photoresist pattern PR1 remains without being etched, and the other area of the insulating film 82 not covered with the photoresist pattern PR1 is removed. Since the etching of the insulating film 82 is anisotropic etching, a part of the insulating film 82 remains in a small amount on a lower part of a side surface 9c of the sidewall 9 in the form of sidewall (a sidewall insulating film, or a sidewall spacer) to form a side wall (a sidewall insulating film, or a sidewall spacer) 82a smaller than the sidewall 9. The sidewall 82a is comprised of a remaining part of the insulating film 82 (a part of the insulating film 82). The side surface 9c of the sidewall 9 is a side opposite to the side opposed to the gate electrode GE1 and the silicon film pattern 81.

Then, as shown in FIG. 55, the photoresist pattern PR1 is removed by ashing or the like. On this stage, a small sidewall 82a comprised of a part of the remaining insulating film 82 exists on the lower part of the side surface 9c of the sidewall 9.

The following steps are the same as those in the first embodiment. That is, the alloy film 11 is formed in the step S1 while the sidewall 82a exists on the lower part of the side surface 9c of the sidewall 9. Then, the barrier film 12 is formed in step S2, and the first heat treatment is performed in step S3. Subsequently, the barrier film 12 and the unreacted part of the alloy film 11 are removed in step S4, and then the second heat treatment is performed in step S5. The steps S1 to S5 in this embodiment are the same as those of the first embodiment, which have been described in detail in the above first embodiment, and thus the illustration and description thereof will be omitted below. Thus, as shown in FIG. 56, the metal silicide layers 41b are formed on the gate electrode GE1, the n$^+$-type semiconductor region 7b, and the silicon film pattern 81.

The metal silicide layer 41b is formed at an area in connection with the plug 45 on the upper surface of the silicon film pattern 81, but the other areas are covered with the insulating film 82, and do not have the metal silicide layer 41b formed therein, so that the silicon film pattern 81 serves as a resistance element.

The sidewall 82a exists on the side wall of the sidewall 9, which can suppress or prevent the formation of the metal silicide layer 41b under the sidewall 82a. Thus, the metal silicide layer 41b can be spaced apart from the n-type semiconductor region 7a, which can reduce a junction leak thereby to further improve the reliability of the semiconductor device.

When the sidewall 82a remains, the sidewall 82a can react with the alloy film 11 to promote the abnormal growing of the $Ni_{1-y}M_ySi_2$. However, in this embodiment, like the above-mentioned first embodiment, the first heat treatment in step S3 satisfies the first condition and the second condition, thus enabling suppression of the abnormal growing of the $Ni_{1-y}M_ySi_2$ to suppress or prevent the adverse effect due to the remaining sidewall 82a. Accordingly, the above-mentioned advantages (for example, the effect of reducing the junction leak) can be obtained by the remaining sidewall 82a, while suppressing or preventing the adverse effect of the remaining sidewall 82a.

Although the invention made by the inventors has been specifically described based on the embodiments, it is apparent that the invention is not limited to the embodiments disclosed herein and that various modifications can be made without departing from the scope of the invention.

The invention is effectively applied to a manufacturing technique for a semiconductor device including a semiconductor element with a metal silicide layer.

What is claimed is:

1. A method of manufacturing a semiconductor device comprising the steps of:
    (a) preparing a semiconductor substrate;
    (b) forming a semiconductor region in the semiconductor substrate;
    (c) forming an alloy film containing nickel and a first metal element over the semiconductor substrate including the semiconductor region;
    (d) forming a metal silicide layer comprised of silicide containing the nickel and the first metal element by causing the alloy film to react with the semiconductor region by a first heat treatment;
    (e) after the step (d), removing a part of the alloy film not reacted with the semiconductor region in the step (d) from the metal silicide layer;
    (f) after the step (e), performing a second heat treatment at a heat treatment temperature higher than that of the first heat treatment; and
    (g) after the step (f), forming a first insulating film over the semiconductor substrate including the metal silicide layer,
    wherein a rate of the first metal element included in metal elements forming the metal silicide layer is larger than a rate of the first metal element included in the alloy film,
    wherein in the step (d), the first heat treatment is performed at a heat treatment temperature where a diffusion coefficient of the first metal element into the semiconductor region is larger than a diffusion coefficient of nickel into the semiconductor region, and wherein the first heat treatment is performed such that the unreacted part of the alloy film remains above the metal silicide layer, wherein the method further comprises the steps of
(a1) after the step (a), forming a gate insulating film over the semiconductor substrate;
(a2) forming a gate electrode over the gate insulating film, wherein in the step (c), the alloy film is formed over the semiconductor substrate including the semiconductor region so as to cover the gate electrode; and
(a3) after the step (a2), forming a sidewall insulating film on a sidewall of the gate electrode, the step (b) being performed after the step (a3); and wherein after the step (b), the method further comprises the steps of
(b1) forming a second insulating film over the semiconductor substrate so as to cover the gate electrode and the sidewall insulating film;
(b2) forming a resist pattern over the second insulating film;
(b3) dry etching the second insulating film using the resist pattern as an etching mask; and
(b4) removing the resist pattern,
wherein in the step (b2), the resist pattern is not formed over the semiconductor region, the gate electrode, and the sidewall insulating film,
wherein in the step (b3), a part of the second insulating film remains at a lower part of one side of the sidewall insulating film opposite to the other side thereof opposed to the gate electrode,
wherein after the step (b4), the step (c) is performed, and
wherein in the step (c), the alloy film is formed while the part of the second insulating film remains at the lower part of one side of the sidewall insulating film opposite to the other side thereof opposed to the gate electrode.

2. The method of manufacturing a semiconductor device according to claim 1,
wherein the first metal element is at least one kind selected from the group comprising Pt, Pd, V, Er, and Yb.

3. The method of manufacturing a semiconductor device according to claim 2, wherein the first metal element is Pt.

4. The method of manufacturing a semiconductor device according to claim 3,
wherein the heat treatment temperature of the first heat treatment is less than 279° C.

5. The method of manufacturing a semiconductor device according to claim 4,
wherein the heat treatment temperature of the first heat treatment is equal to or more than 200° C.

6. The method of manufacturing a semiconductor device according to claim 5,
wherein in the step (c), the alloy film is formed over the semiconductor region in a first thickness, and wherein a part of the alloy film formed over the semiconductor region in the step (c), and reacted with the semiconductor region in the step (d), had a second thickness smaller than the first thickness.

7. The method of manufacturing a semiconductor device according to claim 6,
wherein in the step (d), the metal silicide layer in a $(Ni_{1-y}Pt_y)_2Si$ phase is formed by the first heat treatment.

8. The method of manufacturing a semiconductor device according to claim 7,
wherein in the step (f), the metal silicide layer in a $Ni_{1-y}Pt_ySi$ phase is formed by the second heat treatment.

9. The method of manufacturing a semiconductor device according to claim 7,
wherein the alloy film formed in the step (c) is a $Ni_{1-x}Pt_x$ alloy film, and a value of y in the $(Ni_{1-y}Pt_y)_2Si$ is larger than a value of x in the $Ni_{1-x}Pt_x$.

10. The method of manufacturing a semiconductor device according to claim 6,
wherein the first thickness is 1.25 times or more as large as the second thickness.

11. The method of manufacturing a semiconductor device according to claim 10,
wherein the second thickness is equal to or more than 5 nm.

12. The method of manufacturing a semiconductor device according to claim 11,
wherein a third thickness which is a thickness of the unreacted part of the alloy film remaining on the metal silicide layer in the step (d) is equal to or less than 200 nm.

13. The method of manufacturing a semiconductor device according to claim 10,
wherein the first thickness is twice or more as large as the second thickness.

14. The method of manufacturing a semiconductor device according to claim 1,
wherein the first metal element is Pt, and the rate of the Pt element included in metal elements forming the metal silicide layer is equal to or more than 4%.

15. The method of manufacturing a semiconductor device according to claim 14,
wherein the rate of the Pt element included in metal elements forming the metal silicide layer is equal to or more than 5%.

16. The method of manufacturing a semiconductor device according to claim 15,
wherein the rate of the Pt element included in the alloy film is less than 4%.

17. The method of manufacturing a semiconductor device according to claim 16,
wherein the semiconductor region is a semiconductor region for a source or drain.

* * * * *